US012652962B2

(12) United States Patent
Matsuzaki et al.

(10) Patent No.: US 12,652,962 B2
(45) Date of Patent: Jun. 9, 2026

(54) SEMICONDUCTOR DEVICE, STORAGE DEVICE, AND ELECTRONIC DEVICE WITH FIRST AND SECOND METAL OXIDE CHANNEL TRANSISTORS

(71) Applicant: Semiconductor Energy Laboratory Co., Ltd., Atsugi (JP)

(72) Inventors: Takanori Matsuzaki, Atsugi (JP); Tatsuya Onuki, Atsugi (JP); Kiyoshi Kato, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 151 days.

(21) Appl. No.: 18/691,163

(22) PCT Filed: Sep. 8, 2022

(86) PCT No.: PCT/IB2022/058440
§ 371 (c)(1),
(2) Date: Mar. 12, 2024

(87) PCT Pub. No.: WO2023/047229
PCT Pub. Date: Mar. 30, 2023

(65) Prior Publication Data
US 2024/0423096 A1      Dec. 19, 2024

(30) Foreign Application Priority Data

Sep. 21, 2021      (JP) ................................. 2021-153603

(51) Int. Cl.
*H10N 50/10*          (2023.01)
*G11C 11/16*          (2006.01)
(Continued)

(52) U.S. Cl.
CPC ........... *H10N 50/10* (2023.02); *G11C 11/161* (2013.01); *G11C 11/1673* (2013.01);
(Continued)

(58) Field of Classification Search
CPC ........ H10N 50/10; H10N 50/80; H10N 52/00; H10N 52/80; G11C 11/1655;
(Continued)

(56) References Cited

U.S. PATENT DOCUMENTS 9,171,887 B2    10/2015  Yokoyama
9,698,199 B2    7/2017   Yokoyama
(Continued)

FOREIGN PATENT DOCUMENTS

CN          104143550 A      11/2014
CN          110875425 A       3/2020
(Continued)

OTHER PUBLICATIONS

International Search Report (Application No. PCT/IB2022/058440), dated Dec. 6, 2022.
(Continued)

*Primary Examiner* — Jerome Leboeuf
(74) *Attorney, Agent, or Firm* — Eric J. Robinson; Robinson Intellectual Property Law Office, P.C.

(57)                ABSTRACT

A semiconductor device with high storage capacity and low power consumption is provided. The semiconductor device includes first to third conductors, first and second transistors, and an MTJ element. The MTJ element includes a free layer and a fixed layer. In the semiconductor device, the first conductor, the second conductor, the free layer, the fixed layer, the first and second transistors, and the third conductor are provided in this order from the bottom. In particular, in a plan view, the third conductor is positioned in a region overlapping with the first conductor. The first conductor is electrically connected to the second conductor, and the second conductor is electrically connected to the free layer and a first terminal of the first transistor. The fixed layer is electrically connected to a first terminal of the second
(Continued)

transistor, and a second terminal of the first transistor is electrically connected to a second terminal of the second transistor and the third conductor. The first transistor and the second transistor each include a metal oxide in a channel formation region.

6 Claims, 27 Drawing Sheets

(51) Int. Cl.
  *H10B 61/00*   (2023.01)
  *H10N 50/85*   (2023.01)
  *H10N 52/85*   (2023.01)

(52) U.S. Cl.
  CPC .......... *G11C 11/1675* (2013.01); *H10B 61/22* (2023.02); *H10N 50/85* (2023.02); *H10N 52/85* (2023.02)

(58) Field of Classification Search
  CPC ............ G11C 11/1657; G11C 2213/71; G11C 11/1659; G11C 11/1675; G11C 11/401; G11C 11/161; G11C 13/0004; H10B 61/20; H10B 61/22; H10B 63/10; H10B 63/30; H10B 63/84; H10D 30/67; H10D 84/038; H10D 48/40; H10D 84/0126; H10D 84/83; Y02D 10/00
  See application file for complete search history.

(56) References Cited

U.S. PATENT DOCUMENTS

| | | | |
|---|---|---|---|
| 10,002,907 B2 | 6/2018 | Yokoyama | |
| 10,319,785 B2 | 6/2019 | Yokoyama | |
| 11,094,360 B2 | 8/2021 | Oikawa et al. | |
| 11,532,340 B2 | 12/2022 | Oikawa et al. | |
| 11,922,987 B2 | 3/2024 | Oikawa et al. | |
| 2011/0065270 A1 | 3/2011 | Shim et al. | |
| 2013/0069052 A1 | 3/2013 | Sandhu | |
| 2014/0204661 A1* | 7/2014 | Doyle | H10N 50/80 |
| | | | 365/158 |
| 2014/0332749 A1 | 11/2014 | Yokoyama | |
| 2016/0149004 A1 | 5/2016 | Rabkin et al. | |
| 2018/0277517 A1* | 9/2018 | Kim | H10W 90/00 |
| 2019/0147931 A1* | 5/2019 | Oka | G11C 11/1659 |
| | | | 365/158 |
| 2019/0334080 A1 | 10/2019 | Ahmed et al. | |
| 2020/0075670 A1 | 3/2020 | Lin et al. | |
| 2020/0279595 A1 | 9/2020 | Oikawa et al. | |
| 2022/0262420 A1 | 8/2022 | Yokoyama et al. | |
| 2023/0106065 A1 | 4/2023 | Onuki et al. | |

FOREIGN PATENT DOCUMENTS

| | | |
|---|---|---|
| CN | 114127943 A | 3/2022 |
| JP | 2014-220376 A | 11/2014 |
| JP | 2015-228493 A | 12/2015 |
| KR | 2022-0039655 A | 3/2022 |
| TW | 202011572 | 3/2020 |
| WO | WO-2018/136003 | 7/2018 |
| WO | WO-2019/073333 | 4/2019 |
| WO | WO-2021/014810 | 1/2021 |

OTHER PUBLICATIONS

Written Opinion (Application No. PCT/IB2022/058440), dated Dec. 6, 2022.
Seo. Y et al., "Area-Efficient SOT-MRAM With a Schottky Diode", IEEE Electron Device Letters, Aug. 1, 2016, vol. 37, No. 8, pp. 982-985.

* cited by examiner

530bA    542a    560A    530bB    542b    560B 440    590    542c

A1                                                                    A2

458                    400 540        448    450

A1                        593  592  590  588                    A2

584
582
581
576
574
580
544
522
520
516
514
513
512
510
456
454
452
446
444
443
442
440
436
434

500A    540    500B 542a    560A    542b    560B    542c

OSL

MDV

FIG. 26A
8300
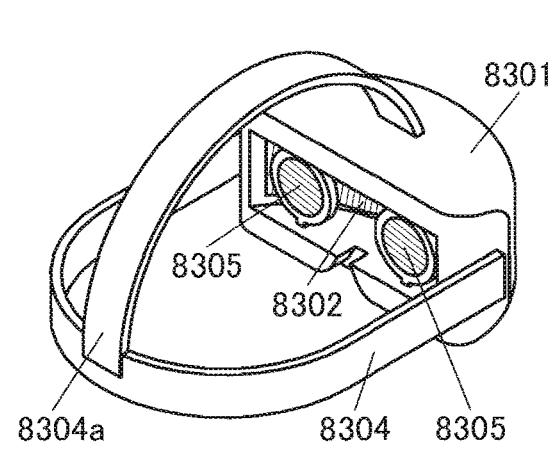
8301
8304a
8304
FIG. 26B
8300
8301
8305
8302
8304a    8304    8305
FIG. 26C
8300
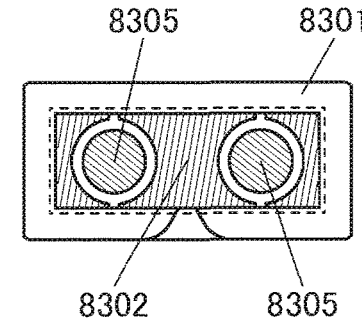
8305    8301
8302    8305
FIG. 26D
8200
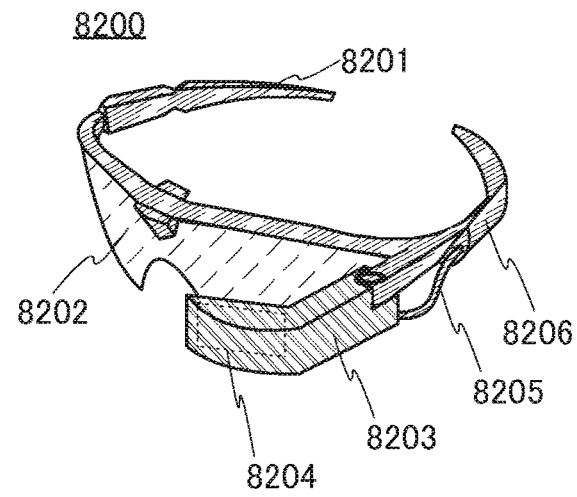
8201
8202
8206
8205
8203
8204

FIG. 27A
FIG. 27B
FIG. 27C
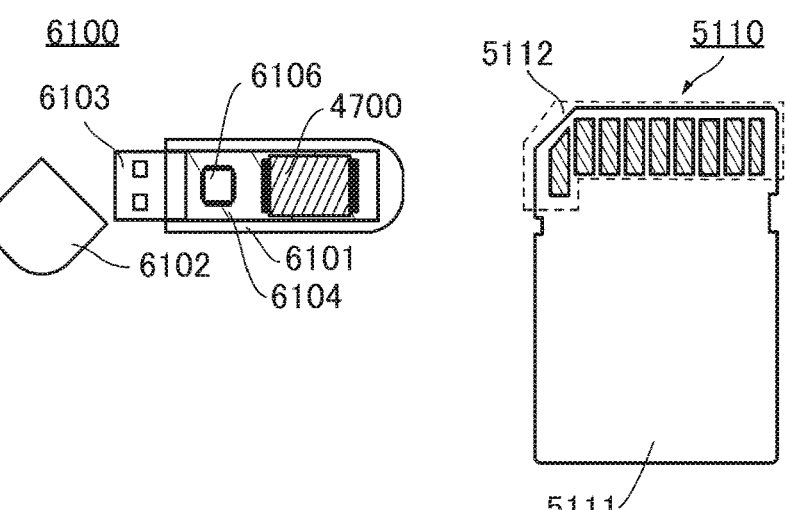
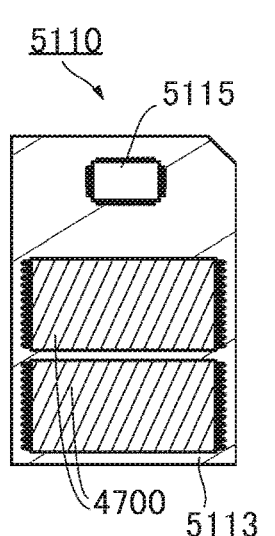
FIG. 27D
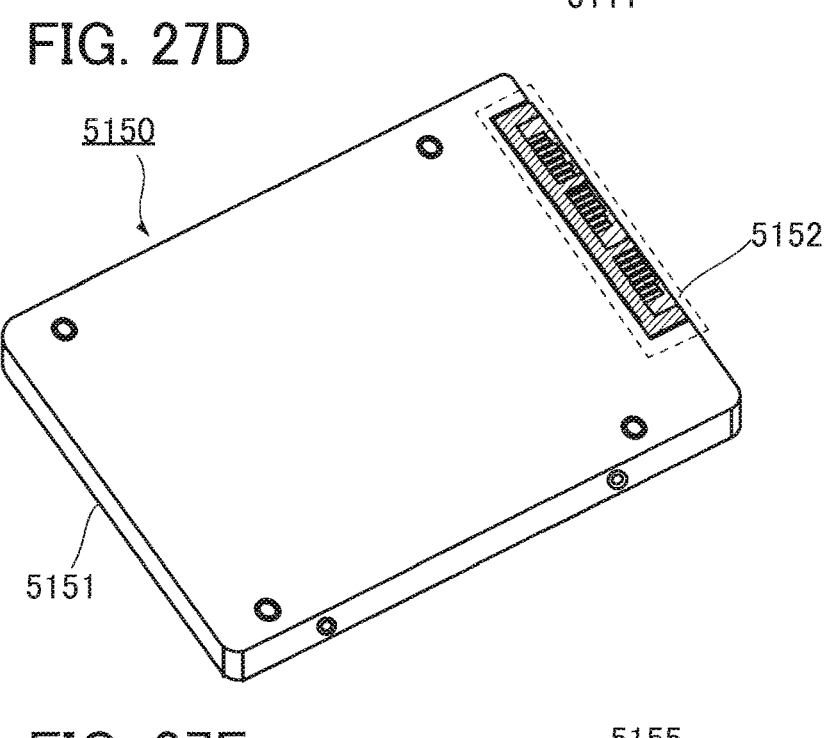
FIG. 27E
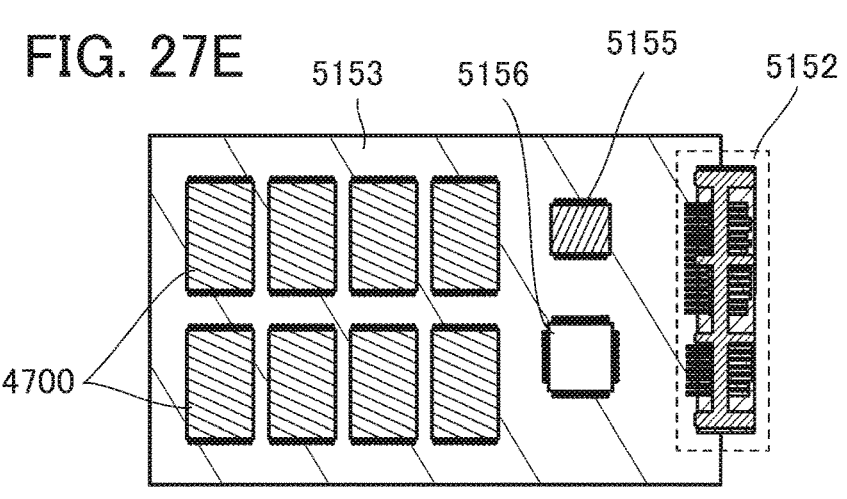

SEMICONDUCTOR DEVICE, STORAGE DEVICE, AND ELECTRONIC DEVICE WITH FIRST AND SECOND METAL OXIDE CHANNEL TRANSISTORS

TECHNICAL FIELD

One embodiment of the present invention relates to a semiconductor device, a storage device, and an electronic device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an image capturing device, a storage device, a signal processing device, a sensor, a processor, an electronic device, a system, a driving method thereof, a manufacturing method thereof, and a testing method thereof.

BACKGROUND ART

In recent years, the amount of data subjected to processing has been increasing, which makes a demand for a storage device having a higher storage capacity. To increase storage capacity per unit area, stacking memory cells as in the case of a 3D NAND storage device or the like is effective (see Patent Document 1 to Patent Document 3). Stacking memory cells can increase storage capacity per unit area in accordance with the number of stacked memory cells.

REFERENCES

Patent Documents

[Patent Document 1] United States Patent Application Publication No. 2011/0065270
[Patent Document 2] United States Patent Application Publication No. 2016/0149004
[Patent Document 3] United States Patent Application Publication No. 2013/0069052

SUMMARY OF THE INVENTION

Problems to be Solved by the Invention

As a storage device that can be used for a cache memory or a main memory in a computer, a storage device capable of being accessed in a short time, i.e., having a high writing speed and a high reading speed, for example, is required. For example, an SRAM (Static Random Access Memory) and a DRAM (Dynamic Random Access Memory), which enable an access time (also called a delay time or latency in some cases) approximately from several nanoseconds to several tens of nanoseconds, have been used for a cache memory or a main memory in a computer. Note that the SRAM or the DRAM is a volatile memory, and thus consumes a large amount of power during data retention in some cases. Thus, low power consumption as well as high storage capacity is required for a storage device used for a cache memory or a main memory in a computer.

An object of one embodiment of the present invention is to provide a storage device with low power consumption. Another object of one embodiment of the present invention is to provide a storage device with high storage capacity. Another object of one embodiment of the present invention is to provide a novel storage device and the like. Another object of one embodiment of the present invention is to provide an electronic device including the storage device.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all of the objects listed above and the other objects.

Means for Solving the Problems (1)

One embodiment of the present invention is a semiconductor device including a first conductor, a second conductor, a third conductor, a first transistor, a second transistor, and a memory element. The second conductor is positioned above the first conductor. The memory element is positioned above the second conductor. The first transistor and the second transistor are positioned above the memory element. The third conductor is positioned above the first transistor and the second transistor. In a plan view, the third conductor is positioned in a region overlapping with the first conductor. The first conductor is electrically connected to the second conductor. The second conductor is electrically connected to a first terminal of the memory element and a first terminal of the first transistor. A second terminal of the memory element is electrically connected to a first terminal of the second transistor. A second terminal of the first transistor is electrically connected to a second terminal of the second transistor and the third conductor. The first transistor and the second transistor each include a metal oxide in a channel formation region.

(2)

Alternatively, one embodiment of the present invention according to the above (1) may have a structure where the memory element includes any one of a variable resistance element, a ferroelectric capacitor, an FTJ element, and a phase-change memory.

(3)

One embodiment of the present invention is a semiconductor device including a first conductor, a second conductor, a third conductor, a first transistor, a second transistor, and a memory element. The memory element includes a first magnetic layer, a second magnetic layer, and an insulator. The second conductor is positioned above the first conductor. The first magnetic layer is positioned above the second conductor. The insulator is positioned above the first magnetic layer. The second magnetic layer is positioned above the insulator. The first transistor and the second transistor are positioned above the second magnetic layer. The third conductor is positioned above the first transistor and the second transistor. In particular, in a plan view, the third conductor is positioned in a region overlapping with the first conductor. The first conductor is electrically connected to the second conductor. The second conductor is electrically connected to the first magnetic layer and a first terminal of the first transistor. The second magnetic layer is electrically connected to a first terminal of the second transistor. A second terminal of the first transistor is electrically connected to a second terminal of the second transistor and the third conductor. The first transistor and the second transistor each include a metal oxide in a channel formation region.

(4)

Alternatively, one embodiment of the present invention according to the above (3) may have a structure where the memory element serves as an MTJ element. It is preferable that the first magnetic layer serve as a free layer, the second magnetic layer serve as a fixed layer, and the insulator serve as a tunnel insulator. The second conductor may contain a metal material causing a spin Hall effect by a current flow.

(5)

Another embodiment of the present invention is a semiconductor device that has a structure different from that of the above (3) and includes a first conductor, a second conductor, a third conductor, a first transistor, a second transistor, and a memory element. The memory element includes a first magnetic layer, a second magnetic layer, and an insulator. The first transistor and the second transistor are positioned above the third conductor. The second magnetic layer is positioned above the first transistor and the second transistor. The insulator is positioned above the second magnetic layer. The first magnetic layer is positioned above the insulator. The second conductor is positioned above the first magnetic layer. The first conductor is positioned above the second conductor. In particular, in a plan view, the first conductor is positioned in a region overlapping with the third conductor. The first conductor is electrically connected to the second conductor. The second conductor is electrically connected to the first magnetic layer and a first terminal of the first transistor. The second magnetic layer is electrically connected to a first terminal of the second transistor. A second terminal of the first transistor is electrically connected to a second terminal of the second transistor and the third conductor. The first transistor and the second transistor each include a metal oxide in a channel formation region.

(6)

Alternatively, one embodiment of the present invention according to the above (5) may have a structure where the memory element serves as an MTJ element. It is preferable that the first magnetic layer serve as a free layer, the second magnetic layer serve as a fixed layer, and the insulator serve as a tunnel insulator. The second conductor may contain a metal material causing a spin Hall effect by a current flow.

(7)

Another embodiment of the present invention is a storage device including the semiconductor device according to any one of the above (1) to (6) and a layer including a peripheral circuit. Note that the layer is positioned below the semiconductor device. The peripheral circuit has a function of writing data to the semiconductor device and reading data from the semiconductor device.

(8)

Another embodiment of the present invention is an electronic device including the storage device according to the above (7) and a housing.

Effect of the Invention

According to one embodiment of the present invention, a storage device with low power consumption can be provided. According to another embodiment of the present invention, a storage device with high storage capacity can be provided.

According to another embodiment of the present invention, a novel storage device or the like can be provided. According to another embodiment of the present invention, an electronic device including the storage device can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 13 is a perspective diagram schematically illustrating a structure of a memory cell.

FIG. 14 is a perspective diagram schematically illustrating a structure of a memory cell.

FIG. 19 is a schematic cross-sectional diagram illustrating a structure example of a storage device.

FIG. 26A to FIG. 26D are diagrams illustrating structure examples of electronic devices.

FIG. 27A to FIG. 27E are each a perspective diagram or a schematic diagram illustrating an example of an electronic device.

MODE FOR CARRYING OUT THE INVENTION

Figure 1A:
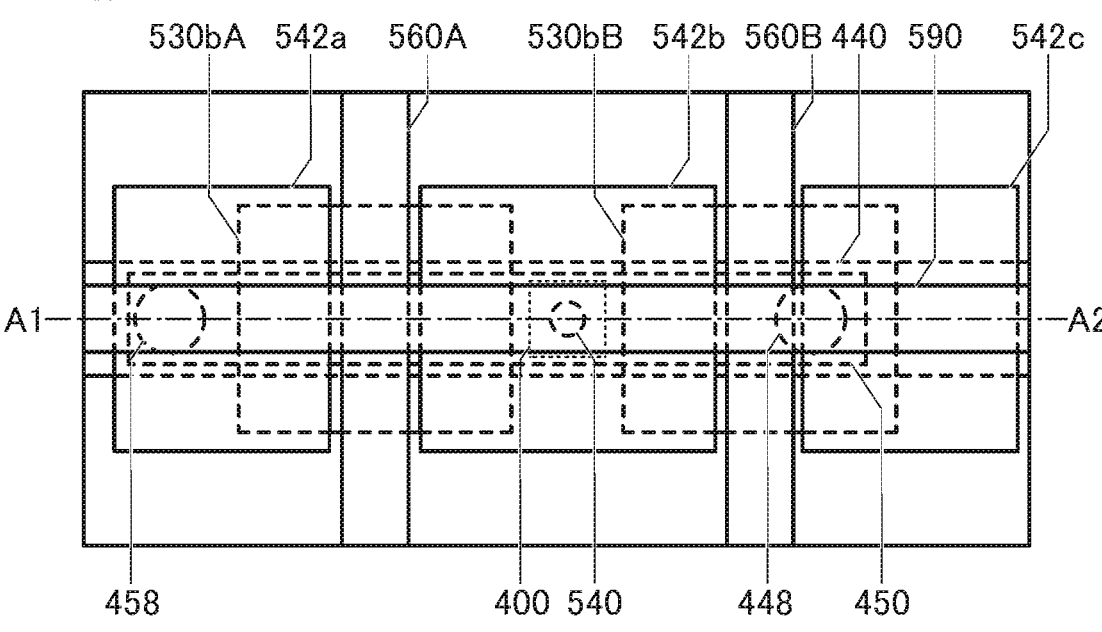
FIG. 1A is a schematic plan diagram illustrating a structure example of a memory cell.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has one or more selected from an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective diagrams and the like, some components might not be illustrated for clarity of the drawings.

In this specification, a plan diagram is sometimes used to explain a structure in each embodiment. A plan diagram is a diagram illustrating the appearance of a plane (section) of a structure cut in the horizontal direction, for example. Hidden lines (e.g., dashed lines) shown in a plan diagram can indicate the positional relation between a plurality of components included in a structure or the overlapping relation between the plurality of components. In this specification and the like, the term "plan diagram" can be replaced with the term "projection diagram", "top diagram", or "bottom diagram". A plane (section) of a structure cut in a direction other than the horizontal direction may be referred to as a plan diagram depending on circumstances. A viewing direction perpendicular to a plan diagram is referred to as a plan view in some cases.

In this specification, a cross-sectional diagram is sometimes used to explain a structure in each embodiment. A cross-sectional diagram is a diagram illustrating the appearance of a plane (section) of a structure cut in the vertical direction, for example. In this specification and the like, the term "cross-sectional diagram" can be replaced with the term "front diagram" or "side diagram". A plane (section) of a structure cut in a direction other than the vertical direction may be referred to as a cross-sectional diagram depending on circumstances. A viewing direction perpendicular to a cross-sectional diagram is referred to as a cross-sectional view in some cases.

In this specification and the like, when a plurality of components are denoted with the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, the size, the layer thickness, or the region is not limited to the illustrated scale. The drawings are schematic diagrams showing ideal examples, and embodiments of the present invention are not limited to shapes, values, or the like shown in the drawings. For example, variation in signal, voltage, or current due to noise, variation in signal, voltage, or current due to difference in timing, or the like can be included.

Note that in this specification and the like, a semiconductor device refers to a device that utilizes semiconductor characteristics, and means a circuit including a semiconductor element (e.g., a transistor, a diode, and a photodiode), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a storage device, a display apparatus, a light-emitting apparatus, a lighting device, an electronic device, and the like themselves might be semiconductor devices, or might include semiconductor devices.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, and a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, the amount of current, or the like, an operational amplifier, a differential amplifier circuit, a source follower circuit, or a buffer circuit); a signal generation circuit; a memory circuit; or a control circuit) can be connected between X and Y. For example, even if another circuit is interposed between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than $0\Omega$ or a wiring having a resistance value higher than $0\Omega$. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; conversely, the terms "resistance", "load", "region having a resistance value" and the like can be replaced with the term "resistor". The resistance value can be, for example, preferably higher than or equal to 1 m$\Omega$ and lower than or equal to 10$\Omega$, further preferably higher than or equal to 5 m$\Omega$ and lower than or equal to 5$\Omega$, still further preferably higher than or equal to 10 m$\Omega$ and lower than or equal to 1$\Omega$. As another example, the resistance value may be higher than or equal to 1$\Omega$ and lower than or equal to $1\times10^9\Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance"; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials supplied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series and their gates are electrically connected to each other.

In this specification and the like, a node can be referred to as a terminal, a wiring, an electrode, a conductive layer, a conductor, an impurity region, or the like depending on the circuit structure and the device structure. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. Moreover, in this specification and the like, for example, a "first" component in one embodiment can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

Furthermore, the term "over", "under", or the like does not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the terms "film" and "layer" are not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode", "wiring", "terminal", and the like do not limit the functions of such components. For example, an "electrode" is used as part of a "wiring" in some cases, and vice versa. Furthermore, the term "electrode" or "wiring" can also include the case where a plurality of "electrodes" and/or "wirings" are formed in an integrated manner, for example. For example, a "terminal" is used as part of a "wiring" and/or an "electrode" in some cases, and vice versa. Furthermore, the term "terminal" also includes the case where a plurality of "electrodes", "wirings" or "terminals" are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" or the like depending on the case.

In this specification and the like, the terms "wiring", "signal line", "power supply line" and the like can be interchanged with each other depending on the case or the situation. For example, the term "wiring" can be changed into the term "signal line" in some cases. As another example, the term "wiring" can be changed into the term "power supply line" in some cases. Conversely, the term "signal line" or "power supply line" can be changed into the term "wiring" in some cases. The term "power supply line" can be changed into the term "signal line" in some cases. Conversely, the term "signal line" can be changed into the term "power supply line" in some cases. The term "potential" that is applied to a wiring can be changed into the term "signal" depending on the case or the situation. Conversely, the term "signal" can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples include hydrogen (contained also in water), lithium, sodium, silicon, boron, phosphorus, carbon, and nitrogen.

In this specification and the like, a switch has a function of being in a conducting state (on state) or a non-conducting state (off state) to determine whether current flows or not. Alternatively, a switch has a function of selecting and changing a current path. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case where a transistor is used as a switch, a "conducting state" of the transistor refers to a state where a source electrode and a drain electrode of the transistor can be regarded as being electrically short-circuited. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Thus, the case where the angle is greater than or equal to $-5°$ and less than or equal to $5°$ is also included. In addition, "approximately parallel" or "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Thus, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

Embodiment 1

In this embodiment, a memory cell that is a semiconductor device of one embodiment of the present invention will be described.

Circuit Structure Example 1 of Memory Cell

Figure 4A:
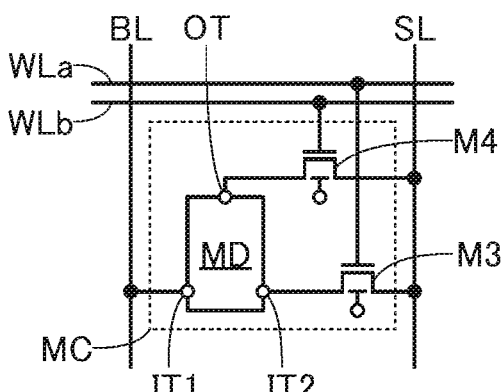
FIG. 4A to FIG. 4D are circuit diagrams illustrating structure examples of a memory cell.

FIG. 4A illustrates an example of a memory cell that can be included in a storage device. Note that a memory cell MC illustrated in FIG. 4A can be referred to as an example of a SOT-MRAM (Spin Orbit Torque-Magnetoresistive Random Access Memory) that is a three-terminal memory element.

The memory cell MC in FIG. 4A includes a transistor M3, a transistor M4, and a variable resistance device MD, for example.

An OS transistor can be used as the transistor M3 and the transistor M4, for example. In addition, a channel formation region of the OS transistor is preferably an oxide containing one or more kinds selected from indium, gallium, and zinc. Instead of the oxide, an oxide containing one or more selected from indium, an element M (as the element M, for example, one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc may be used.

The transistor M3 and the transistor M4 illustrated in FIG. 4A each include a back gate; however, the storage device of one embodiment of the present invention is not limited thereto. For example, the transistor M3 and the transistor M4 illustrated in FIG. 4A may each be a transistor with a structure not including a back gate, i.e., a single-gate structure. It is also possible that some transistors have a structure including a back gate and the other transistors have a structure not including a back gate.

Note that the transistor M3 and the transistor M4 may each function as a switching element unless otherwise specified. In other words, the gate voltage, the source voltage, and the drain voltage of each of the above-described transistors may be within the range where the transistor operates as the switching element. Furthermore, each of the transistor M3 and the transistor M4 in an on state may operate in a linear region or a saturation region. Each of the transistor M3 and the transistor M4 may operate in a subthreshold region.

Note that the above variation examples for the structure, operation, and the like of the transistor are not applied only to the transistor M3 and the transistor M4. For example, transistors described in other parts of the specification or transistors illustrated in other drawings may have variations in structures, operations, and the like, in a similar manner.

The variable resistance device MD includes an MTJ (Magnetic Tunnel Junction) element ME. In addition, the variable resistance device MD includes a terminal IT1, a terminal IT2, and a terminal OT. The details of the variable resistance device MD will be described later.

A first terminal of the transistor M3 is electrically connected to the terminal IT2 of the variable resistance device MD, a second terminal of the transistor M3 is electrically connected to a wiring SL, and the gate of the transistor M3 is electrically connected to a wiring WLa. A first terminal of the transistor M4 is electrically connected to the terminal OT of the variable resistance device MD, a second terminal of the transistor M4 is electrically connected to the wiring SL, and the gate of the transistor M4 is electrically connected to a wiring WLb. The terminal IT1 of the variable resistance device MD is electrically connected to a wiring BL.

The wiring BL functions as a write bit line or a read bit line for the memory cell MC or a wiring supplying a constant voltage, for example.

The wiring SL functions as a wiring supplying a constant voltage, for example.

Note that the functions of the wiring SL and the wiring BL may be interchanged with each other.

The wiring WLa functions as a writing word line for the memory cell MC, for example.

The wiring WLb functions as a reading word line for the memory cell MC, for example.

In FIG. 4A, the back gate of each of the transistor M3 and the transistor M4 is illustrated, but the connection structure of the back gate is not illustrated; a target to which the back gate is electrically connected can be determined at the design stage. For example, in a transistor including a back gate, a gate and the back gate may be electrically connected to each other to increase the on-state current of the transistor. That is, for example, the gate and the back gate of the transistor M3 may be electrically connected to each other, and the gate and the back gate of the transistor M4 may be electrically connected to each other. Furthermore, for example, in a transistor including a back gate, a wiring electrically connecting the back gate of the transistor to an external circuit or the like may be provided and a potential may be supplied to the back gate of the transistor with the external circuit or the like to change the threshold voltage of the transistor or to reduce the off-state current of the transistor. Specifically, the memory cell MC can have a structure illustrated in FIG. 4B. In the memory cell MC in FIG. 4B, a wiring BGE is electrically connected to the back gates of the transistor M3 and the transistor M4 included in the memory cell MC in FIG. 4A. Supply of a predetermined potential to the wiring BGE can change the threshold voltages of the transistor M3 and the transistor M4.

Next, the variable resistance device MD is described.

Figure 5:
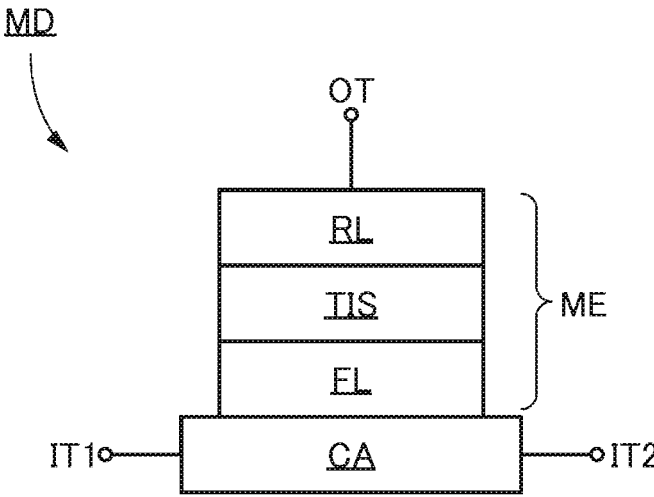
FIG. 5 is a schematic diagram illustrating a structure example of a memory element included in a memory cell.

FIG. 5 is a block diagram illustrating an example of the variable resistance device MD. The variable resistance device MD in FIG. 5 includes a layer RL, a layer TIS, a layer FL, and a layer CA. Note that the layer RL, the layer TIS, and the layer FL are included in the MTJ element ME.

The layer CA includes a film having conductivity, for example. The terminal IT1 and the terminal IT2 are electrically connected to each other through the film. Thus, when a voltage is applied between the terminal IT1 and the terminal IT2, a current flows between the terminal IT1 and the terminal IT2. The layer CA is referred to as a channel layer in some cases.

The film is formed using a material causing a spin Hall effect when a current flows between the terminal IT1 and the terminal IT2. The spin Hall effect refers to a phenomenon in which a spin current is generated in the direction substantially perpendicular to the direction where the current flows. Specifically, when a current flows in a two-dimensional plane of a thin film or the like, for example, electrons having different spin directions are polarized toward the top surface and the bottom surface of the thin film, whereby a spin current is generated in the direction substantially perpendicular to the thin film. Thus, the layer CA can generate a spin current in the direction substantially perpendicular to the layer CA when a current flows between the terminal IT1 and the terminal IT2.

The layer CA preferably contains a metal material causing a spin Hall effect. Specifically, as the metal material, a transition metal which provides a high spin orbital interaction is preferably used. Examples of the transition metal include tungsten, platinum, and tantalum. Alternatively, the layer CA may include a topological insulator causing a spin Hall effect. In this case, an alloy of bismuth and antimony or an alloy of bismuth and selenium may be used, for example.

The layer FL functions as a free layer in the MTJ element ME. The layer FL includes a ferromagnetic body allowing a magnetic moment to have a state where the free layer is parallel to or antiparallel to the magnetization direction of the layer RL described later. The layer FL is referred to as a magnetic layer in some cases.

The ferromagnetic body included in the layer FL is preferably a material which makes magnetization of the ferromagnetic body inverted with a weak spin current, for example. As a ferromagnetic material included in the layer FL, it is preferable to use a material which is less likely to cause magnetization inversion with thermal energy.

For the ferromagnetic body, for example, one kind of metal material selected from iron, cobalt, and nickel or an alloy of two or more kinds selected from the above materials can be used. Examples of the alloy include an alloy of cobalt, iron, and boron. Other examples of the alloy include an alloy of manganese and gallium and an alloy of manganese and germanium.

In the magnetic moment of the layer FL, spin torque is caused by the spin current generated in the layer CA. The magnetic moment of the layer FL inverts its direction when the spin torque exceeds a threshold value, for example. In other words, the magnetization direction of the layer FL can be changed by making a current flow in the layer CA (between the terminal IT1 and the terminal IT2). With this operation, data can be stored in the MTJ element ME.

The layer TIS functions as a layer including a tunnel insulator in the MTJ element ME. When a voltage is applied between the layer FL and the layer RL (to the terminal OT), the tunnel magnetoresistance effect occurs in the layer TIS, whereby a tunnel current can flow in the layer TIS. At this time, the electric resistance value of the layer TIS changes in accordance with the direction of the magnetic moment of the layer FL. Specifically, depending on whether the magnetization directions of the layer FL and the layer RL are parallel or antiparallel to each other, the electric resistance value of the layer TIS changes.

For the tunnel insulator, magnesium oxide or aluminum oxide can be used, for example. In particular, crystalline magnesium oxide is preferably used for the tunnel insulator.

The layer RL functions as a fixed layer in the MTJ element ME. The layer RL includes a ferromagnetic body. Note that unlike the ferromagnetic body of the layer FL, the ferromagnetic body of the layer RL has a fixed magnetization direction. Like the layer FL, the layer RL is referred to as a magnetic layer in some cases.

For the ferromagnetic body included in the layer RL, a material usable for the ferromagnetic body included in the layer FL can be used, for example.

It is preferable to combine the ferromagnetic materials and the tunnel insulator included in the MTJ element ME such that the MTJ element ME has a high magnetoresistive ratio (MR ratio).

Here, examples of a method for writing data and a method for reading data in/from the memory cell MC in FIG. 4A are described. Note that, for example, a low-level potential is supplied to the wiring SL.

When data is written to the memory cell MC, a high-level potential is supplied to the wiring WLa, so that the transistor M3 is turned on, and a low-level potential is supplied to the wiring WLb, so that the transistor M4 is turned off. Next, a first potential that is higher than the low-level potential of the wiring SL is supplied from the wiring BL to the terminal IT1. Accordingly, a current corresponding to a potential difference between the first potential and the low-level potential of the wiring SL flows between the terminal IT1 and the terminal IT2 in the variable resistance device MD. Consequently, the current flows in the layer CA of the MTJ element ME, and accordingly a spin current is generated in the layer CA. Depending on the spin current, the magnetization direction of the ferromagnetic body of the layer FL is determined.

When data is read from the memory cell MC, a high-level potential is supplied to the wiring WLa, so that the transistor M3 is turned on, and a high-level potential is supplied to the wiring WLb, so that the transistor M4 is turned on. Next, a second potential that is higher than the low-level potential and lower than the first potential is supplied from the wiring BL to the terminal IT1; accordingly, a current flows between the terminal IT1 and the terminal IT2 and/or the terminal IT1 and the terminal OT. At this time, the electric resistance value of the MTJ element ME changes depending on whether the magnetization directions of the layer RL and the layer FL are parallel or antiparallel to each other; accordingly, the amount of tunnel current flowing in the layer TIS of the MTJ element ME also changes. That is, measuring the amount of current flowing between the MTJ element ME and the terminal IT1 enables data stored in the MTJ element ME to be read out. Alternatively, data stored in the MTJ element ME can be read out in the following manner: a predetermined potential is supplied to the wiring SL to make a constant current flow into the terminal IT1 of the MTJ element ME from the wiring BL, and the potential at the terminal IT1 is measured.

Although this embodiment describes structure examples where the variable resistance device MD is provided with the MTJ element ME, the semiconductor device of one embodiment of the present invention is not limited thereto. For example, the variable resistance device MD may include, other than the MTJ element ME, a circuit element whose resistance changes. For example, the variable resistance device MD may include any one of a variable resistance element utilizing a colossal electrode-resistance change (a CER effect), an FTJ (Ferroelectric Tunnel Junction) element, and a phase-change memory (sometimes referred to as PCM or PRAM). The variable resistance device MD may include a ferroelectric capacitor for inducing a current by application of a pulse voltage.

Structure Example 1

Figure 1B:
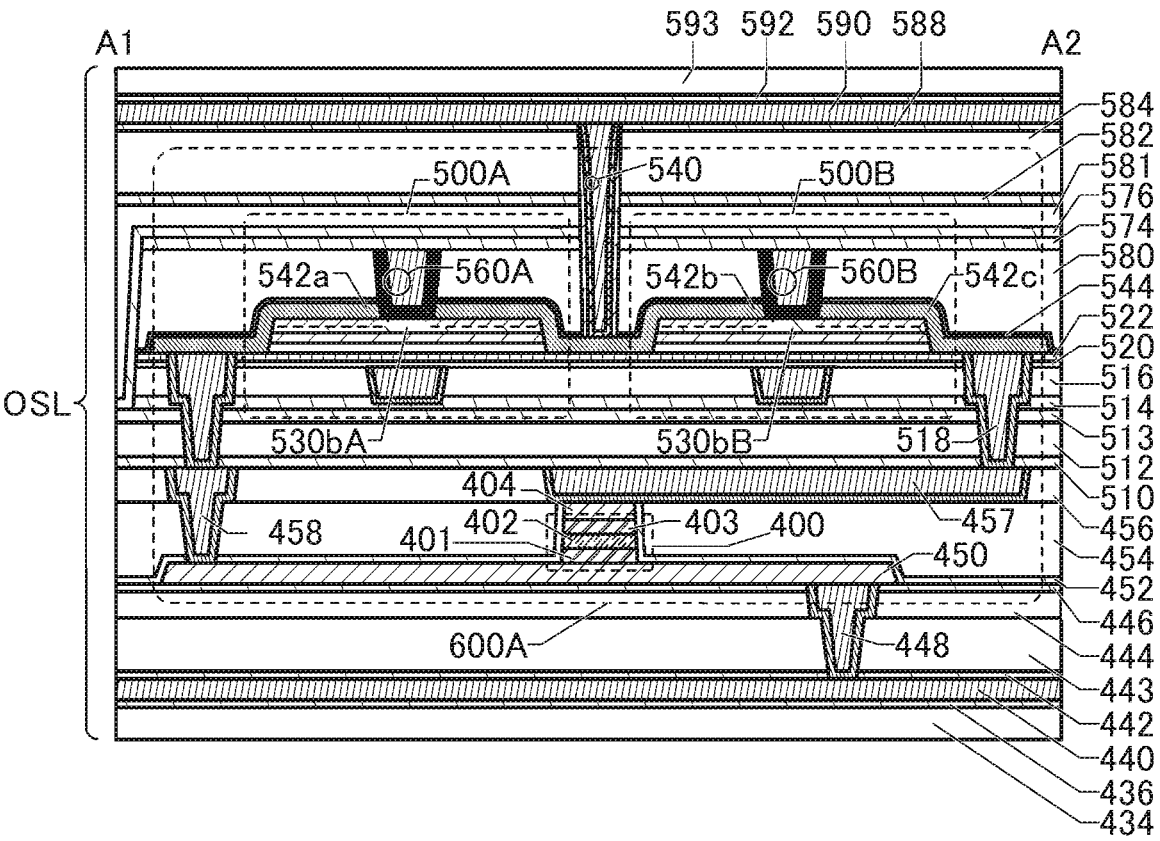
FIG. 1B is a schematic cross-sectional diagram illustrating the structure example of a memory cell.

FIG. 1A and FIG. 1B illustrate a structure example of a memory cell that is a semiconductor device of one embodiment of the present invention. Specifically, FIG. 1A is a plan diagram schematically illustrating a structure example of a memory cell 600A, and FIG. 1B is a cross-sectional diagram schematically illustrating the structure example of the memory cell 600A included in a layer OSL. In particular, FIG. 1B is a cross-sectional diagram along a dashed-dotted line A1-A2 shown in FIG. 1A. FIG. 1A selectively illustrates only a conductor 590, a conductor 540, a conductor 560A, a conductor 560B, a conductor 542a, a conductor 542b, a conductor 542c, an oxide 530bA, an oxide 530bB, a memory element 400, a conductor 458, a conductor 450, a conductor 448, and a conductor 440.

In FIG. 1A and FIG. 1B, the memory cell 600A includes the memory element 400, and a transistor 500A and a transistor 500B that are positioned above the memory element 400. Specifically, in this specification and the like, one or both of the transistor 500A and the transistor 500B are referred to as a transistor 500 in some cases.

Figures 2A, 2B:
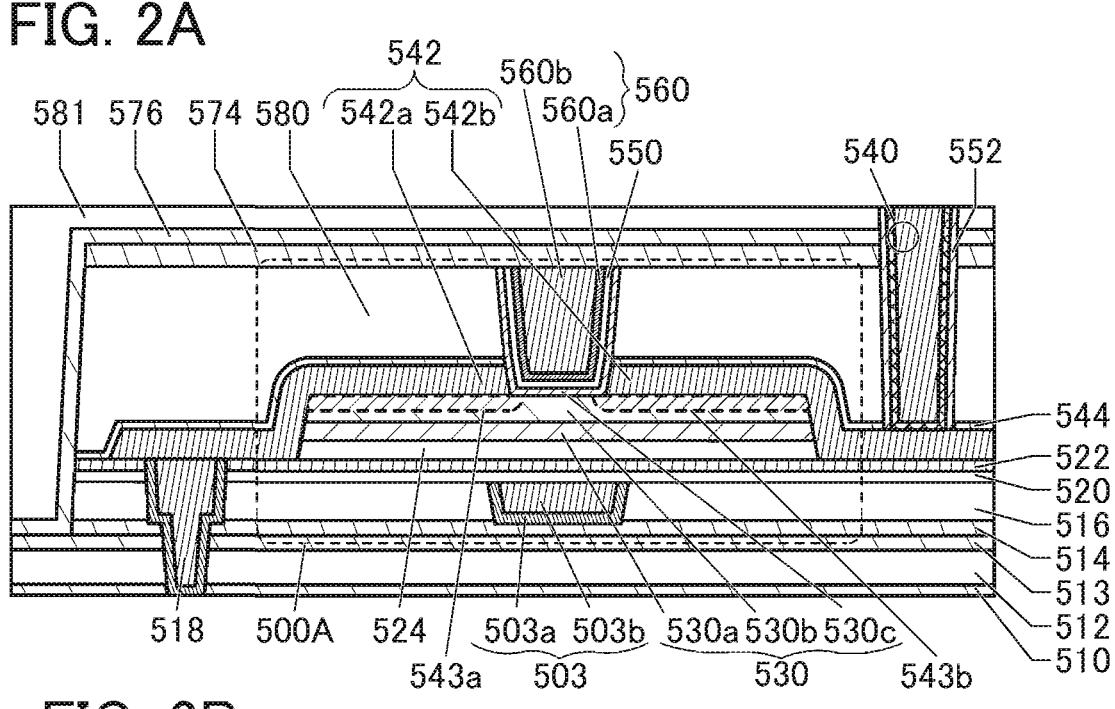
FIG. 2A and FIG. 2B are schematic cross-sectional diagrams illustrating a structure example of a transistor.

FIG. 2A is a cross-sectional diagram of the transistor 500A in the channel length direction, and FIG. 2B is a cross-sectional diagram of the transistor 500A in the channel width direction. For description, the transistor illustrated in FIG. 2A and FIG. 2B sometimes partly has a shape different from that of the transistor illustrated in FIG. 1B.

For the memory cell 600A, the structure of the memory cell MC in FIG. 4A is employed as an example. Specifically, the transistor 500A corresponds to the transistor M3, the transistor 500B corresponds to the transistor M4, and the memory element 400 corresponds to the variable resistance device MD. Therefore, in the cross-sectional diagram in FIG. 1, a first terminal of the transistor 500A is electrically connected to a first terminal of the memory element 400 and the conductor 440 (described later in detail) functioning as a wiring.

Note that the wiring BL in FIG. 4A can be, for example, the conductor 440 electrically connected to the first terminal of the memory element 400. The wiring SL in FIG. 4A can be, for example, the conductor 590 (described later in detail) electrically connected to a second terminal of the transistor 500A and a second terminal of the transistor 500B.

The wiring WLa in FIG. 4A can be, for example, the conductor 560A (described later in detail) corresponding to a gate of the transistor 500A. The wiring WLb in FIG. 4A can be, for example, the conductor 560B (described later in detail) corresponding to a gate of the transistor 500B.

The transistor 500 is a transistor including a metal oxide in a channel formation region (an OS transistor). The transistor 500 has features that the off-state current is low and that the field-effect mobility hardly changes even at high temperatures. Using the transistor 500 as the transistor included in the above storage device and the like enables the storage device whose operation performance is less likely to degrade even at high temperatures to be achieved, for example.

Next, components included in the layer OSL are described.

The layer OSL includes an insulator 434. The insulator 434 functions as an interlayer film, for example.

The insulator 434 may have a function of a planarization film which eliminates a level difference caused by a circuit element, a wiring, or the like positioned below the insulator 434. For example, the top surface of the insulator 434 may be planarized by planarization treatment using a chemical machine polishing (CMP) method or the like to have the increased planarity.

For the insulator 434, for example, silicon oxide, silicon oxynitride, silicon nitride oxide, silicon nitride, aluminum oxide, aluminum oxynitride, aluminum nitride oxide, or aluminum nitride can be used.

Note that in this specification, silicon oxynitride refers to a material that contains more oxygen than nitrogen in its composition, and silicon nitride oxide refers to a material that contains more nitrogen than oxygen in its composition. Moreover, in this specification, aluminum oxynitride refers to a material that contains more oxygen than nitrogen in its composition, and aluminum nitride oxide refers to a material that contains more nitrogen than oxygen in its composition.

An insulator 436 is provided over the insulator 434, the conductor 440 is provided over the insulator 436, and an insulator 442 is provided over the conductor 440.

The insulator 436 and the insulator 442 preferably have a barrier property that prevents diffusion of impurities such as water, hydrogen, and oxygen, for example. In the case where the electrical characteristics of the transistor 500 degrade due to water or hydrogen, for example, a barrier film that prevents diffusion of water or hydrogen is used as the insulator 436 and the insulator 442 to prevent diffusion of hydrogen or water from below the insulator 436 and the insulator 442 into the transistor 500. For example, in the case where the resistance value of the conductor 440 is increased by oxidation of the conductor 440, a barrier film that prevents diffusion of oxygen is used as the insulator 436 and the insulator 442 to inhibit oxidation of the conductor 440.

As the film having a barrier property against hydrogen, a silicon nitride film formed by a CVD (Chemical Vapor Deposition) method can be used, for example. As the film having a barrier property against hydrogen, a metal oxide such as aluminum oxide, hafnium oxide, or tantalum oxide is preferably used.

In particular, aluminum oxide has an excellent blocking effect that prevents passage of oxygen as well as impurities such as hydrogen and moisture, which would cause a change in electrical characteristics of the transistor.

The amount of released hydrogen can be analyzed by thermal desorption spectroscopy (TDS), for example. The amount of hydrogen released from the insulator 436 and the insulator 442 that is converted into hydrogen atoms per unit area of the insulator 436 and the insulator 442 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

As described above, the conductor 440 functions as a wiring electrically connected to the memory cell of one embodiment of the present invention.

For the conductor 440, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, indium tin oxide can be used for the conductor 440, for example. Alternatively, for the conductor 440, it is also possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 440 is illustrated to have a single-layer structure in FIG. 1, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

Over the insulator 442, an insulator 443, an insulator 444, and an insulator 446 are provided in this order from the bottom.

The permittivity of each of the insulator 443 and the insulator 444 is preferably lower than that of the insulator 436 and the insulator 442. For example, the dielectric constant of each of the insulator 443 and the insulator 444 is preferably lower than 4, further preferably lower than 3. The dielectric constant of each of the insulator 443 and the insulator 444 is, for example, preferably 0.7 times or less, further preferably 0.6 times or less that of the insulator 436 and the insulator 442. When a material with low permittivity is used for an interlayer film, the parasitic capacitance generated between wirings can be reduced.

The insulator 443 and the insulator 444 can be formed using any of the materials usable for the insulator 434, for example.

Like the insulator 436 and the insulator 442, the insulator 446 preferably has a barrier property that prevents diffusion of impurities such as water, hydrogen, and oxygen. Thus, the insulator 446 can be formed using any of the materials usable for the insulator 436 and the insulator 442, for example. The insulator 446 can employ a structure applicable to the insulator 436 and the insulator 442, for example.

The conductor 448 is embedded in the insulator 442, the insulator 443, the insulator 444, and the insulator 446. Note that the conductor 448 functions as a via hole, a plug, or a wiring. A plurality of conductors functioning as via holes, plugs, or wirings are collectively denoted by the same reference numeral in some cases. Moreover, in this specification and the like, a wiring and a via hole or a plug connected to the wiring may be a single component. That is, part of a conductor functions as a wiring in some cases and part of a conductor functions as a via hole or a plug in other cases.

As a material usable for a via hole, a plug, or a wiring (the conductor 448, a conductor 457 to be described later, the conductor 458, a conductor 518, and the conductor 540), a single layer or stacked layers of a conductive material such as a metal material, an alloy material, a metal nitride material, or a metal oxide material can be used. It is preferable to use a high-melting-point material having both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance. Alternatively, as the material usable for a via hole, a plug, or a wiring, any of the materials usable for the conductor 440 can be used, for example.

As a material for a via hole, a plug, or a wiring (the conductor 448, the conductor 457 to be described later, the conductor 458, the conductor 518, and the conductor 540), a conductor having a barrier property against water or hydrogen is preferably included. In particular, a conductor having a barrier property against water or hydrogen is preferably formed on the side surface of an opening portion formed in the insulator 442, the insulator 443, the insulator 444, and the insulator 446 that have a barrier property against hydrogen. With this structure, the components below the insulator 442 and the components above the insulator 446 can be separated by the insulator 442, the insulator 443, the insulator 444, the insulator 446, and the conductor 448 that function as barrier films.

For the conductor having a barrier property against hydrogen, tantalum nitride is preferably used, for example. In addition, by stacking tantalum nitride and tungsten, which has high conductivity, diffusion of hydrogen can be inhibited while the conductivity as a wiring is kept. In that case, a structure is preferable where a tantalum nitride layer having a barrier property against hydrogen is in contact with the insulator 442 and the insulator 446 that have a barrier property against hydrogen.

The conductor 450 is provided over the insulator 446 and the conductor 448.

The conductor 450 functions as a wiring for electrically connecting the first terminal of the memory element 400 and the first terminal of the transistor 500A to the conductor 440.

The conductor 450 can be formed using any of the materials usable for the conductor 440, for example. In the case where the memory element 400 is the MTJ element ME included in the variable resistance device MD of the memory cell MC in FIG. 4A, FIG. 4B, or the like, the conductor 450 preferably contains a metal material that causes a spin Hall effect. Thus, the conductor 450 can be formed using any of the materials usable for the layer CA illustrated in FIG. 5, for example.

Next, a structure of the memory element 400 is described. Note that in this structure example, the memory element 400 is assumed as the MTJ element ME included in the variable resistance device MD in the memory cell MC in FIG. 4A, FIG. 4B, or the like.

The memory element 400 is provided in part of a region over the conductor 450. The memory element 400 includes a conductor 401, an insulator 402, a conductor 403, and a conductor 404, and the conductor 401, the insulator 402, the conductor 403, and the conductor 404 are stacked in this order in the region.

The conductor 401 is a free layer of the memory element 400 and corresponds to the layer FL in the MTJ element ME in FIG. 5. The insulator 402 is a tunnel insulator of the memory element 400 and corresponds to the layer TIS in the MTJ element ME in FIG. 5. The conductor 403 is a fixed layer of the memory element 400 and corresponds to the layer RL in the MTJ element ME in FIG. 5. Thus, for materials usable for the conductor 401, the insulator 402, and the conductor 403, the description of the MTJ element ME in FIG. 5 can be referred to.

The conductor 404 is provided as a hard mask for forming the conductor 401, the insulator 402, and the conductor 403. The conductor 404 can be formed using any of the materials usable for the conductor 448, for example.

An insulator 452 is provided to cover the insulator 446, the conductor 450, the conductor 401, the insulator 402, the conductor 403, and the conductor 404.

Like the insulator 436, the insulator 442, and the insulator 446, the insulator 452 is preferably formed using a film having a barrier property that prevents diffusion of impurities such as water, hydrogen, and oxygen, for example. In other words, the insulator 452 is preferably formed using any of the materials usable for the insulator 436. The insulator 452 can have a structure applicable to the insulator 436.

An insulator 454 is provided over the insulator 452. The insulator 454 functions as a planarization film for eliminating a level difference caused by the conductor 450, the memory element 400, and the insulator 452, for example. The insulator 454 can be formed in the following manner, for example: an insulator to be the insulator 454 is formed over the insulator 452, and then planarization treatment by a chemical mechanical polishing (CMP) method is performed until the conductor 404 is exposed.

An insulator 456 is provided over the insulator 454, the insulator 452, and the conductor 404.

Like the insulator 443 or the insulator 444, each of the insulator 454 and the insulator 456 is preferably formed using an insulator having a relatively low dielectric constant. In other words, each of the insulator 454 and the insulator 456 is preferably formed using any of the materials usable for the insulator 443 or the insulator 444.

The conductor 457 is embedded in the insulator 456. Furthermore, the conductor 458 is embedded in the insulator 452, the insulator 454, and the insulator 456. Note that the conductor 457 and the conductor 458 each have a function of a via hole, a plug, or a wiring.

The conductor 457 functions as a wiring for electrically connecting the second terminal of the memory element 400 to the first terminal of the transistor 500B.

An insulator 510, an insulator 512, an insulator 513, an insulator 514, and an insulator 516 are sequentially stacked over the insulator 456, the conductor 457, and the conductor 458. A substance having a barrier property against water, hydrogen, or oxygen is preferably used for any of the insulator 510, the insulator 512, the insulator 513, the insulator 514, and the insulator 516.

For example, for the insulator 510 and the insulator 514, it is preferable to use a film having a barrier property that prevents diffusion of impurities such as water and hydrogen from below the insulator 510 into the region where the transistor 500 is provided. Therefore, each of the insulator 510 and the insulator 514 can be formed using a material similar to that for the insulator 436. The insulator 510 and the insulator 514 can employ a structure applicable to the insulator 436.

In addition, like the insulator 510 and the insulator 514, the insulator 513 is preferably formed using a film having a barrier property that prevents diffusion of impurities such as water and hydrogen. In particular, in FIG. 1, the insulator 513 functions as a film sealing the transistor 500 with an insulator 576 described later. Thus, the insulator 513 is preferably formed using any of the materials usable for the insulator 576. Alternatively, the insulator 513 may be formed using any of the materials usable for the insulator 510 or the insulator 514.

For the insulator 512 and the insulator 516, for example, a material with a relatively low permittivity is used, whereby the parasitic capacitance generated between wirings can be reduced. Thus, the insulator 512 and the insulator 516 can be formed using a material similar to that for the insulator 443 or the insulator 444.

Next, structure examples of the transistor 500A and the transistor 500B are described. Note that this description is made referring to the transistor 500A illustrated in FIG. 2A and FIG. 2B. Thus, the description of the transistor 500A is referred to for the transistor 500B, and supplemental description is added to the description of the transistor A for portions different between the transistor 500A and the transistor 500B.

The transistor 500A is provided above the insulator 514.

A conductor included in the transistor 500 (e.g., a conductor 503 illustrated in FIG. 2A and FIG. 2B), and the like are embedded in the insulator 510, the insulator 512, the insulator 513, the insulator 514, and the insulator 516.

Furthermore, the conductor 518 is embedded in the insulator 510, the insulator 512, the insulator 513, the insulator 514, the insulator 516, the insulator 520, and the insulator 522. Note that the conductor 518 has a function of a via hole, a plug, or a wiring that is connected to the memory element 400, the conductor 440, and the conductor 450 that are described above. Thus, the conductor 518 can be provided using a material similar to that for the conductor 448, for example.

In particular, the conductor 518 in a region in contact with the insulator 510 and the insulator 514 is preferably a conductor having a barrier property against oxygen, hydrogen, and water. With this structure, the transistor 500A and the components below the transistor 500A can be separated by the layer having a barrier property against oxygen, hydrogen, and water; hence, diffusion of hydrogen from below the transistor 500A into the transistor 500A can be inhibited.

As illustrated in FIG. 2A and FIG. 2B, the transistor 500A includes the conductor 503 placed to be embedded in the insulator 514 and the insulator 516, the insulator 520 placed over the insulator 516 and the conductor 503, the insulator 522 placed over the insulator 520, an insulator 524 placed over the insulator 522, an oxide 530a placed over the insulator 524, an oxide 530b placed over the oxide 530a, the conductor 542a and the conductor 542b placed apart from each other over the oxide 530b, an insulator 580 that is placed over the conductor 542a and the conductor 542b and has an opening formed to overlap with a region between the conductor 542a and the conductor 542b, an oxide 530c placed on the bottom and side surfaces of the opening, an insulator 550 placed on the top surface of the oxide 530c, and the conductor 560 placed on the top surface of the insulator 550. Note that the conductor 542a and the conductor 542b are collectively referred to as a conductor 542 in this specification and the like.

As illustrated in FIG. 2A and FIG. 2B, an insulator 544 is preferably placed between the insulator 580 and each of the conductor 542a and the conductor 542b. In addition, as illustrated in FIG. 2A and FIG. 2B, the conductor 560 preferably includes a conductor 560a provided inside the insulator 550 and a conductor 560b provided to be embedded inside the conductor 560a. As illustrated in FIG. 2A and FIG. 2B, an insulator 574 is preferably placed over the insulator 580, the conductor 560, and the insulator 550.

Hereinafter, the oxide 530a, the oxide 530b, and the oxide 530c are collectively referred to as an oxide 530 in some cases.

The transistor 500A is illustrated to have a structure where three layers of the oxide 530a, the oxide 530b, and the oxide 530c are stacked in the region where the channel is formed and its vicinity; however, one embodiment of the present invention is not limited thereto. For example, a single-layer structure of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is illustrated to have a stacked-layer structure of two layers in the transistor 500A, one embodiment of the present invention is not limited thereto. For example, the conductor 560 may have a single-layer structure or a stacked-layer structure of three or more layers. Moreover, the transistor 500A illustrated in FIG. 1, FIG. 2A, and FIG. 2B is an example and the structure is not limited thereto; an appropriate transistor can be used in accordance with a circuit structure and a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region interposed between the conductor 542a and the conductor 542b. The positions of the conductor 560, the conductor 542a, and the conductor 542b are selected in a self-aligned manner with respect to the opening in the insulator 580. In other words, in the transistor 500A, the gate electrode can be placed between the source electrode and the drain electrode in a self-aligned manner. Thus, the conductor 560 can be formed without an alignment margin, resulting in a reduction in the area occupied by the transistor 500A. Accordingly, miniaturization and high integration of the storage device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the transistor 500A can have a higher switching speed and high frequency characteristics.

The conductor 560 functions as a first gate (also referred to as a top gate) electrode in some cases. In addition, the conductor 503 sometimes functions as a second gate (also referred to as a bottom gate) electrode. In that case, the threshold voltage of the transistor 500A can be controlled by changing a potential applied to the conductor 503 not in synchronization with but independently of a potential applied to the conductor 560. In particular, the threshold voltage of the transistor 500A can be increased and the off-state current can be reduced by applying a negative potential to the conductor 503. Thus, drain current at the time when a potential applied to the conductor 560 is 0 V can be lower in the case where a negative potential is applied to the conductor 503 than in the case where the negative potential is not applied to the conductor 503.

The conductor 503 is placed to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure where a channel formation region is electrically surrounded by electric fields of a first gate electrode and a second gate electrode is referred to as a surrounded channel (S-channel) structure.

In the conductor 503, a conductor 503a is formed in contact with an inner wall of the opening in the insulator 514 and the insulator 516, and a conductor 503b is formed on the inner side. Although the transistor 500 is illustrated to have a structure where the conductor 503a and the conductor 503b are stacked, one embodiment of the present invention is not limited thereto. For example, the conductor 503 may be provided to have a single-layer structure or a stacked-layer structure of three or more layers.

Here, for the conductor 503a, it is preferable to use a conductive material having a function of inhibiting diffusion of impurities such as a hydrogen atom, a hydrogen molecule, a water molecule, and a copper atom (through which the impurities are less likely to pass). Alternatively, it is preferable to use a conductive material having a function of inhibiting diffusion of oxygen (e.g., one or both of an oxygen atom and an oxygen molecule) (through which the oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In the case where the conductivity of the wiring can be kept high, the conductor 503a is not necessarily provided. Note that the conductor 503b is illustrated as a single layer but may have a stacked-layer structure, for example, a stack of the above conductive material and titanium or titanium nitride.

The insulator 520, the insulator 522 and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved. Note that in this specification and the like, an oxygen vacancy in a metal oxide is sometimes referred to as Vo.

A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter, sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator in the vicinity of the oxide 530 in some cases. Part of hydrogen is diffused into or gettered (also referred to as gettering) by the conductor 542a and the conductor 542b in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+$ Ar)) is lower than or equal to 50%, preferably higher than or equal to 10% and lower than or equal to 30%.

In a fabrication process of the transistor 500, heat treatment is preferably performed with a surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (Vo). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

The insulator 522 preferably has a function of inhibiting diffusion of oxygen or impurities, in which case oxygen contained in the oxide 530 does not diffuse to the insulator 520 side. Furthermore, the conductor 503 can be inhibited from reacting with oxygen contained in the insulator 524 and the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

Note that in the transistor 500A in FIG. 2A and FIG. 2B, the insulator 520, the insulator 522, and the insulator 524 are illustrated as the second gate insulating film having a stacked-layer structure of three layers; alternatively, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500A, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) or the like is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide, an In—Zn oxide, or an In oxide may be used as the oxide 530.

Furthermore, a metal oxide with a low carrier concentration is preferably used for the transistor 500A. In order to reduce the carrier concentration in the metal oxide, the impurity concentration in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, an alkali metal, an alkaline earth metal, iron, nickel, and silicon.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron that is a carrier. Thus, a transistor using a metal oxide containing a large amount of hydrogen is likely to have normally-on characteristics. Moreover, hydrogen in a metal oxide is easily transferred by a stress such as heat or an electric field; thus, a large amount of hydrogen contained in a metal oxide might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) to obtain a metal oxide whose VoH is sufficiently reduced. When a metal oxide in which impurities such as VoH are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defect quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" described in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5\times10^{18}$ atoms/cm$^3$, still further preferably lower than $1\times10^{18}$ atoms/cm$^3$. When a metal oxide in which impurities such as hydrogen are sufficiently reduced is used for a channel formation region of a transistor, stable electrical characteristics can be given.

In the case where a metal oxide is used as the oxide 530, the metal oxide is an intrinsic (also referred to as i-type) or substantially intrinsic semiconductor that has a large band gap, and the carrier concentration of the metal oxide in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

In the case where a metal oxide is used as the oxide 530, contact between the oxide 530 and each of the conductor 542*a* and the conductor 542*b* might make oxygen in the oxide 530 diffuse into the conductor 542*a* and the conductor 542*b*, resulting in oxidation of the conductor 542*a* and the conductor 542*b*. It is highly possible that oxidation of the conductor 542*a* and the conductor 542*b* lowers the conductivity of the conductor 542*a* and the conductor 542*b*. Note that diffusion of oxygen from the oxide 530 into the conductor 542*a* and the conductor 542*b* can be rephrased as absorption of oxygen in the oxide 530 by the conductor 542*a* and the conductor 542*b*.

When oxygen in the oxide 530 diffuses into the conductor 542*a* and the conductor 542*b*, a layer is sometimes formed between the conductor 542*a* and the oxide 530*b* and between the conductor 542*b* and the oxide 530*b*. The layer contains a larger amount of oxygen than the conductor 542*a* and the conductor 542*b* and thus presumably has an insulating property. In this case, a three-layer structure of the conductor 542*a* or the conductor 542*b*, the layer, and the oxide 530*b* can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the layer is not necessarily formed between the oxide 530*b* and each of the conductor 542*a* and the conductor 542*b*; for example, the layer is formed between the oxide 530*c* and each of the conductor 542*a* and the conductor 542*b* in some cases.

The metal oxide functioning as the channel formation region in the oxide 530 has a band gap of preferably 2 eV or more, further preferably 2.5 eV or more. With the use of a metal oxide having such a large band gap, the off-state current of the transistor can be reduced.

When the oxide 530 includes the oxide 530*a* below the oxide 530*b*, it is possible to inhibit diffusion of impurities into the oxide 530*b* from the components formed below the oxide 530*a*. Moreover, including the oxide 530*c* over the oxide 530*b* makes it possible to inhibit diffusion of impurities into the oxide 530*b* from the components formed above the oxide 530*c*.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530*a* is preferably higher than the atomic proportion of the element M in the constituent elements in the metal oxide used as the oxide 530*b*. Moreover, the atomic ratio of the element M to In in the metal oxide used as the oxide 530*a* is preferably higher than the atomic ratio of the element M to In in the metal oxide used as the oxide 530*b*. Furthermore, the atomic ratio of In to the element M in the metal oxide used as the oxide 530*b* is preferably higher than the atomic ratio of In to the element M in the metal oxide used as the oxide 530*a*. As the oxide 530*c*, it is possible to use a metal oxide that can be used as the oxide 530*a* or the oxide 530*b*.

Specifically, as the oxide 530*a*, a metal oxide in which an atomic ratio of In, Ga, and Zn is In:Ga:Zn=1:3:4, 1:3:2, or 1:1:0.5 is used. In addition, as the oxide 530*b*, a metal oxide in which an atomic ratio of In, Ga, and Zn is In:Ga:Zn=4:2:3 or 1:1:1 is used. In addition, as the oxide 530*c*, a metal oxide in which an atomic ratio of In, Ga, and Zn is In:Ga:Zn=1:3:4 or an atomic ratio of Ga to Zn is Ga:Zn=2:1 or Ga:Zn=2:5 is used. Specific examples of the case where the oxide 530*c* has a stacked-layer structure include a stacked-layer structure of a layer in which an atomic ratio of In, Ga, and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In, Ga, and Zn is In:Ga:Zn=4:2:3; a stacked-layer structure of a layer in which an atomic ratio of Ga to Zn is Ga:Zn=2:5 and a layer in which an atomic ratio of In, Ga, and Zn is In:Ga:Zn=4:2:3; and a stacked-layer structure of gallium oxide and a layer in which an atomic ratio of In, Ga, and Zn is In:Ga:Zn=4:2:3.

For example, in the case where the atomic ratio of In to the element M in the metal oxide used as the oxide 530*a* is lower than the atomic ratio of In to the element M in the metal oxide used as the oxide 530*b*, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530*b*.

As the oxide 530*b*, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530*a*, the oxide 530*b*, and the oxide 530*c* are preferably combined to satisfy the above relation of the atomic ratios. For example, it is preferable that the oxide 530*a* and the oxide 530*c* each be a metal oxide having a composition of In:Ga:Zn=1:3:4 or a composition in the neighborhood thereof and the oxide 530*b* be a metal oxide having a composition of In:Ga:Zn=4:2:3 to 4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530*b* because the transistor can have a higher on-state current, higher field effect mobility, or the like.

In addition, the energy of the conduction band minimum of each of the oxide 530*a* and the oxide 530*c* is preferably higher than the energy of the conduction band minimum of the oxide 530*b*. In other words, the electron affinity of each of the oxide 530*a* and the oxide 530*c* is preferably smaller than the electron affinity of the oxide 530*b*.

Here, the energy level of the conduction band minimum gradually changes at junction portions of the oxide 530*a*, the oxide 530*b*, and the oxide 530*c*. In other words, the energy level of the conduction band minimum at the junction portions of the oxide 530*a*, the oxide 530*b*, and the oxide 530*c* continuously changes or is continuously connected. To change the energy level gradually, the densities of defect states in mixed layers formed at an interface between the oxide 530a and the oxide 530b and an interface between the oxide 530b and the oxide 530c are favorably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and thus the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. As the conductor 542a and the conductor 542b, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are oxidation-resistant conductive materials or materials that maintain their conductivity even after absorbing oxygen; thus, any of these materials is further preferably used for the conductor 542a and the conductor 542b. Moreover, since a metal nitride such as tantalum nitride has a barrier property against hydrogen or oxygen, a metal nitride is further preferably used for the conductor 542a and the conductor 542b.

The conductor 542a and the conductor 542b are illustrated to have a single-layer structure in FIG. 2A and FIG. 2B, but may have a stacked-layer structure of two or more layers. For example, it is preferable to stack a tantalum nitride film and a tungsten film. Alternatively, for example, a titanium film and an aluminum film may be stacked. Alternatively, for example, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

The conductor 542a and the conductor 542b may each have a three-layer structure of a titanium film or a titanium nitride film, an aluminum film or a copper film stacked over the titanium film or the titanium nitride film, and a titanium film or a titanium nitride film formed thereover. Alternatively, the conductor 542a and the conductor 542b may each have a three-layer structure of a molybdenum film or a molybdenum nitride film, an aluminum film or a copper film stacked over the molybdenum film or the molybdenum nitride film, and a molybdenum film or a molybdenum nitride film formed thereover. Note that a transparent conductive material containing indium oxide, tin oxide, or zinc oxide may be used for the conductor 542a and the conductor 542b.

In addition, as illustrated in FIG. 2A, a region 543a and a region 543b are sometimes formed as low-resistance regions at and near the interfaces between the oxide 530 and each of the conductor 542a and the conductor 542b. In that case, the region 543a functions as one of a source region and a drain region, and the region 543b functions as the other of the source region and the drain region. Furthermore, the channel formation region is formed in a region interposed between the region 543a and the region 543b.

When the conductor 542a (the conductor 542b) is provided in contact with the oxide 530, the oxygen concentration in the region 543a (the region 543b) sometimes decreases. In addition, a metal compound layer containing the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surfaces of the oxide 530 and the insulator 524 and to be in contact with the insulator 522.

A metal oxide containing one kind or two or more kinds selected from hafnium, aluminum, gallium, yttrium, zirconium, tungsten, titanium, tantalum, nickel, germanium, neodymium, lanthanum, and magnesium can be used for the insulator 544. Alternatively, silicon nitride oxide or silicon nitride can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

The insulator 544 can inhibit impurities such as water and hydrogen contained in the insulator 580 from diffusing into the oxide 530b. Furthermore, oxidation of the conductor 560 due to excess oxygen contained in the insulator 580 can be inhibited.

The insulator 550 functions as a first gate insulating film. The insulator 550 is preferably placed in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which are thermally stable, are preferable.

When an insulator that releases oxygen by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water and hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material usable for the insulator 544 can be used.

Note that the insulator 550 may have a stacked-layer structure like the second gate insulating film. As miniaturization and high integration of transistors progress, a problem such as a leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high dielectric constant.

The conductor 560 functioning as the first gate electrode is illustrated to have a two-layer structure in FIG. 2A and FIG. 2B, but may have a single-layer structure or a stacked-layer structure of three or more layers.

Here, for the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom. Alternatively, it is preferable to use a conductive material having a function of inhibiting diffusion of oxygen (e.g., one or both of an oxygen atom and an oxygen molecule). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, or ruthenium oxide is preferably used. For the conductor 560a, the oxide semiconductor usable as the oxide 530 can be used. In that case, when the conductor 560b is formed by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably formed using a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin. In particular, silicon oxide and silicon oxynitride, which are thermally stable, are preferable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. The concentration of impurities such as water and hydrogen in the insulator 580 is preferably lowered.

The opening in the insulator 580 is formed to overlap with the region between the conductor 542a and the conductor 542b. Accordingly, the conductor 560 is formed to be embedded in the opening in the insulator 580 and the region interposed between the conductor 542a and the conductor 542b. In particular, since the conductor 560 is formed in a self-aligned manner, the transistor 500 is referred to as a TGSA (Top Gate Self Align) FET in some cases.

The gate length needs to be short for miniaturization of the storage device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing in the process.

The insulator 574 is preferably provided in contact with the top surface of the insulator 580, the top surface of the conductor 560, and the top surface of the insulator 550. When the insulator 574 is formed by a sputtering method, excess-oxygen regions can be provided in the insulator 550 and the insulator 580. Thus, oxygen can be supplied from the excess-oxygen regions to the oxide 530.

As the insulator 574, it is possible to use, for example, a metal oxide containing one or more selected from hafnium, aluminum, gallium, yttrium, zirconium, tungsten, titanium, tantalum, nickel, germanium, magnesium, and the like.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

Parts of the insulator 574, the insulator 580, the insulator 544, the insulator 522, the insulator 520, the insulator 516, and the insulator 514 are removed, thereby forming an opening where the insulator 513 is exposed, and the insulator 576 having a high barrier property against hydrogen or water is provided to surround the transistor 500A. Thus, the side surface of each of the insulator 574, the insulator 580, the insulator 544, the insulator 522, the insulator 520, the insulator 516, and the insulator 514 is in contact with the insulator 576. This can prevent entry of moisture and hydrogen into the transistor 500 from the outside.

As described above, it is preferable that the insulator 513 and the insulator 576 have higher capability of inhibiting diffusion of hydrogen (e.g., one or both of a hydrogen atom and a hydrogen molecule) or a water molecule. For example, for the insulator 513 and the insulator 576, silicon nitride or silicon nitride oxide that is a material having a high hydrogen barrier property is preferably used. This can inhibit diffusion of hydrogen into the oxide 530, thereby inhibiting the degradation of the characteristics of the transistor 500. Thus, the reliability of the semiconductor device of one embodiment of the present invention can be increased.

An insulator 581 functioning as an interlayer film and a planarization film is preferably provided over the insulator 576. As in the insulator 524 and the like, the concentration of impurities such as water and hydrogen in the insulator 581 is preferably lowered.

An insulator 552 is provided on the side surface of the opening formed in the insulator 581, the insulator 576, the insulator 574, the insulator 580, and the insulator 544. Then, the conductor 540 is provided to be in contact with the side surface of the insulator 552 and the bottom surface of the opening. Note that in FIG. 2A, the conductor 540 is provided in a region overlapping with the conductor 542b and not overlapping with the oxide 530b. In other words, the conductor 540 is provided so as to be positioned between the transistor 500A and the transistor 500B in FIG. 1.

The insulator 552 is provided in contact with the insulator 581, the insulator 576, the insulator 574, the insulator 580, and the insulator 544, for example. The insulator 552 preferably has a function of inhibiting diffusion of hydrogen or water molecules. For example, as the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540. Furthermore, oxygen contained in the insulator 580 can be inhibited from being absorbed by the conductor 540. In this manner, the reliability of the semiconductor device of one embodiment of the present invention can be increased.

The conductor 540 can be provided using a material similar to that for the conductor 448, the conductor 458, the conductor 518, or the conductor 503, for example. It is particularly preferable that the conductor 540 have a stacked-layer structure of two or more layers in which the first layer that is in contact with the insulator 552 is formed using a conductive material having a function of inhibiting diffusion of impurities such as a hydrogen atom, a hydrogen molecule, a water molecule, and a copper atom (through which the impurities are less likely to pass) and the second and subsequent layers are formed using a conductive material containing tungsten, copper, or aluminum as its main component and having high conductivity.

In FIG. 1, an insulator 582 is provided over the insulator 581. A substance having a barrier property against one or both of oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents passage of oxygen and impurities such as hydrogen and moisture, which would cause a change in electrical characteristics of a transistor as described above; thus, aluminum oxide is further preferably used for the insulator 582.

In addition, an insulator 584 is provided over the insulator 582. For the insulator 584, a material similar to that for the insulator 443 or the insulator 444 can be used. Furthermore, when a material with a relatively low dielectric constant is used for the insulator 584, parasitic capacitance between wirings can be reduced. For example, a silicon oxide film or a silicon oxynitride film can be used for the insulator 584.

An insulator 588 is provided over the insulator 584.

Like the insulator 436 and the insulator 442, the insulator 588 preferably has a barrier property that prevents diffusion of impurities such as water, hydrogen, and oxygen. Thus, the insulator 588 can be formed using any of the materials usable for the insulator 436 and the insulator 442, for example. The insulator 588 can employ a structure applicable to the insulator 436 and the insulator 442, for example.

As illustrated in FIG. 1 and FIG. 2A, the conductor 540 is embedded in the insulator 544, the insulator 580, the insulator 574, the insulator 576, the insulator 581, the insulator 582, the insulator 584, and the insulator 588.

The conductor 540 functions as a via hole, a plug, or a wiring that connects the transistor 500A and the transistor 500B to the conductor 590 to be described later.

The conductor 590 is provided over the insulator 588 and the conductor 540.

As described above, the conductor 590 functions as a wiring electrically connected to the memory cell of one embodiment of the present invention. Thus, a material usable for the conductor 440 can be used for the conductor 590. The conductor 590 can employ a structure applicable to the conductor 440.

An insulator 592 is provided over the conductor 590.

Like the insulator 436 and the insulator 442, the insulator 592 preferably has a barrier property that prevents diffusion of impurities such as water, hydrogen, and oxygen. Thus, the insulator 592 can be formed using any of the materials usable for the insulator 436 and the insulator 442, for example. The insulator 592 can have a structure applicable to the insulator 436 and the insulator 442.

An insulator 593 is provided over the insulator 592. For the insulator 593, a material similar to that for the insulator 443 or the insulator 444 can be used. Furthermore, when a material with a relatively low dielectric constant is used for the insulator 593, parasitic capacitance between wirings can be reduced. For example, a silicon oxide film or a silicon oxynitride film can be used for the insulator 593.

As illustrated in FIG. 1A, in a plan view, the conductor 440 functioning as the wiring BL and the conductor 590 functioning as the wiring SL preferably include a region overlapping with each other. Thus, the area of the memory cell included in the storage device can be reduced.

Note that in the plan diagram of FIG. 1A, the wiring width of the conductor 590 functioning as the wiring SL is shorter than the wiring width of the conductor 440 functioning as the wiring BL; however, the wiring width of the conductor 590 may be equal to the wiring width of the conductor 440 or may be longer than the wiring width of the conductor 440.

The structure of the transistor of the semiconductor device of one embodiment of the present invention is not limited to that in FIG. 1, FIG. 2A, and FIG. 2B. For example, a transistor illustrated in FIG. 3A and FIG. 3B may be used as a transistor usable as the transistor M3 and the transistor M4 illustrated in FIG. 4A and FIG. 4B.

Figures 3A, 3B:
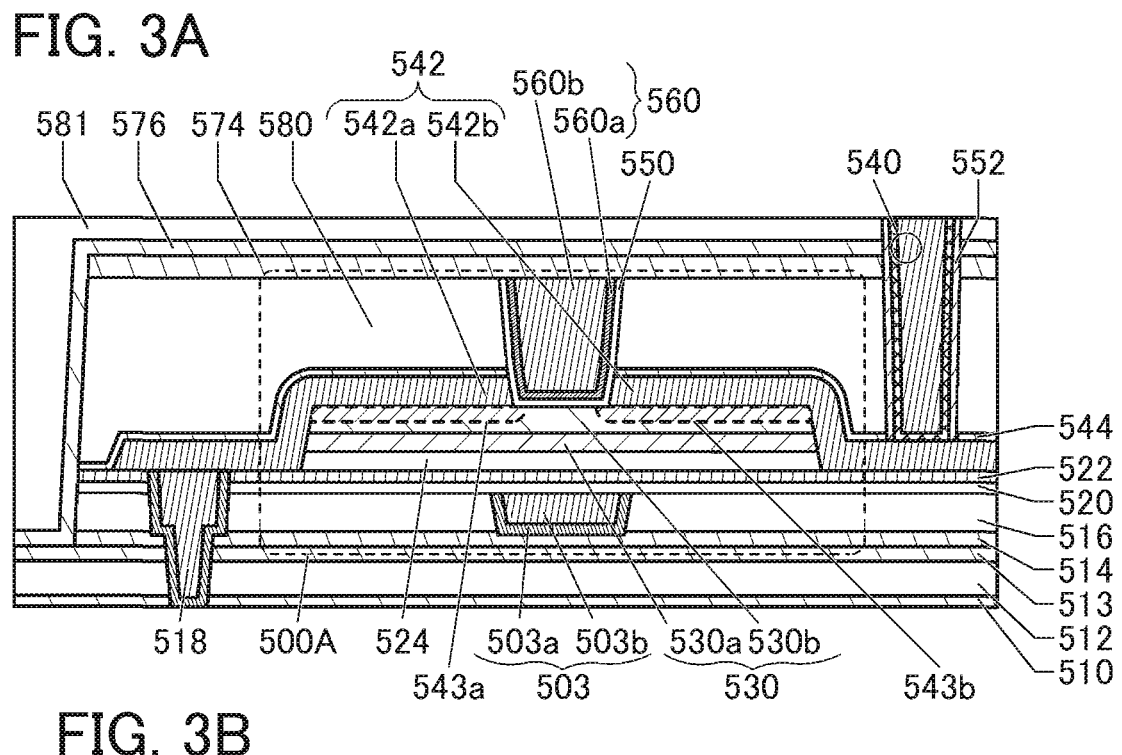
FIG. 3A and FIG. 3B are schematic cross-sectional diagrams illustrating a structure example of a transistor.

The transistor 500A illustrated in FIG. 3A and FIG. 3B is a variation example of the transistor 500A illustrated in FIG. 2A and FIG. 2B. FIG. 3A is a cross-sectional diagram of the transistor 500A in the channel length direction, and FIG. 3B is a cross-sectional diagram of the transistor 500A in the channel width direction. The transistor 500A illustrated in FIG. 3A and FIG. 3B is different from the transistor 500A illustrated in FIG. 2A and FIG. 2B in that the oxide 530c is not provided. Therefore, the insulator 550 is placed on the bottom and side surfaces of the opening portion in the insulator 580, which is formed between the conductor 542a and the conductor 542b, and the conductor 560 is placed on the top surface of the insulator 550.

Since the transistor 500A illustrated in FIG. 3A and FIG. 3B does not include the oxide 530c, parasitic capacitance between the oxide 530c and the conductor 560 with the insulator 550 therebetween can be eliminated. Thus, the operation frequency of the transistor 500A can be increased.

The transistor of the semiconductor device of one embodiment of the present invention may have a structure other than the structures of the transistors illustrated in FIG. 1A to FIG. 3B. For the semiconductor device of one embodiment of the present invention, a planar transistor, a staggered transistor, or an inverted staggered transistor can be used, for example. Alternatively, a top-gate transistor in which a gate is provided above a semiconductor layer can be used. Alternatively, a bottom-gate transistor in which a gate is provided below a semiconductor layer, e.g., a BGTC (Bottom-Gate Top-Contact) transistor can be used. Alternatively, a transistor in which gates are provided above and below a semiconductor layer can be used.

Structure Example 2

Note that the structure of the semiconductor device of one embodiment of the present invention is not limited to the above-described structure and may be changed as appropriate.

Figure 6A:
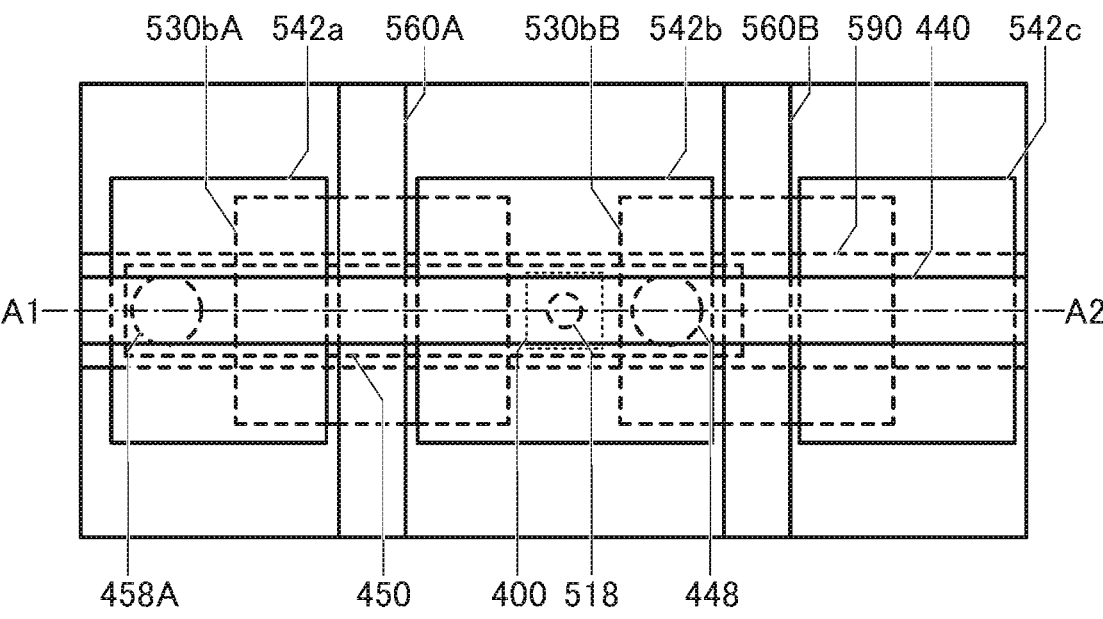
FIG. 6A is a schematic plan diagram illustrating a structure example of a memory cell.
Figure 6B:
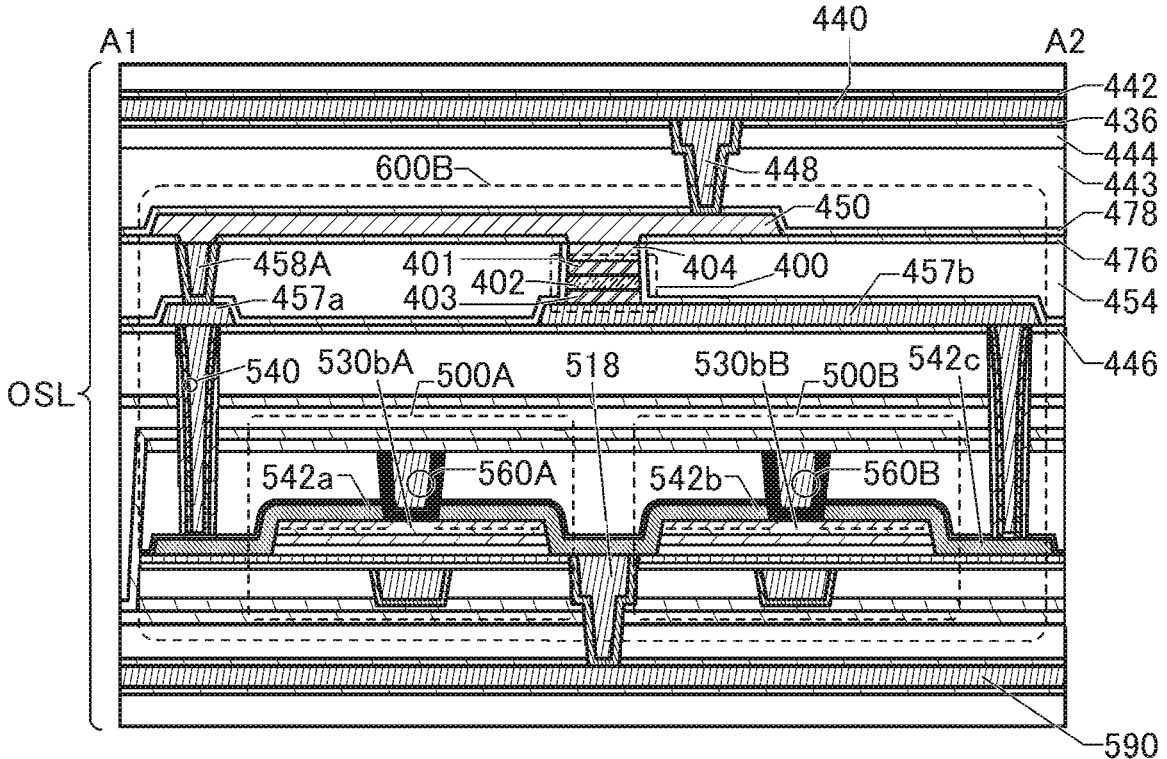
FIG. 6B is a schematic cross-sectional diagram illustrating the structure example of a memory cell.

For example, the structure of the memory cell 600A illustrated in FIG. 1A and FIG. 1B may be changed into a structure of a memory cell illustrated in FIG. 6A and FIG. 6B. In a memory cell 600B illustrated in FIG. 6A and FIG. 6B, the transistor 500A and the transistor 500B are provided above the conductor 590, the memory element 400 is provided above the transistor 500A and the transistor 500B, and the conductor 440 is provided above the memory element 400. That is, the memory cell 600B has a structure where the stacking order of the components of the memory cell 600A is reversed.

Thus, the memory cell 600B is different from the memory cell 600A illustrated in FIG. 1A and FIG. 1B in that the conductor 440 is positioned above the conductor 590. That is, in the memory cell 600B in FIG. 6A and FIG. 6B, the wiring BL is provided above the wiring SL.

In the memory cell 600B, the conductor 518 is provided above the conductor 590, and the conductor 542b is provided above the conductor 518. In the memory cell 600A in FIG. 1A and FIG. 1B, the conductor 540 is provided above the conductor 542b, and the electrical continuity is established between the conductor 542b and the conductor 590; meanwhile, in the memory cell 600B in FIG. 6A and FIG. 6B, the conductor 518 is provided below the conductor 542b, and electrical continuity is established between the conductor 542b and the conductor 590.

In the memory cell 600B, the conductors 540 are provided above the conductor 542a and above the conductor 542c. A conductor 457a is provided above the insulator 446 and the conductor 540 that is electrically connected to the conductor 542a. A conductor 457b is provided above the insulator 446 and the conductor 540 that is electrically connected to the conductor 542c. For the conductor 457a and the conductor 457b, any of the materials usable for the conductor 457 can be used. In the case where the conductor 457a and the conductor 457b use the same materials, the conductor 457a and the conductor 457b can be formed in the same step.

A conductor 458A is embedded in the insulator 454. The conductor 458A has a function of a via hole, a plug, or a wiring. Thus, the conductor 458A can be formed using any of materials usable for the conductor 458, for example.

The memory element 400 included in the memory cell 600B is different from the memory element 400 in FIG. 1A and FIG. 1B in the structure. Specifically, the memory element 400 in FIG. 1A and FIG. 1B has a structure where the conductor 401, the insulator 402, the conductor 403, and the conductor 404 are stacked in this order; meanwhile, the memory element 400 illustrated in FIG. 6A and FIG. 6B has a structure where the conductor 403, the insulator 402, the conductor 401, and the conductor 404 are stacked in this order. That is, in the memory cell 600B in FIG. 6A and FIG. 6B, the first terminal of the memory element 400 is electrically connected to the conductor 450 to be described later, and the second terminal of the memory element 400 is electrically connected to the conductor 457b.

The conductor 404 is provided as a hard mask. Since the magnetic moment of the conductor 401 functioning as a free layer of the MTJ element changes in accordance with a current flowing through the conductor 450 to be described later, the distance between the conductor 401 functioning as a free layer of the MTJ element and the conductor 450 is preferably short. Alternatively, a structure where the conductor 404 is not provided and the conductor 401 and the conductor 450 are directly in contact with each other is preferably employed. In such cases, a step of thinning the conductor 404 or a step of exposing the conductor 401 is performed by planarization treatment after formation of the insulator 454.

An insulator 476 is provided over the insulator 454. Opening portions are provided in regions of the insulator 476 overlapping with the conductor 458A and the conductor 401. The insulator 476 can be formed using any of the materials usable for the insulator 446.

The conductor 450 is provided over the insulator 476, and the conductor 458A and the conductor 401 that are under the bottom surfaces of the opening portions in the insulator 476. Thus, the conductor 450 is electrically connected to the conductor 458A and the conductor 401. Like the conductor 450 in FIG. 1A and FIG. 1B, the conductor 450 preferably contains a metal material that causes a spin Hall effect. Thus, the conductor 450 can be formed using any of the materials usable for the layer CA illustrated in FIG. 5, for example.

An insulator 478 is provided over the conductor 450 and the insulator 476. The insulator 478 can be formed using any of the materials usable for the insulator 446, for example.

The insulator 443, the insulator 444, and the insulator 436 are provided in this order over the insulator 478. Furthermore, the conductor 448 is embedded in the insulator 443, the insulator 444, and the insulator 436. The conductor 440 is provided over the conductor 448 and the insulator 436. Accordingly, the conductor 440 is electrically connected to the first terminal of the memory element 400 and the first terminal of the transistor 500A.

Like the memory cell 600A in FIG. 1A and FIG. 1B, the memory cell 600B in FIG. 6A and FIG. 6B can be used in a storage device.

Alternatively, the semiconductor device of one embodiment of the present invention may have a structure where the memory cell 600B in FIG. 6A and FIG. 6B is provided above the memory cell 600A illustrated in FIG. 1A and FIG. 1B, with the conductor 590 shared by the memory cells. Specifically, the semiconductor device of one embodiment of the present invention may have a structure illustrated in FIG. 7.

Figure 7:
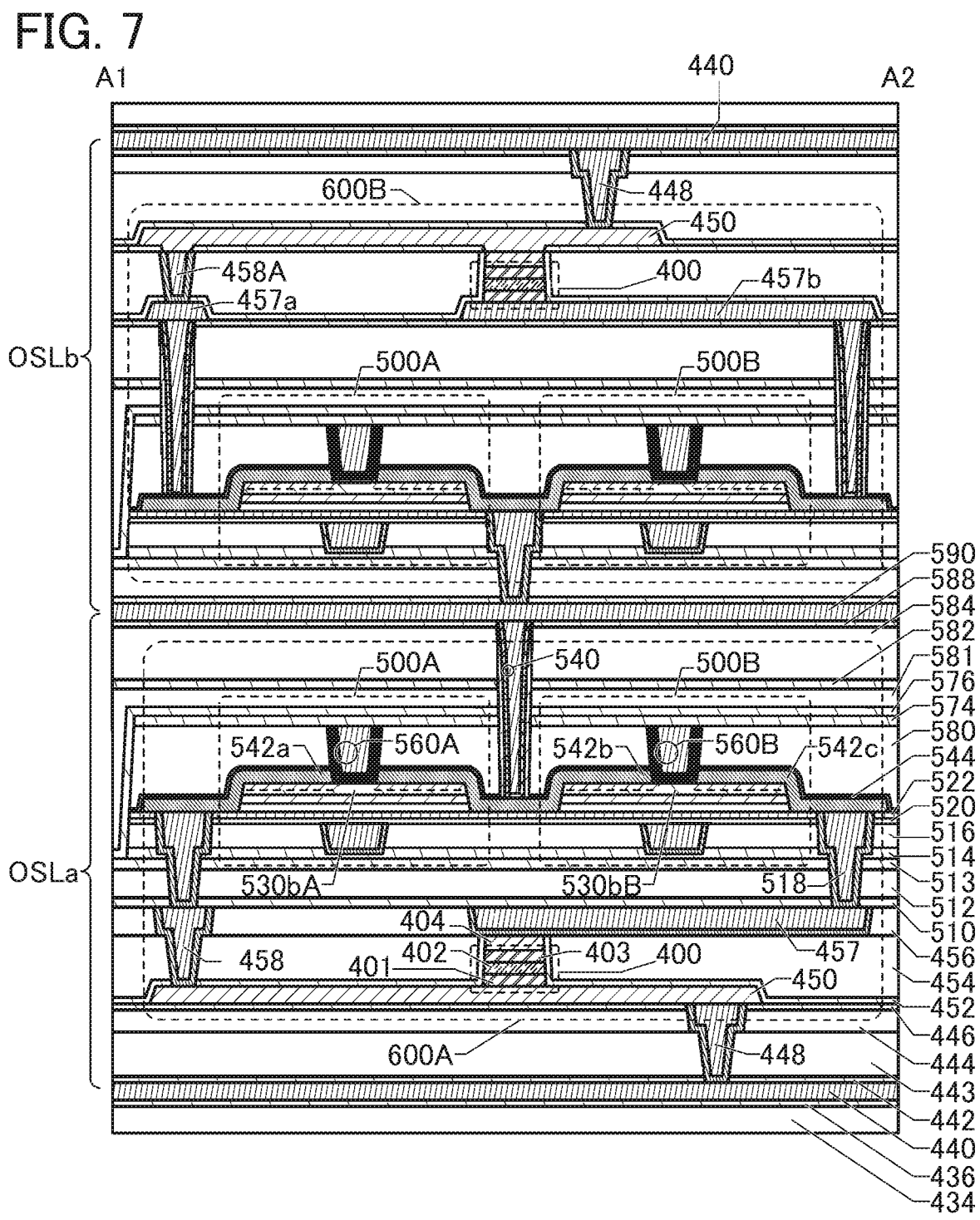
FIG. 7 is a schematic cross-sectional diagram illustrating a structure example of a memory cell.

FIG. 7 illustrates a structure example of a semiconductor device including a layer OSLa that includes the memory cell 600A in FIG. 1A and FIG. 1B and a layer OSLb that includes the memory cell 600B in FIG. 6A and FIG. 6B. Note that the layer OSLb is provided above the layer OSLa.

In FIG. 7, the memory cell 600A and the memory cell 600B are electrically connected to the conductor 590. The conductor 590 functions as the wiring SL for the memory cell 600A and the memory cell 600B.

As illustrated in FIG. 7, when the memory cell 600A and the memory cell 600B overlap with each other so as to share the conductor 590 functioning as the wiring SL, the storage capacity per unit volume of the semiconductor device can be increased.

Figure 8:
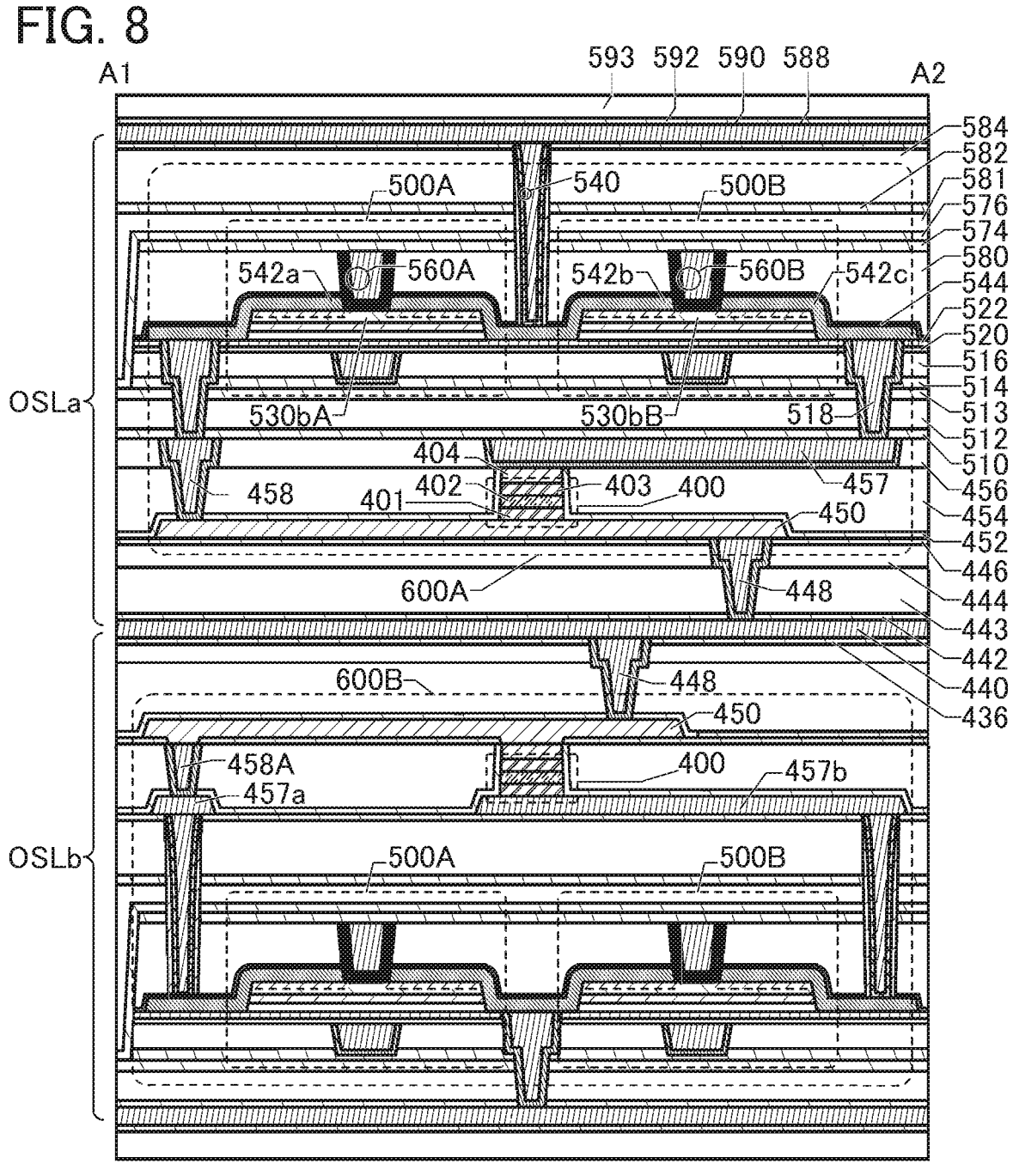
FIG. 8 is a schematic cross-sectional diagram illustrating a structure example of a memory cell.

Although FIG. 7 illustrates the structure where the memory cell 600A and the memory cell 600B are electrically connected to the conductor 590, the memory cell 600A in FIG. 1A and FIG. 1B may be provided above the memory cell 600B illustrated in FIG. 6A and FIG. 6B, with the conductor 440 shared by the memory cells. That is, the memory cell 600A and the memory cell 600B may be electrically connected to the conductor 440 functioning as the wiring BL (see FIG. 8).

Figure 9:
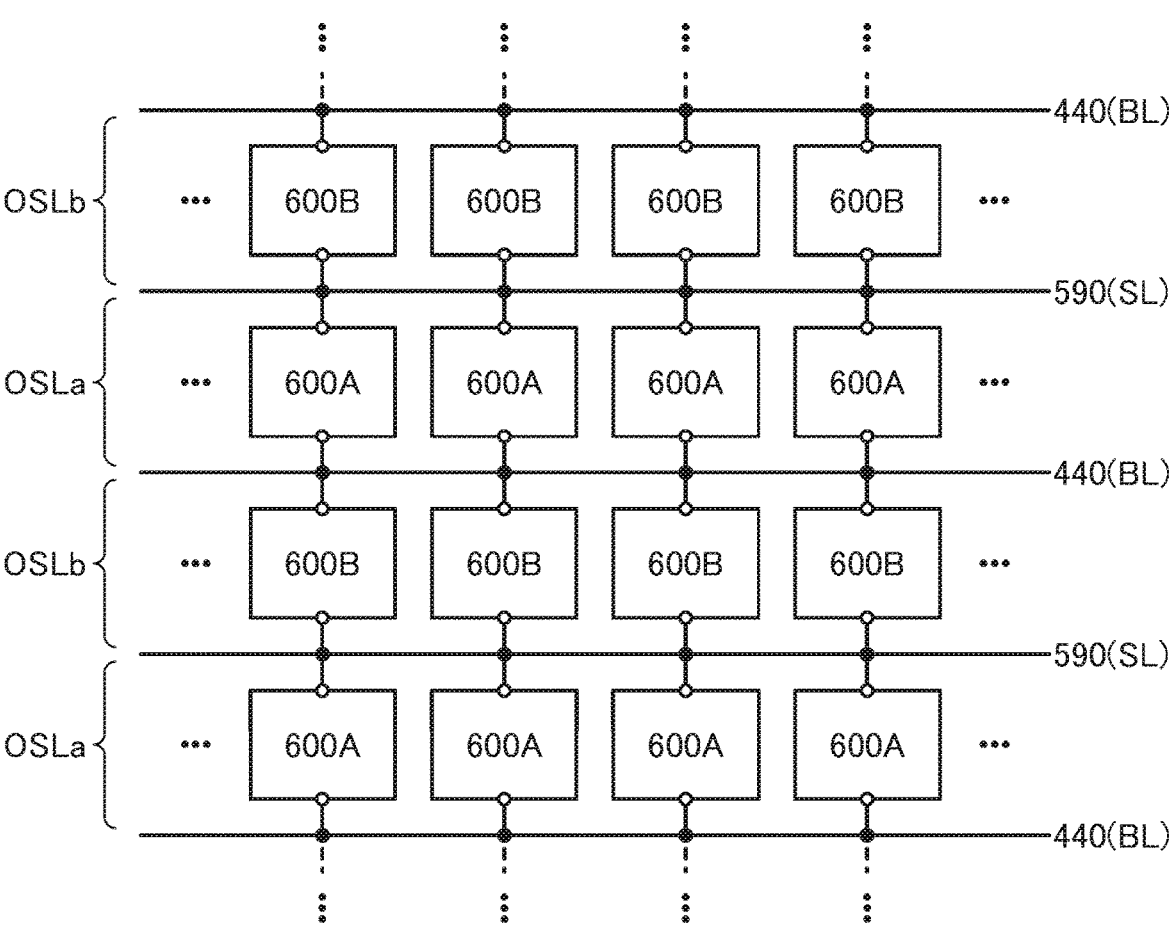
FIG. 9 is a block diagram illustrating a connection structure of a plurality of memory cells.

In FIG. 7, a structure may be employed where another layer OSLa is provided above the layer OSLb, and the memory cell 600B of the layer OSLb and the memory cell 600A of the other layer OSLa are electrically connected to the conductor 440 functioning as the wiring BL (not illustrated). Alternatively, for example, as illustrated in FIG. 9, a structure may be employed where the memory cells 600A and the memory cells 600B are alternately stacked and the wiring SL (the conductor 590) therebetween is shared by the memory cells 600A positioned below and 600B positioned above. Similarly, as illustrated in FIG. 9, a structure may be employed where the memory cells 600A and the memory cells 600B are alternately stacked and the wiring BL (the conductor 440) therebetween is shared by the memory cells 600B positioned below and 600A positioned above.

Structure Example 3

Figure 10A:
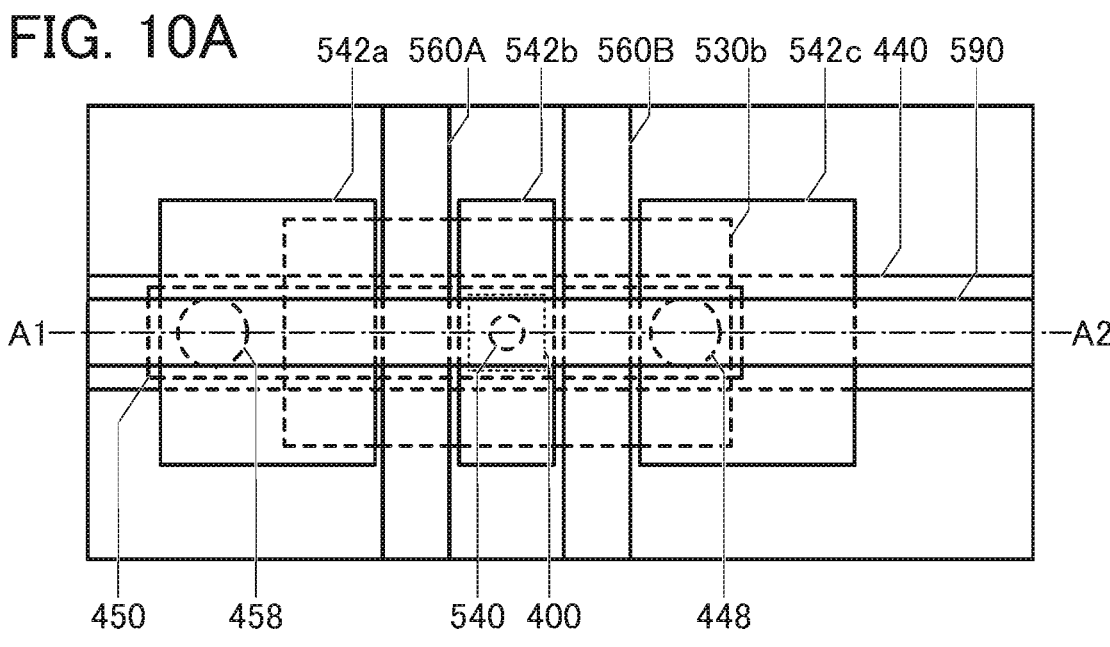
FIG. 10A is a schematic plan diagram illustrating a structure example of a memory cell.
Figure 10B:
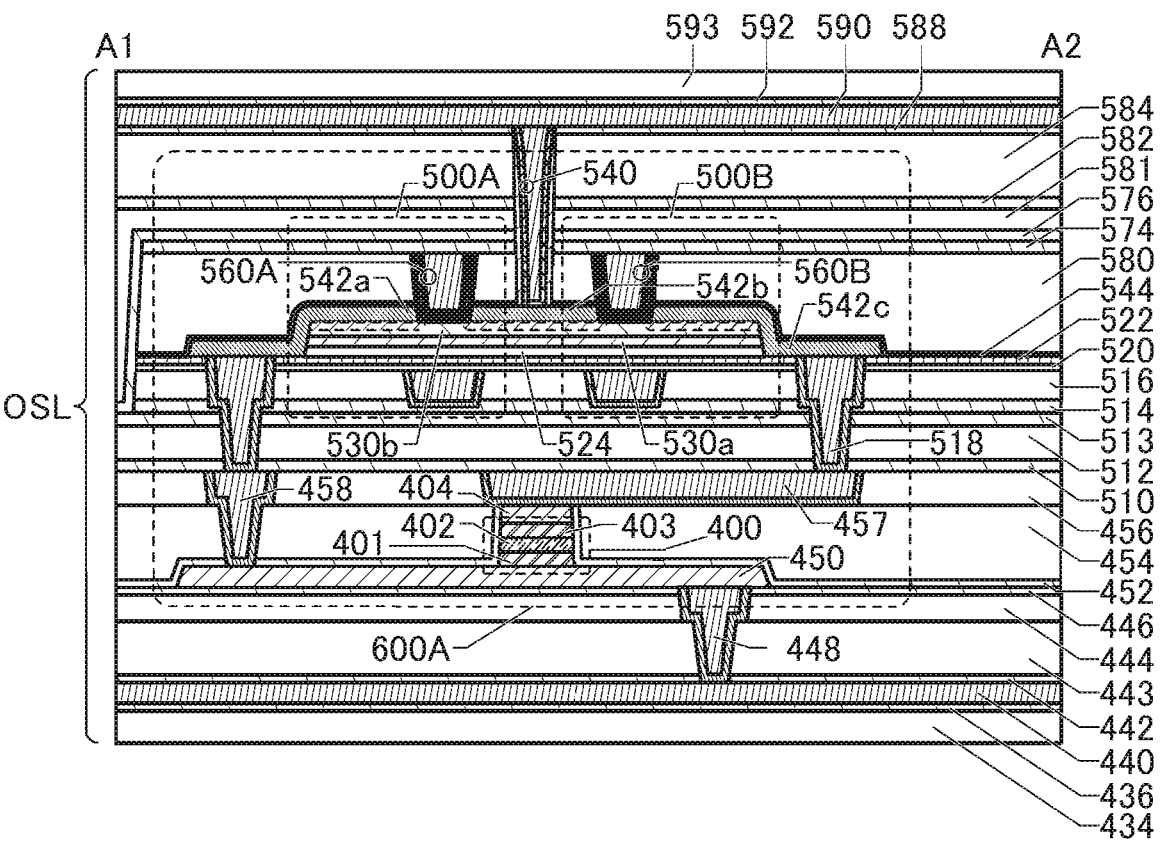
FIG. 10B is a schematic cross-sectional diagram illustrating the structure example of a memory cell.

Alternatively, the semiconductor device of one embodiment of the present invention may have a structure illustrated in FIG. 10A and FIG. 10B. The memory cell 600A illustrated in FIG. 10A and FIG. 10B is a variation example of the memory cell 600A in FIG. 1A and FIG. 1B, and is different from the memory cell 600A in FIG. 1A and FIG. 1B in the structures of the transistor 500A and the transistor 500B.

In the memory cell 600A in FIG. 10A and FIG. 10B, the transistor 500A and the transistor 500B are formed to share the insulator 524, the oxide 530a, and the oxide 530b. The opening portion in which the conductor 540 is embedded is located between the conductor 560A and the conductor 560B and in a region where the insulator 524, the oxide 530a, and the oxide 530b overlap with each other. Thus, the area where the transistor 500A and the transistor 500B are formed can be made smaller than the area of the case where the transistor 500A and the transistor 500B are separately formed as illustrated in FIG. 1A and FIG. 1B. This can make a region where the memory cell 600A is formed small, thereby reducing the area per bit as a bit density.

Structure Example 4

Figure 11A:
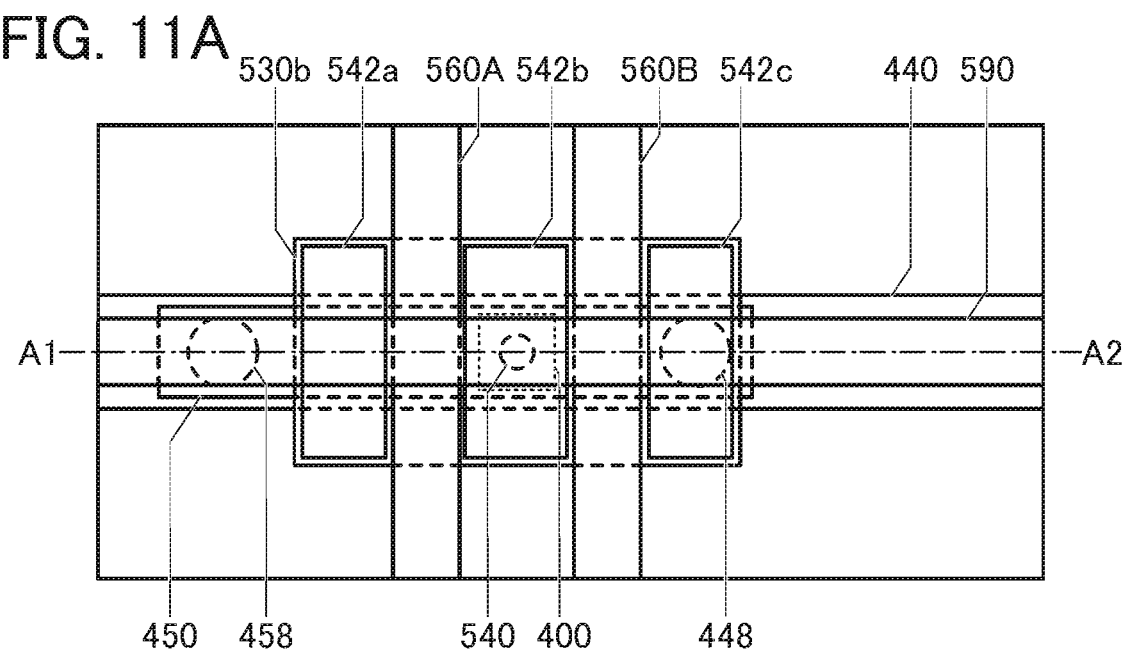
FIG. 11A is a schematic plan diagram illustrating a structure example of a memory cell.
Figure 11B:
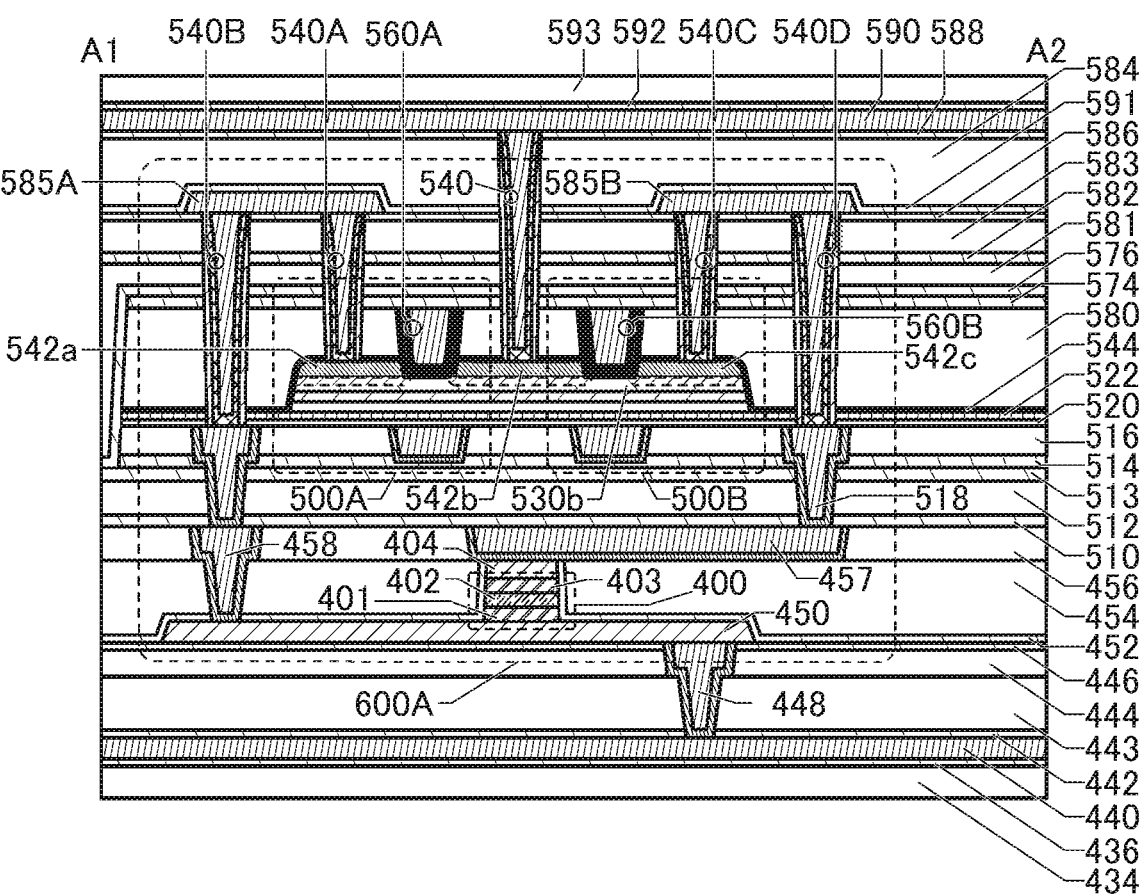
FIG. 11B is a schematic cross-sectional diagram illustrating the structure example of a memory cell.

Alternatively, the semiconductor device of one embodiment of the present invention may have a structure illustrated in FIG. 11A and FIG. 11B. The memory cell 600A illustrated in FIG. 11A and FIG. 11B is a variation example of the memory cell 600A in FIG. 10A and FIG. 10B, and is different from the memory cell 600A in FIG. 10A and FIG. 10B in the structures of the transistor 500A and the transistor 500B.

In the memory cell 600A in FIG. 11A and FIG. 11B, the transistor 500A and the transistor 500B have a structure where the conductor 542a to the conductor 542c are formed only over the oxide 530b. The transistor 500A and the transistor 500B can be fabricated in the following manner, for example: the insulator 524, the oxide 530a, the oxide 530b, and a conductive film to be the conductor 542a to the conductor 542c are formed in this order over the insulator 522, and then the insulator 524, the oxide 530a, the oxide 530b, and the conductive film to be the conductor 542a to the conductor 542c are processed by etching treatment or the like so as to expose the side surfaces of the insulator 524, the oxide 530a, and the oxide 530b and the top surface of the insulator 522. Thus, the conductor 542a to the conductor 542c are formed only over the oxide 530b.

The memory cell 600A in FIG. 11A and FIG. 11B is different from the memory cell 600A in FIG. 10A and FIG. 10B in part of the structures of the insulator and the conductor provided above the transistor 500A and the transistor 500B. For example, the memory cell 600A in FIG. 11A and FIG. 11B is different from the memory cell 600A in FIG. 10A and FIG. 10B in that an insulator 586 is provided over the insulator 583, a conductor 585A is provided over the insulator 586, a conductor 540A, and a conductor 540B, a conductor 585B is provided over the insulator 586, a conductor 540C, and a conductor 540D, an insulator 591 is provided over the insulator 586, the conductor 585A, and the conductor 585B, and the insulator 584 is provided over the insulator 591.

The insulator 586 can be formed in the steps similar to those for the insulator 446, for example. Thus, the insulator 586 can be formed using any of the materials usable for the insulator 446.

In the case of the memory cell 600A illustrated in FIG. 11A and FIG. 11B, the conductor 540A and the conductor 540B are embedded in predetermined positions in order that the first terminal of the transistor 500A, the first terminal of the memory element 400, and the conductor 440 may be electrically connected to each other. Specifically, an opening portion is provided in the insulator 580, the insulator 574, the insulator 576, the insulator 581, the insulator 582, the insulator 583, and the insulator 586 to be described later in a region overlapping with the conductor 542a, and the conductor 540A is embedded in the opening portion. An opening portion is provided in the insulator 520, the insulator 522, the insulator 544, the insulator 580, the insulator 574, the insulator 576, the insulator 581, the insulator 582, the insulator 583, and the insulator 586 in a region overlapping with the conductor 518 (the conductor 458) that is electrically connected to the first terminal of the memory element 400, and the conductor 540B is embedded in the opening portion.

To electrically connect the first terminal of the transistor 500B and the second terminal of the memory element 400, the conductor 540C and the conductor 540D are embedded in predetermined positions. Specifically, an opening portion is provided in the insulator 580, the insulator 574, the insulator 576, the insulator 581, the insulator 582, the insulator 583, and the insulator 586 in a region overlapping with the conductor 542c, and the conductor 540C is embedded in the opening portion. An opening portion is provided in the insulator 520, the insulator 522, the insulator 544, the insulator 580, the insulator 574, the insulator 576, the insulator 581, the insulator 582, the insulator 583, and the insulator 586 in a region overlapping with the conductor 518 that is electrically connected to the second terminal of the memory element 400, and the conductor 540D is embedded in the opening portion.

The conductor 540A to the conductor 540D can be formed through steps similar to those for the conductor 540, for example. Thus, the conductor 540A to the conductor 540D can be formed using any of the materials usable for the conductor 540. The side surfaces of the opening portions where the conductor 540A to the conductor 540D are provided may each be provided with the insulator 552, like the side surface of the opening portion provided with the conductor 540.

The conductor 585A is provided over the insulator 586, the conductor 540A, and the conductor 540B. The conductor 585B is provided above the insulator 586, the conductor 540C, and the conductor 540D. Accordingly, the first terminal of the transistor 500A is electrically connected to the first terminal of the memory element 400 and the conductor 440, and the first terminal of the transistor 500B is electrically connected to the second terminal of the memory element 400.

The conductor 585A and the conductor 585B can be formed through steps similar to those for the conductor 450, for example. Thus, the conductor 585A and the conductor 585B can be formed using any of the materials usable for the conductor 450.

The insulator 591 is provided over the insulator 586, the conductor 585A, and the conductor 585B. The insulator 591 can be formed through steps similar to those for the insulator 452, for example. Thus, the insulator 591 can be formed using any of the materials usable for the insulator 452.

Figure 4B:
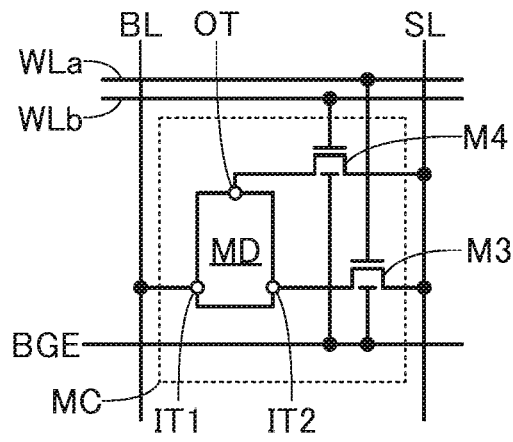

When one or more memory cells 600A (or memory cells 600B) selected from FIG. 1A, FIG. 1B, FIG. 6A, FIG. 6B, FIG. 10A, FIG. 10B, FIG. 11A, and FIG. 11B are used as the memory cell MC illustrated in FIG. 4A and FIG. 4B, the area of the memory cell included in the storage device can be reduced. This results in an increase in the storage capacity per unit area of the storage device.

Structure Example 2 of Memory Cell

Figure 4C:
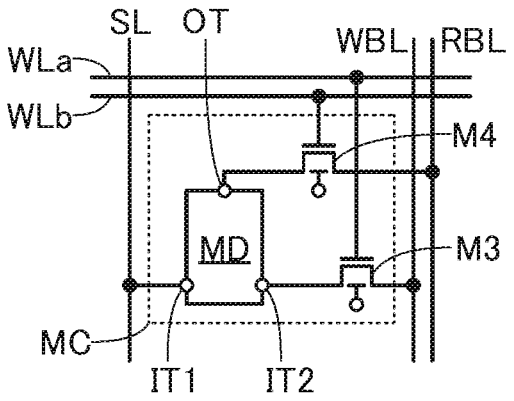

The memory cell MC illustrated in FIG. 4C is a variation example of the memory cell MC in FIG. 4A, and the memory cell MC in FIG. 4C can also be provided in the storage device. The memory cell MC in FIG. 4C is different from the memory cell MC in FIG. 4A in that the wiring SL is changed into two wirings, a wiring WBL and the wiring RBL, and the wiring BL is changed into the wiring SL.

Specifically, in the memory cell MC in FIG. 4C, the second terminal of the transistor M3 is electrically connected to the wiring WBL, and the second terminal of the transistor M4 is electrically connected to the wiring RBL. The terminal IT1 of the variable resistance device MD is electrically connected to the wiring SL. For the other connection structure, the description of the memory cell MC in FIG. 4A can be referred to.

In the memory cell MC in FIG. 4C, the wiring WBL functions as a write bit line, for example. The wiring RBL functions as a reading bet line, for example. The wiring SL functions as a wiring that supplies a constant voltage, for example.

Here, examples of a method for writing data and a method for reading data in/from the memory cell MC in FIG. 4C are described. Note that, for example, a low-level potential is supplied to the wiring SL.

When data is written to the memory cell MC, a high-level potential is supplied to the wiring WLa, so that the transistor M3 is turned on, and a low-level potential is supplied to the wiring WLb, so that the transistor M4 is turned off. Next, a first potential higher than the low-level potential of the wiring SL is supplied from the wiring WBL to the terminal IT2. Accordingly, a current corresponding to a potential difference between the first potential and the low-level potential of the wiring SL flows between the terminal IT1 and the terminal IT2 in the variable resistance device MD. Consequently, the current flows in the layer CA of the MTJ element ME; that is, the spin current is generated in the layer CA. Depending on the spin current, the magnetization direction of the ferromagnetic body of the layer FL is determined.

When data is read from the memory cell MC, a low-level potential is supplied to the wiring WLa, so that the transistor M3 is turned off, and a high-level potential is supplied to the wiring WLb, so that the transistor M4 is turned on. Next, a second potential higher than the low-level potential of the wiring SL is supplied from the wiring RBL to the terminal OT, whereby a current flows between the terminal IT1 and the terminal OT. At this time, the electric resistance value of the MTJ element ME changes depending on whether the magnetization directions of the layer RL and the layer FL are parallel or antiparallel to each other. Accordingly, the amount of tunnel current flowing to the layer TIS of the MTJ element ME changes. That is, by measuring the amount of current flowing to the terminal IT1, data stored in the MTJ element ME can be read. Alternatively, by supplying a constant current between the wiring SL and the wiring RBL and measuring the potential of the terminal OT or the terminal IT1, data stored in the MTJ element ME can be read out.

Structure Example 5

Figure 12A:
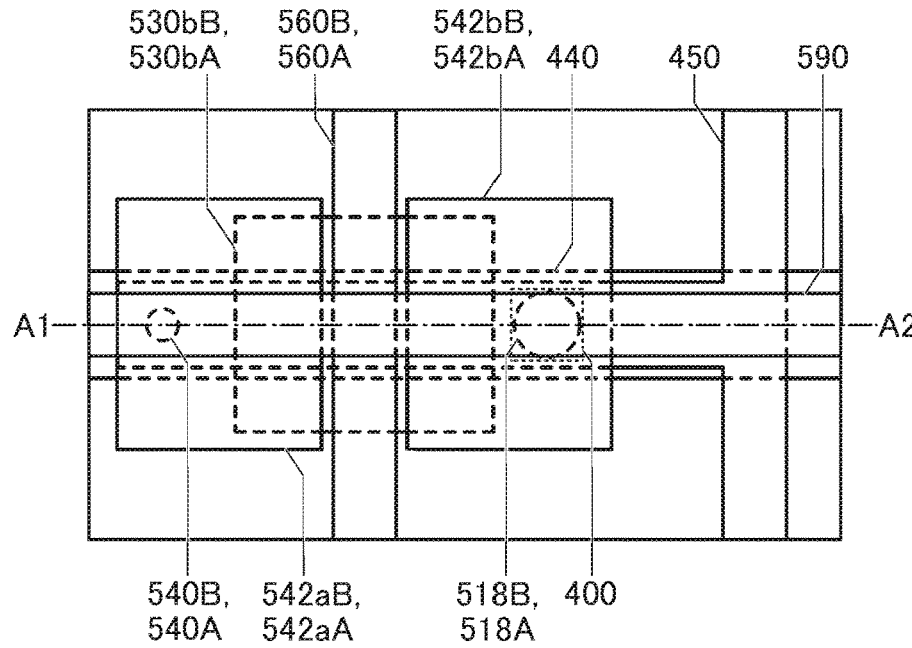
FIG. 12A is a schematic plan diagram illustrating a structure example of a memory cell.
Figure 12B:
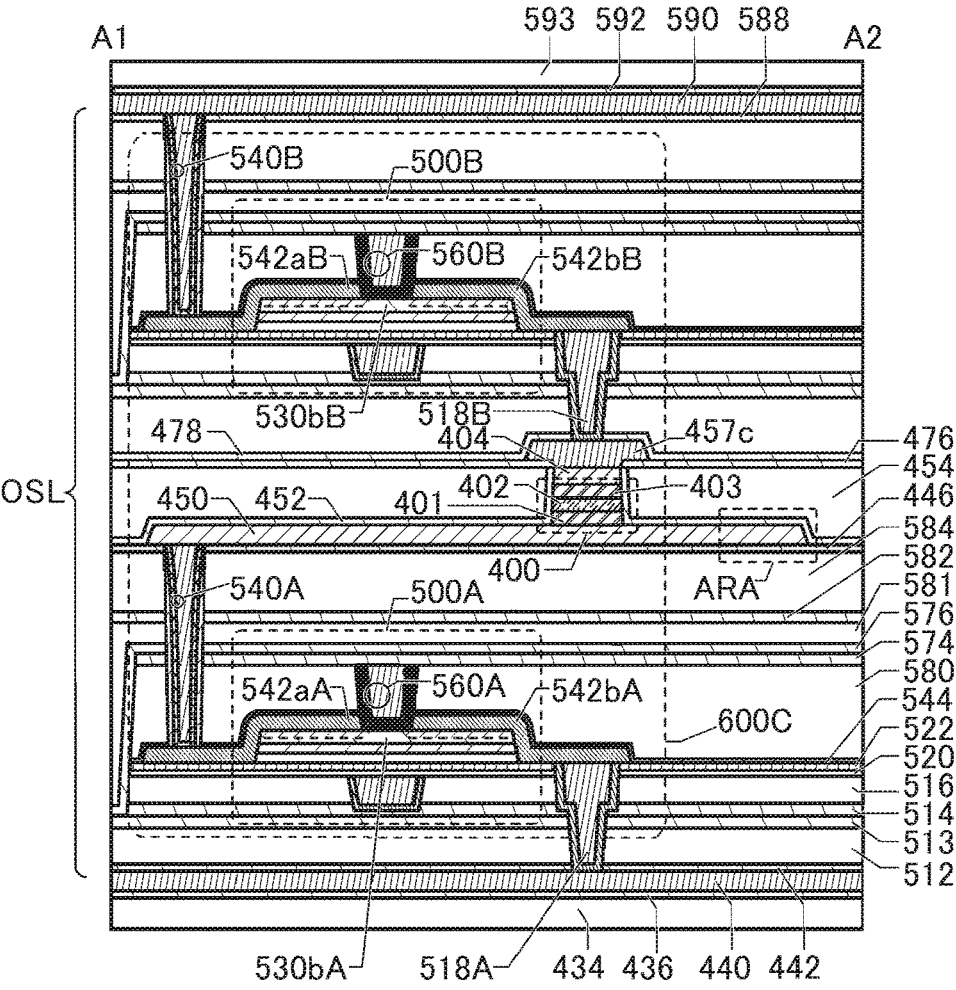
FIG. 12B is a schematic cross-sectional diagram illustrating the structure example of a memory cell.

FIG. 12A and FIG. 12B illustrate a structure example of the memory cell MC in FIG. 4C, which is the semiconductor device of one embodiment of the present invention. Specifically, FIG. 12A is a plan diagram schematically illustrating a structure example of a memory cell 600C, and FIG. 12B is a cross-sectional diagram schematically illustrating the structure example of the memory cell 600C included in the layer OSL.

Note that portions in FIG. 12A and FIG. 12B similar to those in Structure Example 1 to Structure Example 4 described above are not described in some cases.

FIG. 12B is a cross-sectional diagram along the dashed-dotted line A1-A2 shown in FIG. 12A. FIG. 12A selectively illustrates only the conductor 590, the conductor 560A, the conductor 560B, a conductor 542aA, a conductor 542aB, a conductor 542bA, a conductor 542bB, the oxide 530bA, the oxide 530bB, the memory element 400, the conductor 450, a conductor 518A, a conductor 518B, the conductor 540A, the conductor 540B, and the conductor 440.

In FIG. 12A and FIG. 12B, the memory cell 600C includes the transistor 500A, the memory element 400 positioned above the transistor 500A, and the transistor 500B positioned above the memory element 400. Note that also in this structure example, one or both of the transistor 500A and the transistor 500B are referred to as a transistor 500 in some cases.

In the structure of the memory cell 600C, specifically, the transistor 500A corresponds to the transistor M3, the transistor 500B corresponds to the transistor M4, and the memory element 400 corresponds to the variable resistance device MD. The conductor 440 corresponds to the wiring WBL, the conductor 450 corresponds to the wiring SL, and the conductor 590 corresponds to the wiring RBL. The conductor 560A corresponds to the wiring WLa, and the conductor 560B corresponds to the wiring WLb.

Below the transistor 500A, the insulator 434, the insulator 436, the conductor 440, the insulator 442, and the insulator 512 are provided in this order from the bottom to the top.

The transistor 500A includes the conductor 542aA functioning as one of a source and a drain, the conductor 542bA functioning as the other of the source and the drain, the oxide 530bA where a channel formation region is formed, and the conductor 560A functioning as a gate.

The conductor 542bA is electrically connected to the conductor 440 through the conductor 518A. The conductor 542aA is electrically connected to the conductor 450 to be described later through the conductor 540A.

For the conductor 518A, the description of the conductor 518 made in Structure Example 1 can be referred to. For the conductor 540A, the description of the conductor 540 made in Structure Example 1 can be referred to.

Above the transistor 500A, the insulator 582, the insulator 584, and the insulator 446 are provided in this order from the bottom to the top.

In addition, the conductor 450 is provided over the conductor 540A and the insulator 446. Furthermore, the memory element 400 is provided over the conductor 450. Note that in the structure of the memory element 400 in FIG. 12B, the conductor 401, the insulator 402, the conductor 403, and the conductor 404 are provided in this order from the bottom to the top.

The conductor 450 extends in the channel width directions of the transistor 500A and the transistor 500B in a region ARA illustrated in FIG. 12B (see FIG. 12A).

Over the conductor 450 and the insulator 446, the insulator 452, the insulator 454, and the insulator 476 are provided in this order from the bottom to the top. A conductor 457c is provided over the insulator 476 and the conductor 404. For the conductor 457c, the description of the conductor 457a and the conductor 457b made in Structure example 2 can be referred to. The insulator 478 is provided over the insulator 476 and the conductor 457c. For the insulator 478, the description of the insulator 478 made in Structure example 2 can be referred to.

The transistor 500B is provided above the insulator 476.

The transistor 500B includes the conductor 542aB functioning as one of a source and a drain, the conductor 542bB functioning as the other of the source and the drain, the oxide 530bB where a channel formation region is formed, and the conductor 560B functioning as a gate.

The conductor 542bB is electrically connected to the conductor 404 through the conductor 518B. The conductor 542aB is electrically connected to the conductor 590 to be described later through the conductor 540B.

For the conductor 518B, the description of the conductor 518 made in Structure Example 1 can be referred to. For the conductor 540B, the description of the conductor 540 made in Structure Example 1 can be referred to.

Above the transistor 500B, the insulator 588, the conductor 590, the insulator 592, and the insulator 593 are provided in this order from the bottom to the top.

The memory cell 600C illustrated in FIG. 12A and FIG. 12B includes a region where the conductor 440 functioning as the wiring WBL and the conductor 590 functioning as the wiring RBL overlap with each other, and a region where the conductor 560A functioning as the gate of the transistor 500A and the conductor 560B functioning as the gate of the transistor 500B overlap with each other.

When the memory cell 600C in FIG. 12A and FIG. 12B is used as the memory cell MC illustrated in FIG. 4C, the area of the memory cell included in the storage device can be reduced. This results in an increase in the storage capacity per unit area of the storage device.

Although the memory cell 600C in FIG. 12A and FIG. 12B has a structure including the region where the conductor 440 functioning as the wiring WBL and the conductor 590 functioning as the wiring RBL overlap with each other, a wiring functioning as the wiring SL may further be provided in a region overlapping with the conductor 440 and the conductor 590.

Figure 13:
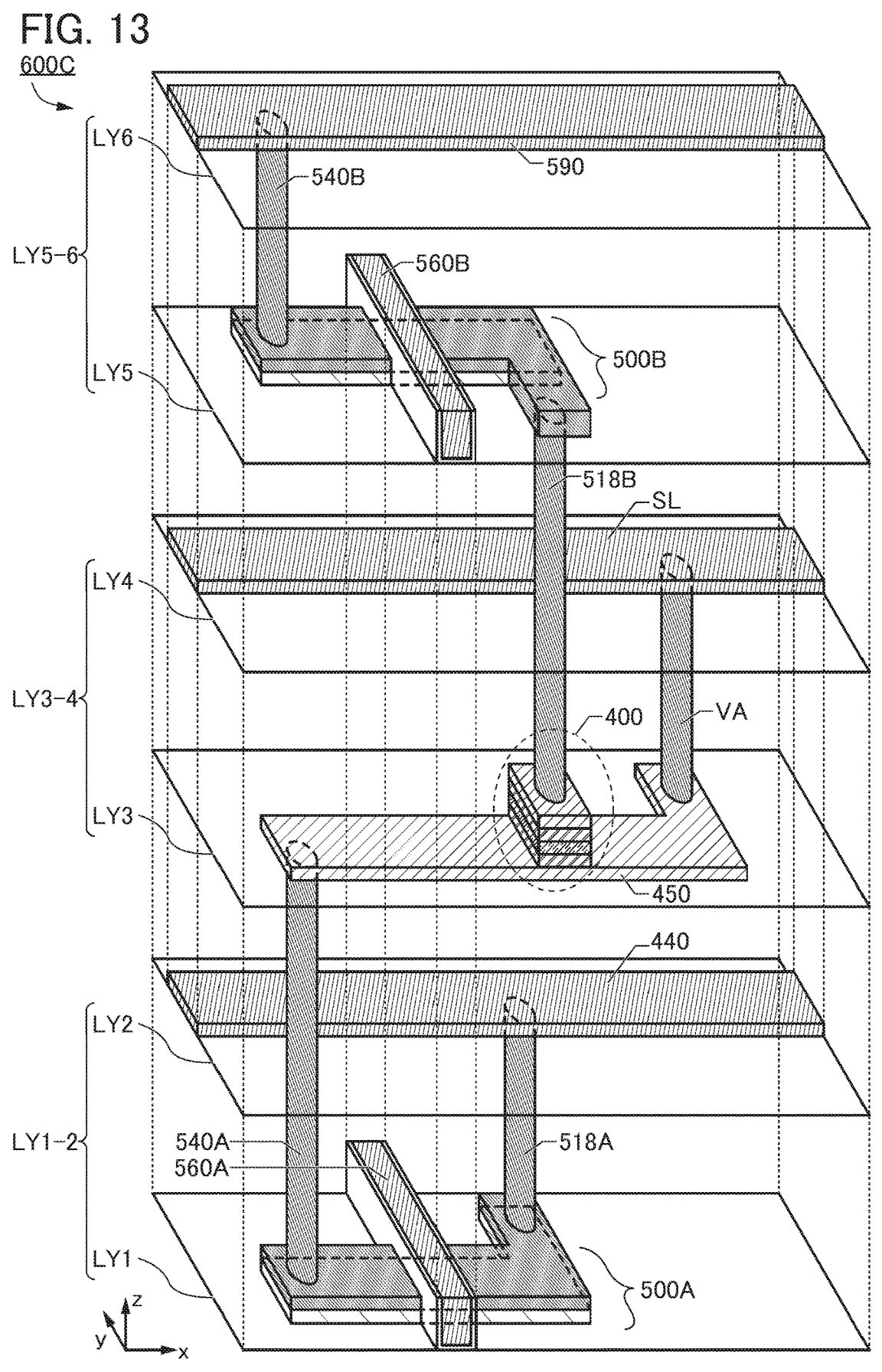

FIG. 13 illustrates a structure of a memory cell including a region where the conductor 440 functioning as the wiring WBL, the conductor 590 functioning as the wiring RBL, and the wiring SL overlap with each other, for example.

Note that since the conductor 590 is positioned above the conductor 440 and the wiring SL, the conductor 590 is not necessarily provided in a region overlapping with the conductor 440 and the wiring SL. That is, the semiconductor device of one embodiment of the present invention may have a structure where the conductor 590 is not positioned in a region overlapping with the conductor 440 and the wiring SL in the memory cell 600C illustrated in FIG. 13.

Note that the memory cell 600C illustrated in FIG. 13 has a three-dimensional structure; thus, the x direction, the y direction, and the z direction are shown by arrows. Here, the x direction, the y direction, and the z direction are shown as directions orthogonal to each other. In this specification and the like, one of the x direction, the y direction, and the z direction is referred to as a "first direction" in some cases. Another one of the directions is referred to as a "second direction" in some cases. The remaining one of the directions is referred to as a "third direction" in some cases.

The memory cell 600C in FIG. 13 includes a layer LY1 to a layer LY6, for example. In addition, in the memory cell 600C in FIG. 13, the layer LY1 to the layer LY6 are stacked in this order from the bottom. In the memory cell 600C in FIG. 13, a stack of the layer LY1 and the layer LY2 is referred to as a layer LY1-2, a stack of the layer LY3 and the layer LY4 is referred to as a layer LY3-4, and a stack of the layer LY5 and the layer LY6 is referred to as a layer LY5-6. Thus, in the memory cell 600C in FIG. 13, the layer LY1-2, the layer LY3-4, and the layer LY5-6 are stacked in this order from the bottom.

The layer LY1 includes the transistor 500A. The layer LY2 includes the conductor 440. The layer LY3 includes the conductor 450 and the memory element 400. The layer LY4 includes the wiring SL. The layer LY5 includes the transistor 500B. The layer LY6 includes the conductor 590.

Note that in the layer LY3, the memory element 400 is provided over the conductor 450, as in the memory cell 600C in FIG. 12B. As in the memory cell 600C in FIG. 12B, the conductor 401, the insulator 402, the conductor 403, and the conductor 404 (the reference numerals are not illustrated) are formed in this order from the bottom in the memory element 400.

In the memory cell 600C in FIG. 13, the conductor 440, the conductor 590, and the wiring SL, which overlap with each other, extend in the x direction.

In the memory cell 600C in FIG. 13, the transistor 500A and the transistor 500B are arranged so that the channel length directions correspond to the x direction.

Like the memory cell 600C illustrated in FIG. 12B, the memory cell 600C in FIG. 13 includes a region where the conductor 560A functioning as the gate of the transistor 500A (the wiring WLa) and the conductor 560B functioning as the gate of the transistor 500B (the wiring WLb) overlap with each other. The conductor 560A and the conductor 560B extend in the y direction.

Although not illustrated in FIG. 13, the transistor 500A and the transistor 500B in the memory cell 600C in FIG. 13 may each include the conductor 503 corresponding to a back gate.

Between vertically adjacent layers, a via hole or a plug is provided. For example, in order to electrically connect one of the source and the drain of the transistor 500A in the layer LY1 and the conductor 440 in the layer LY2, the conductor 518A functioning as a via hole or a plug is provided between the layer LY1 and the layer LY2. As another example, in order to electrically connect the other of the source and the drain of the transistor 500A in the layer LY1 and the conductor 450 in the layer LY3, the conductor 540A functioning as a via hole or a plug is provided between the layer LY1 and the layer LY3. As another example, in order to electrically connect the conductor 450 in the layer LY3 and the wiring SL in the layer LY4, a conductor VA functioning as a via hole or a plug is provided between the layer LY3 and the layer LY4. As another example, in order to electrically connect the upper portion of the memory element 400 in the layer LY3 and one of the source and the drain of the transistor 500B in the layer LY5, the conductor 518B functioning as a via hole or a plug is provided between the layer LY3 and the layer LY5. As another example, in order to electrically connect the other of the source and the drain of the transistor 500B in the layer LY5 and the conductor 590 in the layer LY6, the conductor 540B functioning as a via hole or a plug is provided between the layer LY5 and the layer LY6.

When the memory cell 600C is configured as in FIG. 13, the conductor 440 functioning as the wiring WBL, the conductor 590 functioning as the wiring RBL, and the wiring SL can overlap with each other, so that the circuit area of the memory cell included in the storage device can be reduced.

Note that the stacking order of the layer LY1 to the layer LY6 in the memory cell 600C, which is the semiconductor device of one embodiment of the present invention, is not limited to that in FIG. 13. For example, the layer LY2 may be provided below the layer LY1, the layer LY4 may be provided above the layer LY2 and below the layer LY3, and the layer LY6 may be provided above the layer LY4 and below the layer LY5 (these cases are not illustrated).

Note that the structure where the layer LY2 is provided above the layer LY3 and below the layer LY4 is inappropriate because the conductor 440 and the conductor VA intersect with each other. The structure where the layer LY2 is provided above the layer LY4 is inappropriate because the wiring SL and the conductor 518A intersect with each other. The structure where the layer LY4 is provided below the layer LY2 is inappropriate because the conductor 440 and the conductor VA intersect with each other. The structure where the layer LY4 is provided above the layer LY5 and below the layer LY6 is also inappropriate because the wiring SL and the conductor 540B intersect with each other. The structure where the layer LY4 is provided above the layer LY6 is also inappropriate because the conductor 590 and the conductor VA intersect with each other. The structure where the layer LY6 is provided below the layer LY4 is also inappropriate because the wiring SL and the conductor 540B intersect with each other.

In view of the above, in the layer LY1-2 of the memory cell 600C in FIG. 13, the layer LY1 can be positioned below or above the layer LY2. In the layer LY3-4 of the memory cell 600C in FIG. 13, the layer LY3 can be positioned above or below the layer LY4. In the layer LY5-6 of the memory cell 600C in FIG. 13, the layer LY5 can be positioned above or below the layer LY6.

The transistor 500A and the transistor 500B are not limited to OS transistors, and another transistor may be used. In particular, in the case where the memory cell 600C is formed over a semiconductor substrate, when the layer LY1 is positioned below the layer LY2 in the memory cell 600C in FIG. 13, the transistor 500A can be a transistor formed over the semiconductor substrate. For example, when a semiconductor substrate containing silicon as a material is used, the transistor 500A can be a transistor containing silicon in a channel formation region (a Si transistor).

The structures of the transistor 500A and the transistor 500B of the memory cell 600C, which is the semiconductor device of one embodiment of the present invention, are not limited to those in FIG. 13. The structures of the transistor 500A and the transistor 500B of the memory cell 600C, which is the semiconductor device of one embodiment of the present invention, may be changed as appropriate.

Figure 14:
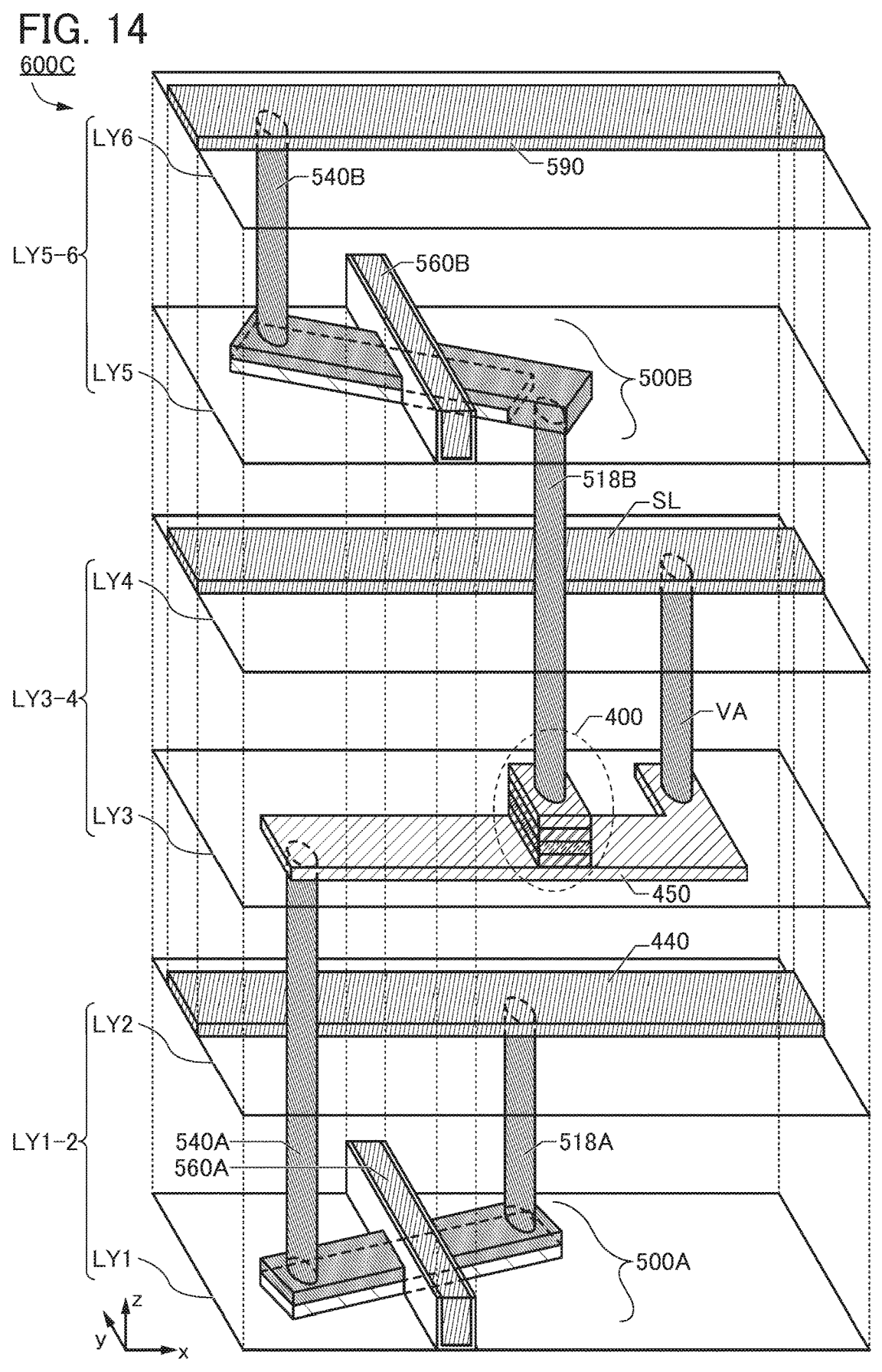

For example, the channel length directions of the transistor 500A and the transistor 500B do not necessarily correspond to the X direction. For example, as illustrated in FIG. 14, in the layer LY1, the transistor 500A may be provided with the linear direction passing through the conductor 540A and the conductor 518A regarded as the channel length direction of the transistor 500A. Alternatively, as illustrated in FIG. 14, in the layer LY5, the transistor 500B may be provided with the linear direction passing through the conductor 540B and the conductor 518B regarded as the channel length direction of the transistor 500B, for example.

Structure Example 3 of Memory Cell

Figure 4D:
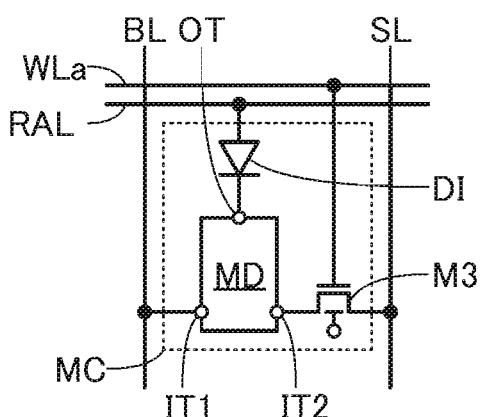

FIG. 4D illustrates an example of a memory cell that can be provided in the storage device, which is different from the examples in FIG. 4A to FIG. 4C. Note that the memory cell MC illustrated in FIG. 4D is also an example of an SOT-MRAM like the memory cell MC illustrated in FIG. 4A.

The memory cell MC in FIG. 4D includes the transistor M3, the variable resistance device MD, and a diode DI, for example.

For the transistor M3 and the variable resistance device MD, the description of the transistor M3 and the variable resistance device MD in FIG. 4A can be referred to.

The diode DI has a rectifying function. As the diode DI, a semiconductor diode, a constant voltage diode, a tunnel diode, or a Schottky barrier diode can be used, for example.

The first terminal of the transistor M3 is electrically connected to the terminal IT2 of the variable resistance device MD, the second terminal of the transistor M3 is electrically connected to the wiring SL, and the gate of the transistor M3 is electrically connected to the wiring WLa. A cathode of the diode DI is electrically connected to the terminal OT of the variable resistance device MD, and an anode of the diode DI is electrically connected to a wiring RAL. The terminal IT1 of the variable resistance device MD is electrically connected to the wiring BL.

The wiring RAL functions as a read bit line for the memory cell MC, for example. Specifically, for example, a low-level potential is supplied to the wiring RAL at the time of writing data to the memory cell MC, or a high-level potential is supplied to the wiring RAL at the time of reading data from the memory cell MC.

Here, examples of a method for writing data and a method for reading data in/from the memory cell MC in FIG. 4D are described. Note that, for example, a low-level potential is supplied to the wiring SL.

When data is written to the memory cell MC, a high-level potential is supplied to the wiring WLa, so that the transistor M3 is turned on. A low-level potential is supplied to the wiring RAL. At this time, it is preferable that no current flow through the diode DI; thus, the low-level potential is preferably equal to the potential of the terminal IT1 or the potential of the terminal IT2, further preferably lower than the potential of the terminal IT1 or the potential of the terminal IT2.

Next, a third potential higher than the low-level potential supplied to the wiring SL is supplied from the wiring BL to the terminal IT1. Accordingly, current corresponding to a potential difference between the third potential and the low-level potential of the wiring SL flows between the terminal IT1 and the terminal IT2 in the variable resistance device MD. Consequently, the current flows in the layer CA of the MTJ element ME; that is, the spin current is generated in the layer CA. Depending on the spin current, the magnetization direction of the ferromagnetic body of the layer FL is determined.

When data is read from the memory cell MC, a low-level potential is supplied to the wiring WLa, so that the transistor M3 is turned off. In addition, a high-level potential is supplied to the wiring RAL. Next, a fourth potential lower than the high-level potential supplied to the wiring RAL is supplied from the wiring BL to the terminal IT1, whereby a current flows between the terminal IT1 and the terminal OT. At this time, the electric resistance value of the MTJ element ME changes depending on whether the magnetization directions of the layer RL and the layer FL are parallel or antiparallel to each other. Accordingly, the amount of tunnel current flowing in the layer TIS of the MTJ element ME changes. That is, by measuring the amount of current flowing between the MTJ element ME and the terminal IT1, data stored in the MTJ element ME can be read out. Alternatively, by supplying a predetermined potential to the wiring SL to make a constant current flow into the terminal IT1 of the MTJ element ME from the wiring BL and measuring the potential of the terminal IT1, data stored in the MTJ element ME can be read out.

Structure Example 6

Figure 15A:
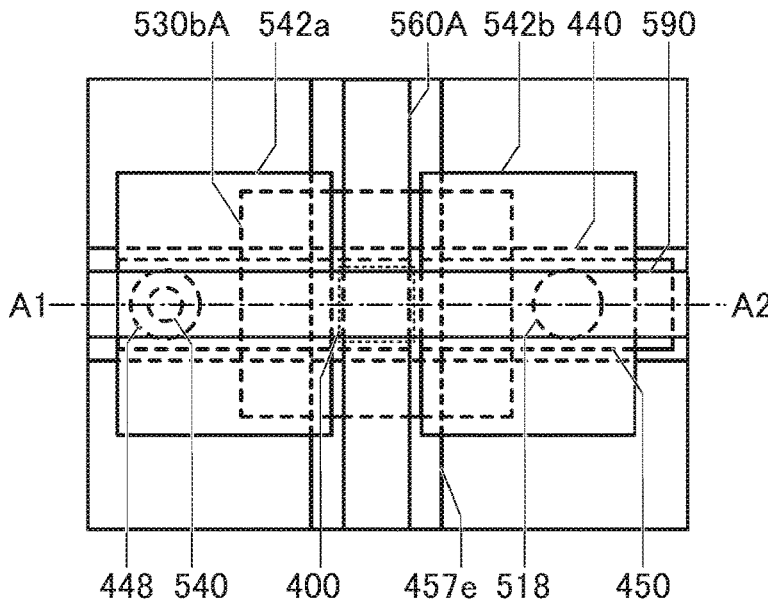
FIG. 15A is a schematic plan diagram illustrating a structure example of a memory cell.
Figure 15B:
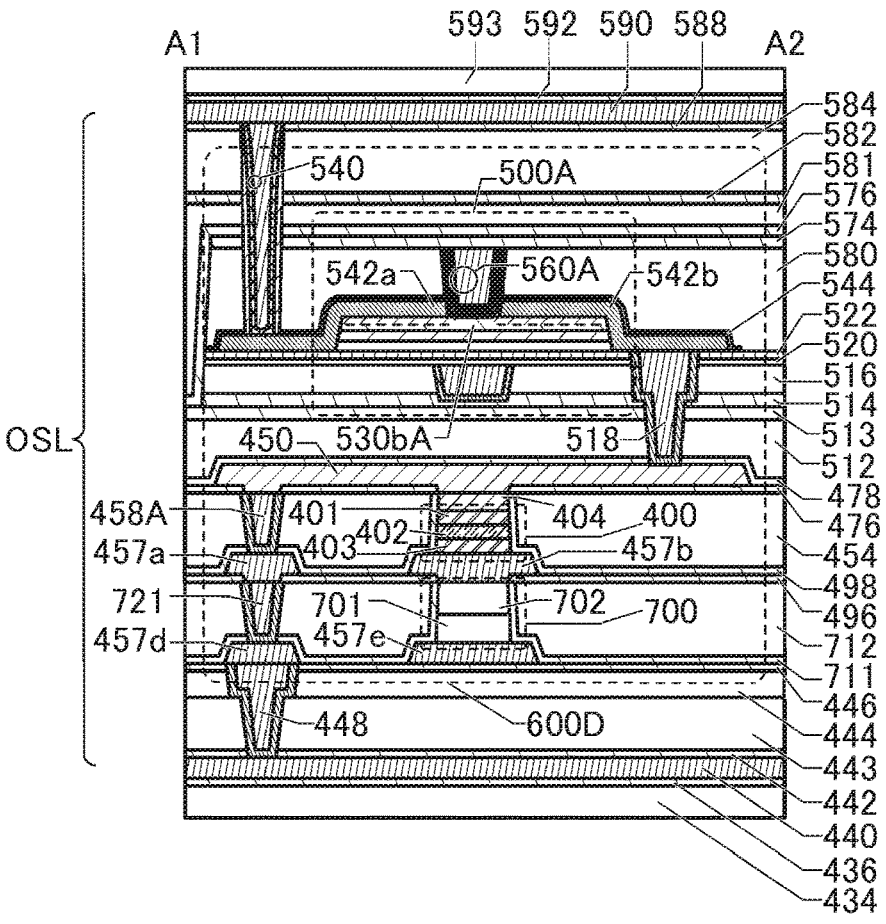
FIG. 15B is a schematic cross-sectional diagram illustrating the structure example of a memory cell.

FIG. 15A and FIG. 15B illustrate a structure example of the memory cell MC in FIG. 4D, which is the semiconductor device of one embodiment of the present invention. Specifically, FIG. 15A is a plan diagram schematically illustrating a structure example of a memory cell 600D, and FIG. 15B is a cross-sectional diagram schematically illustrating the structure example of the memory cell 600D included in the layer OSL.

Note that portions in FIG. 15A and FIG. 15B similar to those in Structure Example 1 to Structure Example 5 described above are not described in some cases.

FIG. 15B is a cross-sectional diagram along the dashed-dotted line A1-A2 shown in FIG. 15A. FIG. 15A selectively illustrates the conductor 590, the conductor 440, the conductor 560A, the conductor 542a, the conductor 542b, the oxide 530bA, a conductor 457e, the memory element 400, the conductor 450, the conductor 448, the conductor 540, and the conductor 518.

In FIG. 15A and FIG. 15B, the memory cell 600D includes a diode 700, the memory element 400 positioned above the diode 700, and the transistor 500A positioned above the memory element 400.

In the structure of the memory cell 600D, specifically, the transistor 500A corresponds to the transistor M3, the diode 700 corresponds to the diode DI, and the memory element 400 corresponds to the variable resistance device MD. The conductor 440 corresponds to the wiring BL, the conductor 590 corresponds to the wiring SL, and the conductor 457e corresponds to the wiring RAL. The conductor 560A corresponds to the wiring WLa.

Below the memory cell 600D, the insulator 434, the insulator 436, the conductor 440, the insulator 442, the insulator 443, the insulator 444, and the insulator 446 are provided in this order from the bottom to the top.

Furthermore, the conductor 448 is embedded in the insulator 442, the insulator 443, the insulator 444, and the insulator 446.

A conductor 457d is provided over the insulator 446 and the conductor 448. The conductor 457e is provided over the insulator 446. For the conductor 457d and the conductor 457e, the description of the conductor 457a and the conductor 457b made in Structure example 2 can be referred to.

The diode 700 is provided over the conductor 457e. The structure of the diode 700 can be, for example, a stack of a semiconductor 701 that is a p-type semiconductor and a semiconductor 702 that is an n-type semiconductor. In that case, the diode 700 is referred to as a pn junction diode in some cases. The diode 700 may be a Schottky barrier diode in which the semiconductor 701 is changed into a metal material, for example.

An insulator 711 and an insulator 712 are provided over the insulator 446, the conductor 457d, and the conductor 457e. Note that the insulator 711 can be formed through steps similar to those for the insulator 452 described in Structure Example 1, for example. Thus, the insulator 711 can be formed using any of the materials usable for the insulator 452. The insulator 712 can be formed through steps similar to those for the insulator 454 described in Structure Example 1, for example. Thus, the insulator 712 can be formed using any of the materials usable for the insulator 454.

Furthermore, a conductor 721 is embedded in the insulator 711 and the insulator 712. For the conductor 721, the description of the conductor 458A made in Structure example 2 can be referred to.

An insulator 496 is provided over the insulator 711 and the insulator 712. Note that the insulator 496 can be formed through steps similar to those for the insulator 476 described in Structure example 2. Thus, the insulator 496 can be formed using any of the materials usable for the insulator 476, for example.

The conductor 457a is provided over the insulator 496 and the conductor 721. The conductor 457b is provided over the insulator 496 and the semiconductor 702.

The memory element 400 is provided over the conductor 457b. In the memory element 400, over the conductor 457b, the conductor 403, the insulator 402, the conductor 401, and the conductor 404 are stacked in this order from the bottom to the top, for example.

An insulator 498 and the insulator 454 are provided over the conductor 457a, the conductor 457b, and the insulator 496.

Furthermore, the conductor 458A is embedded in the insulator 498 and the insulator 454.

The insulator 476 is provided over the insulator 454. An opening portion is provided in a region of the insulator 476 overlapping with the conductor 458A and the conductor 401. Furthermore, the conductor 450 is provided over the insulator 476, and the conductor 458A and the conductor 401 that are under the bottom surfaces of the opening portions in the insulator 476. Accordingly, the conductor 450 is electrically connected to the conductor 458A and the conductor 401. Like the conductor 450 in FIG. 1A and FIG. 1B, the conductor 450 preferably contains a metal material that causes a spin Hall effect. Thus, the conductor 450 can be formed using any of the materials usable for the layer CA illustrated in FIG. 5, for example.

The transistor 500A is provided above the conductor 450.

The transistor 500A includes the conductor 542a functioning as one of the source and the drain, the conductor 542b functioning as the other of the source and the drain, the oxide 530bA where the channel formation region is formed, and the conductor 560A functioning as the gate.

The conductor 542b is electrically connected to the conductor 450 through the conductor 518. The conductor 542a is electrically connected to the conductor 590 to be described later through the conductor 540.

Above the transistor 500A, the insulator 588, the conductor 590, the insulator 592, and the insulator 593 are provided in this order from the bottom to the top.

The memory cell 600D illustrated in FIG. 15A and FIG. 15B includes a region where the conductor 440 functioning as the wiring BL and the conductor 590 functioning as the wiring SL overlap with each other, and a region where the conductor 560A functioning as the gate of the transistor 500A and the conductor 457e functioning as the wiring RAL overlap with each other.

When the memory cell 600D in FIG. 15A and FIG. 15B is used as the memory cell MC illustrated in FIG. 4D, the area of the memory cell included in the storage device can be reduced. This results in an increase in the storage capacity per unit area of the storage device.

Although the memory cell 600D in FIG. 15A and FIG. 15B has a structure where the memory element 400 and the diode 700 are provided below the conductor 450, the memory element 400 and the diode 700 may be provided between the conductor 450 and the transistor 500A. Specifically, as in the memory cell 600D illustrated in FIG. 16A, for example, the memory element 400 may be formed over the conductor 450 after formation of the conductor 450, and the diode 700 may be formed over the memory element 400 with the conductor 457b therebetween. In that case, the conductor 457e functioning as the wiring RAL is formed over the diode 700.

Figure 16A:
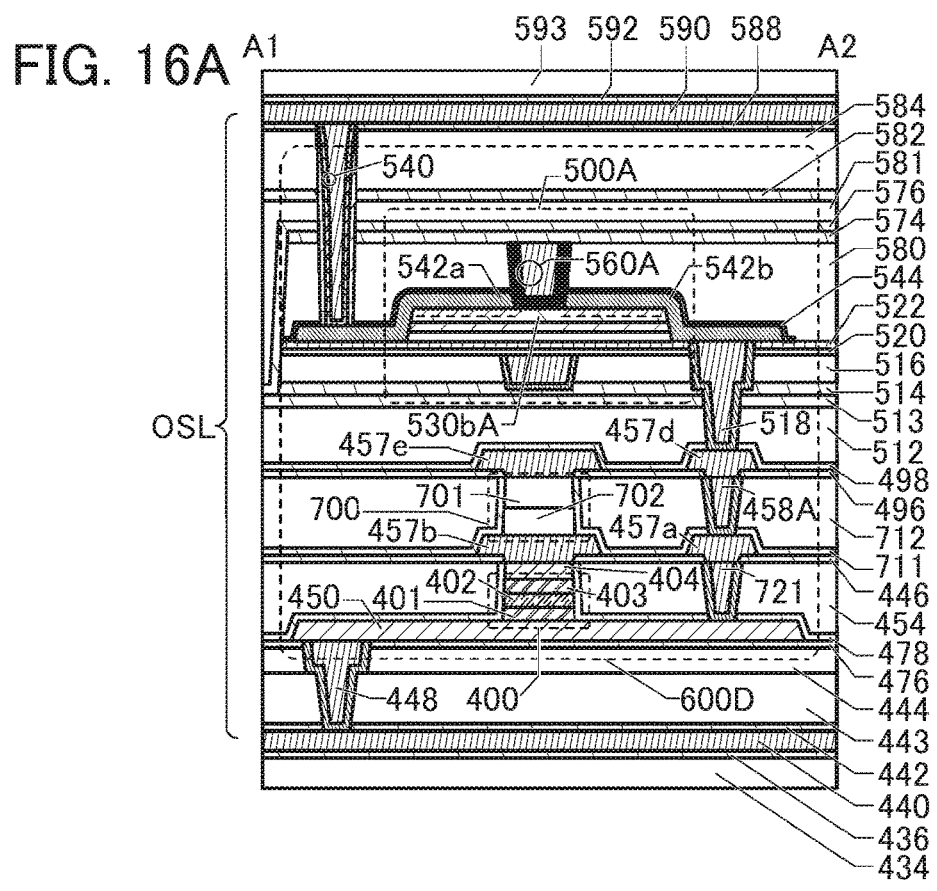
FIG. 16A and FIG. 16B are schematic cross-sectional diagrams illustrating structure examples of a memory cell.
Figure 16B:
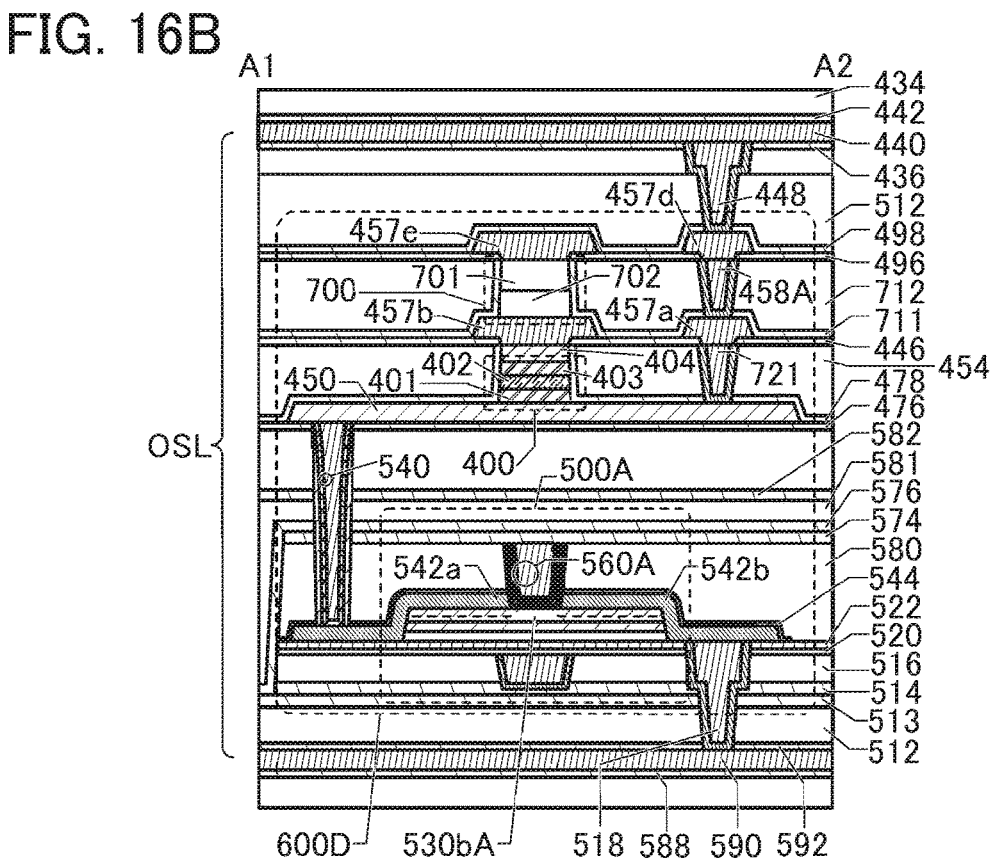

The memory element 400 in FIG. 16A is different from the memory element 400 in FIG. 15A and FIG. 15B in that the stacking order of the conductor 401, the insulator 402, and the conductor 403 is reversed. Similarly, the diode 700 in FIG. 16A is different from the diode 700 in FIG. 15A and FIG. 15B in that the stacking order of the semiconductor 701 and the semiconductor 702 is reversed.

Although the memory cell 600D in FIG. 15A to FIG. 16A has a structure where the conductor 590 is provided above the conductor 440, the conductor 440 may be provided above the conductor 590. Specifically, as in the memory cell 600D illustrated in FIG. 16B, for example, the transistor 500A, the memory element 400, the diode 700, and the conductor 440 may be provided in this order after formation of the conductor 590.

When the memory cell 600D selected from FIG. 15A, FIG. 15B, FIG. 16A, and FIG. 16B is used as the memory cell MC illustrated in FIG. 4D, the area of the memory cell included in the storage device can be reduced. This results in an increase in the storage capacity per unit area of the storage device.

The memory cell 600A to the memory cell 600D described above retain data by the MTJ element, and thus can reduce power needed for retaining data, unlike a DRAM and an SRAM. Thus, with the memory cell including the MTJ element, a semiconductor device with low power consumption can be formed.

Note that the insulators, the conductors, the semiconductors, and the like disclosed in this specification and the like can be formed by a PVD (Physical Vapor Deposition) method or a CVD method. Examples of a PVD method include a sputtering method, a resistance heating evaporation method, an electron beam evaporation method, and a PLD (Pulsed Laser Deposition) method. Examples of the CVD method include a plasma CVD method and a thermal CVD method. In particular, examples of a thermal CVD method include a MOCVD (Metal Organic Chemical Vapor Deposition) method and an ALD (Atomic Layer Deposition) method.

A thermal CVD method, which is a deposition method not using plasma, has an advantage that a defect due to plasma damage is not generated.

Deposition by a thermal CVD method may be performed in the following manner: a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in the following manner: pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to form a first thin layer, and then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust the thickness and is thus suitable for fabricating a minute FET.

A variety of films such as the metal film, the semiconductor film, and the inorganic insulating film disclosed in the above-described embodiments can be formed by a thermal CVD method such as an MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus utilizing an ALD method, two kinds of gases, ozone ($O_3$) as an oxidizer and a source gas which is obtained by vaporizing liquid containing a solvent and a hafnium precursor compound (e.g., hafnium alkoxide or hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed with a deposition apparatus utilizing an ALD method, two kinds of gases, $H_2O$ as an oxidizer and a source gas which is obtained by vaporizing liquid containing a solvent and an aluminum precursor compound (e.g., trimethylaluminum (TMA, $Al(CH_3)_3$)), are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus utilizing an ALD method, hexachlorodisilane is adsorbed on a surface on which a film is to be formed, and radicals of an oxidizing gas (e.g., $O_2$ or dinitrogen monoxide) are supplied to react with the adsorbate.

For example, in the case where a tungsten film is formed with a deposition apparatus utilizing an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that a $SiH_4$ gas may be used instead of a $B_2H_6$ gas.

In the case where an In—Ga—Zn—O film is formed as an oxide semiconductor film with a deposition apparatus using an ALD method, a precursor (generally referred to as a metal precursor or the like in some cases) and an oxidizer (generally referred to as a reactant, a non-metal precursor, or the like in some cases) are sequentially and repetitively introduced. Specifically, for example, an $In(CH_3)_3$ gas as a precursor and an $O_3$ gas as an oxidizer are introduced to form an In—O layer; a $Ga(CH_3)_3$ gas as a precursor and an $O_3$ gas as an oxidizer are introduced to form a GaO layer; and then, a $Zn(CH_3)_2$ gas as a precursor and an $O_3$ gas as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas, it is preferable to use an $O_3$ gas which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used. Note that this embodiment can be combined with any of the other embodiments in this specification as appropriate.

Embodiment 2

In this embodiment, a structure example of a storage device that can use the above-described memory cell will be described.

Structure Example of Storage Device

Figure 17:
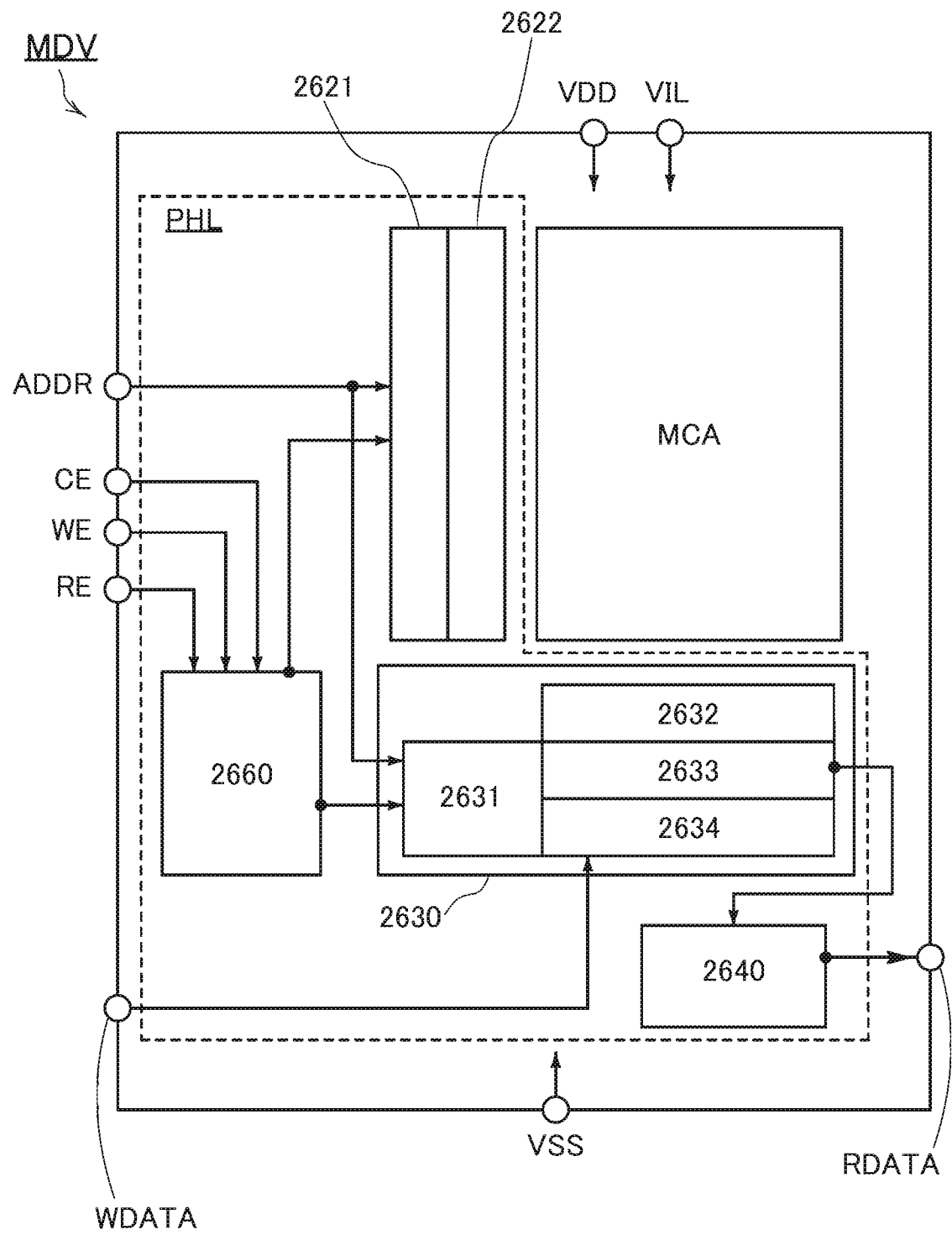
FIG. 17 is a block diagram illustrating a structure example of a storage device.

FIG. 17 illustrates a structure example of a storage device of one embodiment of the present invention. A storage device MDV includes a peripheral circuit PHL and a memory cell array MCA. The peripheral circuit PHL includes a row decoder 2621, a word line driver circuit 2622, a bit line driver circuit 2630, an output circuit 2640, and a control logic circuit 2660.

The bit line driver circuit 2630 includes a column decoder 2631, a precharge circuit 2632, a sense amplifier 2633, and a write circuit 2634. The precharge circuit 2632 has a function of precharging a wiring (not illustrated in FIG. 17) electrically connected to memory cells MC described later to have a predetermined potential. The sense amplifier 2633 has a function of obtaining a potential (or current) read from the memory cells MC as a data signal and amplifying the data signal. The amplified data signal is output to the outside of the storage device MDV as a digital data signal RDATA through the output circuit 2640.

As power supply voltages, a low power supply voltage (VSS), a high power supply voltage (VDD) for the peripheral circuit PHL, and a power supply voltage (VIL) for the memory cell array MCA are supplied to the storage device MDV from the outside.

Control signals (CE, WE, RE), an address signal ADDR, and a data signal WDATA are input to the storage device MDV from the outside. The address signal ADDR is input to the row decoder 2621 and the column decoder 2631, and the data signal WDATA is input to the write circuit 2634.

The control logic circuit 2660 processes the signals (CE, WE, and RE) input from the outside, and generates control signals for the row decoder 2621 and the column decoder 2631. CE is a chip enable signal, WE is a write enable signal, and RE is a read enable signal. Signals processed by the control logic circuit 2660 are not limited to those listed above, and other control signals may be input as necessary.

Note that whether each circuit or each signal described above is provided or not can be appropriately determined as needed.

Note that the structure example of this embodiment is not limited to the structure illustrated in FIG. 17. For example, the structure may be changed as appropriate, such that the whole or part of the peripheral circuit PHL is provided under the memory cell array MCA.

Figure 18A:
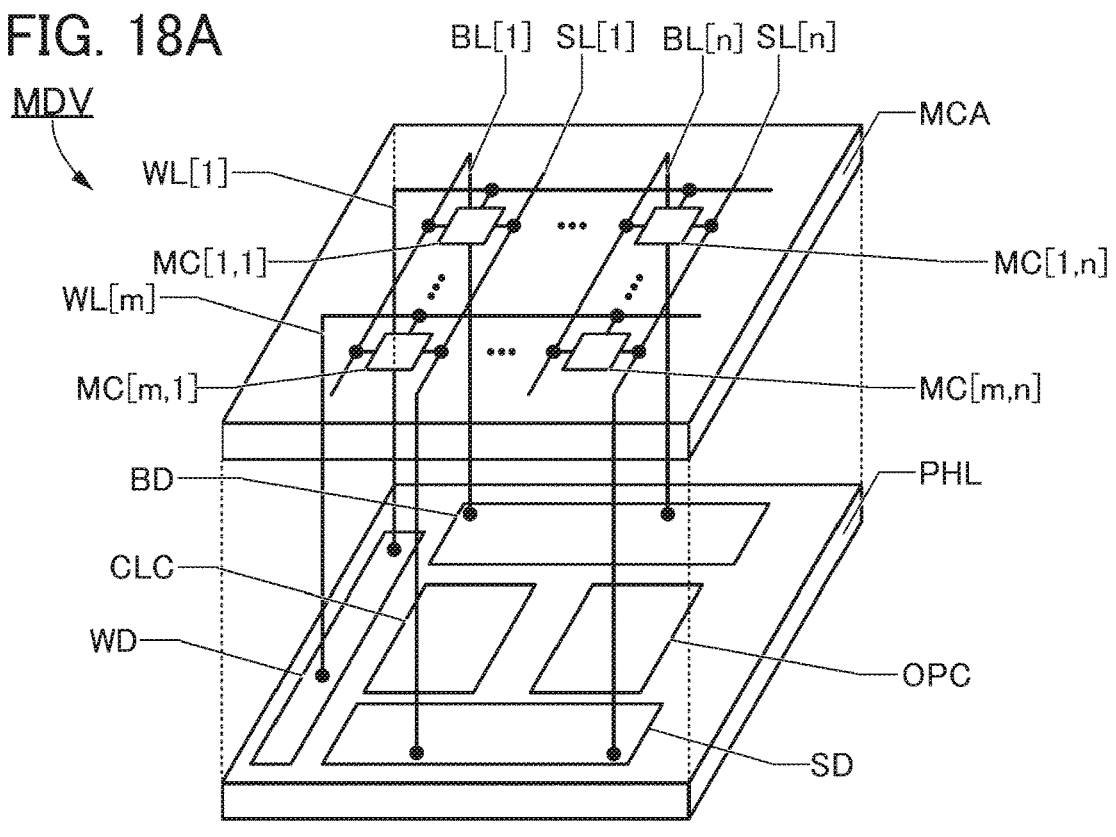
FIG. 18A and FIG. 18B are block diagrams illustrating structure examples of a storage device.

Specifically, the storage device MDV may have a structure as illustrated in FIG. 18A where the peripheral circuit PHL is provided as a lower layer and the memory cell array MCA is provided above the peripheral circuit PHL, for example.

In the example of the storage device MDV in FIG. 18A, the memory cell array MCA includes m×n memory cells MC. In the memory cell array MCA, the memory cells MC are arranged in a matrix of m rows and n columns. FIG. 18A selectively illustrates a memory cell MC[1,1], a memory cell MC[m,1], a memory cell MC[1,n], and a memory cell MC[m,n] among the plurality of memory cells MC.

Furthermore, in the storage device MDV in FIG. 18A, the peripheral circuit PHL includes a circuit WD, a circuit BD, a circuit SD, a circuit CLC, and a circuit OPC. The peripheral circuit PHL does not necessarily have a structure including all of the circuit WD, the circuit BD, the circuit SD, the circuit CLC, and the circuit OPC and may have a structure including one or more selected from the circuit WD, the circuit BD, the circuit SD, the circuit CLC, and the circuit OPC.

The circuit WD can be used as a circuit corresponding to the word line driver circuit 2622 in FIG. 17, for example. The circuit WD is electrically connected to a wiring WL[1] to a wiring WL[m], for example. The circuit WD has a function of transmitting a selection signal to the plurality of memory cells MC included in the memory cell array MCA through the wiring WL[1] to the wiring WL[m].

Although FIG. 18A illustrates an example where the wiring WL[1] to the wiring WL[m] are provided for respective rows of the memory cell array MCA, a plurality of wirings may be provided for one row of the memory cell array MCA.

The circuit BD can be used for a circuit corresponding to the bit line driver circuit 2630 illustrated in FIG. 17, for example. The circuit BD is, for example, electrically connected to a wiring BL[1] to a wiring BL[n]. The circuit BD functions as a circuit for transmitting a write signal to the memory cells MC included in the memory cell array MCA through the wiring BL[1] to the wiring BL[n]. Moreover, the circuit BD functions as a circuit for supplying a predetermined voltage or current in reading data to the memory cells MC included in the memory cell array MCA through the wiring BL[1] to the wiring BL[n].

Although FIG. 18A illustrates an example where the wiring BL[1] to the wiring BL[n] are provided for respective columns of the memory cell array MCA, a plurality of wirings may be provided for one column of the memory cell array MCA. For example, a wiring transmitting a write signal and a wiring transmitting a read signal may be provided for one column of the memory cell array MCA.

The circuit SD can be used as a voltage generation circuit for supplying a predetermined voltage to the plurality of memory cells MC of the memory cell array MCA, for example. Furthermore, the circuit SD is electrically connected to a wiring SL[1] to a wiring SL[n], for example. Note that the storage device MDV in FIG. 18A may have a structure where the circuit SD is not provided and a power supply voltage (VIL) for the memory cell array MCA illustrated in FIG. 17 is directly input thereto.

Although FIG. 18A illustrates an example where the wiring SL[1] to the wiring SL[n] are provided for respective rows of the memory cell array MCA, a plurality of wirings may be provided for one row of the memory cell array MCA.

The circuit CLC can be used as a circuit corresponding to the control logic circuit 2660 illustrated in FIG. 17, for example.

The circuit OPC can be used as a circuit corresponding to the output circuit 2640 illustrated in FIG. 17, for example.

In the structure example of the storage device MDV in FIG. 18A, the peripheral circuit PHL can be formed over a semiconductor substrate, for example. In other words, the circuit WD, the circuit BD, the circuit SD, the circuit OPC, and the circuit CLC can be formed over a semiconductor substrate. The semiconductor substrate is, for example, a substrate containing silicon as its material, in which case a transistor containing silicon in a channel formation region (such a transistor is hereinafter called a Si transistor) can be formed on the substrate. Thus, a Si transistor can be used as a transistor included in the peripheral circuit PHL.

The semiconductor substrate may be a substrate containing germanium as its material, for example. The peripheral circuit PHL may be formed over a compound semiconductor substrate containing silicon carbide, silicon germanium, gallium arsenide, indium phosphide, zinc oxide, gallium oxide, or the like as its material. Furthermore, the peripheral circuit PHL may be formed over a semiconductor substrate in which an insulator region is included, e.g., an SOI (Silicon On Insulator) substrate.

Moreover, the peripheral circuit PHL can be formed over an insulator substrate, for example. Examples of the insulator substrate include a glass substrate, a quartz substrate, a sapphire substrate, a stabilized zirconia substrate (e.g., an yttria-stabilized zirconia substrate), and a resin substrate. Furthermore, the peripheral circuit PHL can be formed over a conductor substrate. Examples of the conductor substrate include a graphite substrate, a metal substrate, an alloy substrate, and a conductive resin substrate. Note that in the case of the insulator substrate and the conductor substrate, a channel formation region cannot be formed in the substrate, which is different from the case of a semiconductor substrate; that is, a transistor cannot be formed directly on an insulator substrate or a conductor substrate. Accordingly, in order to provide a transistor for the insulator substrate or the conductor substrate, it is necessary to provide a semiconductor film additionally over the insulator substrate or the conductor substrate.

As a method for providing the memory cell array MCA above the peripheral circuit PHL in the structure example of the storage device MDV in FIG. 18A, a formation method with a semiconductor process can be given. In particular, when an OS transistor, which can be formed through a semiconductor process, is employed as a transistor included in the memory cell array MCA, the memory cell array MCA can be provided above the semiconductor substrate and the peripheral circuit PHL.

Figure 19:
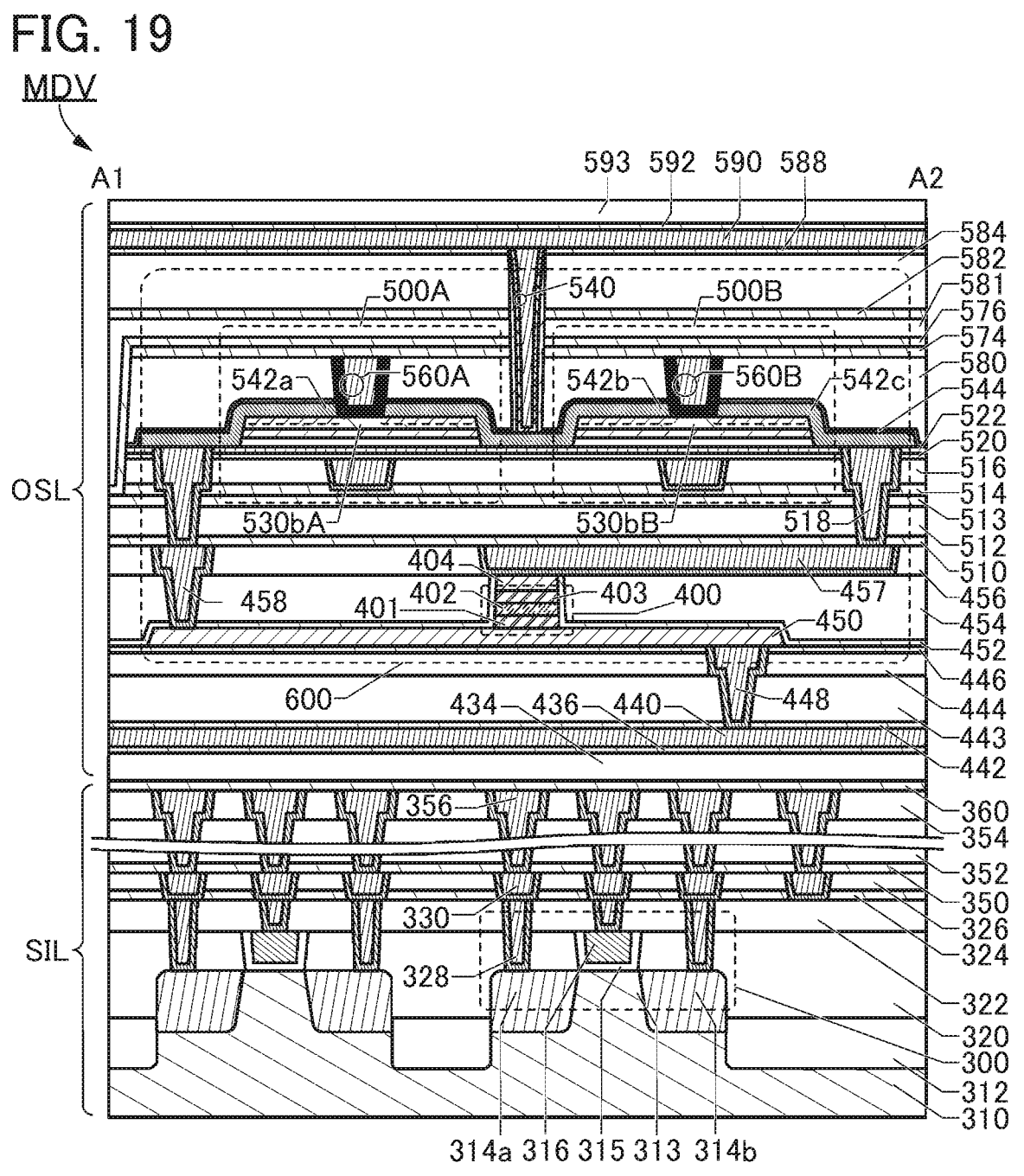

Here, a structure example of the storage device MDV of the case where the peripheral circuit PHL is formed over a semiconductor substrate is described. FIG. 19 is a cross-sectional diagram schematically illustrating a structure example of the storage device MDV in FIG. 18A including the memory cell MC in FIG. 4A. Specifically, the storage device MDV illustrated in FIG. 19 includes a layer SIL and the layer OSL provided above the layer SIL. The layer OSL includes, for example, the above-described memory cell array MCA. The memory cell 600 illustrated in FIG. 19 corresponds to one or more selected from the memory cell MC[1,1] to the memory cell MC[m,n] in FIG. 18A.

The layer SIL illustrated in FIG. 19 includes a semiconductor substrate and the peripheral circuit PHL formed over the semiconductor substrate. The peripheral circuit PHL includes, for example, the circuit WD, the circuit BD, the circuit SD, the circuit CLC, and the circuit OPC as in the structure of the storage device MDV in FIG. 18A. Thus, a transistor 300 can be a transistor included in the circuit WD, the circuit BD, the circuit SD, the circuit CLC, or the circuit OPC.

The transistor 300 includes a conductor 316, an element isolation layer 312, an insulator 315, a semiconductor region 313 that is part of a substrate 310, and a low-resistance region 314*a* and a low-resistance region 314*b* functioning as a source region and a drain region.

As the substrate 310, for example, a semiconductor substrate can be used. As described above, examples of the semiconductor substrate include a substrate containing silicon as its material and a substrate containing germanium as its material. Alternatively, a compound semiconductor substrate can be used as the substrate 310, for example. As described above, examples of the compound semiconductor substrate include a substrate containing silicon carbide, silicon germanium, gallium arsenide, indium phosphide, zinc oxide, or gallium oxide as its material.

Figure 20:
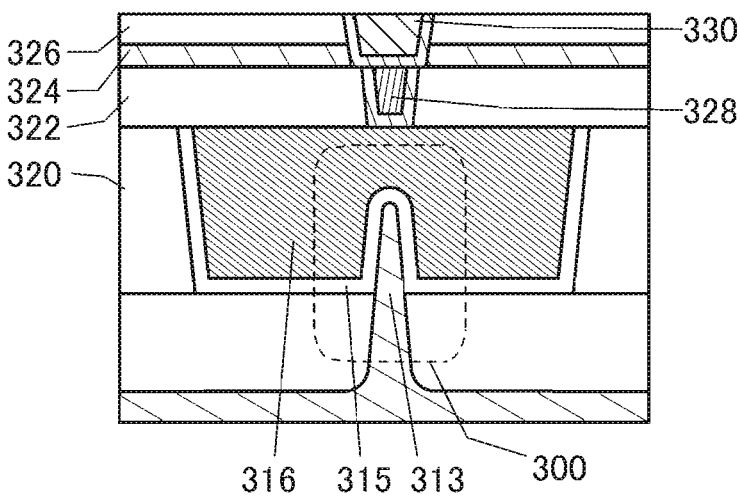
FIG. 20 is a schematic cross-sectional diagram illustrating a structure example of a transistor.

In the transistor 300, the top surface and the side surface in the channel width direction of the semiconductor region 313 are covered with the conductor 316 with the insulator 315 therebetween, as illustrated in FIG. 20. Such a Fin-type transistor 300 can have an increased effective channel width, and thus the transistor 300 can have improved on-state characteristics. In addition, contribution of the electric field of the gate electrode can be increased, so that the off-state characteristics of the transistor 300 can be improved.

Note that the transistor 300 may be either a p-channel transistor or an n-channel transistor.

A region of the semiconductor region 313 where a channel is formed, a region in the vicinity thereof, and the low-resistance region 314*a* and the low-resistance region 314*b* functioning as the source region and the drain region preferably contain a silicon-based semiconductor, specifically, preferably contain single crystal silicon. Each of the above regions may be formed using a material containing germanium (Ge), silicon germanium (SiGe), gallium arsenide (GaAs), gallium aluminum arsenide (GaAlAs), gallium nitride (GaN), or the like. Alternatively, a structure using silicon whose effective mass is controlled by applying stress to the crystal lattice and changing the lattice spacing may be employed. Alternatively, the transistor 300 may be a HEMT (High Electron Mobility Transistor) using gallium arsenide and aluminum gallium arsenide.

The low-resistance region 314*a* and the low-resistance region 314*b* contain an element that imparts n-type conductivity, such as arsenic or phosphorus, or an element that imparts p-type conductivity, such as boron or aluminum, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron or aluminum, or a conductive material such as a metal material, an alloy material, or a metal oxide material can be used.

Note that since the work function of a conductor depends on the material for the conductor, the threshold voltage of the transistor can be adjusted by selecting the material for the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors formed on the substrate 310 from each other. The element isolation layer 312 can be formed by, for example, a LOCOS (Local Oxidation of Silicon) method, an STI (Shallow Trench Isolation) method, or a mesa isolation method.

Note that the transistor 300 illustrated in FIG. 19 and FIG. 20 is an example and the structure is not limited thereto; an appropriate transistor is used in accordance with a circuit structure and a driving method. For example, the transistor 300 illustrated in FIG. 19 and FIG. 20 may be a planar transistor.

In the transistor 300 illustrated in FIG. 19, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of impurities such as water or hydrogen from the substrate 310, the transistor 300, or the like into a region where the transistor 500 is provided.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

Moreover, a conductor 328 and a conductor 330 are embedded in the insulator 320, the insulator 322, the insulator 324, and the insulator 326. Note that the conductor 328 and the conductor 330 each function as a via hole, a plug, or a wiring. A plurality of conductors functioning as via holes, plugs, or wirings are collectively denoted by the same reference numeral in some cases. Moreover, in this specification and the like, a wiring and a via hole or a plug connected to the wiring may be a single component. That is, part of a conductor functions as a wiring in some cases and part of a conductor functions as a via hole or a plug in other cases.

As described in Embodiment 1, the conductor 328 and the conductor 330 can be formed using any of the materials usable for the conductor 448, the conductor 450, the conductor 457, the conductor 458, the conductor 518, and the conductor 540, which are the materials usable for a via hole, a plug, and a wiring.

A wiring layer may be provided over the insulator 326 and the conductor 330. For example, in FIG. 19, an insulator 350, an insulator 352, and an insulator 354 are sequentially stacked over the insulator 326 and the conductor 330.

Furthermore, the conductor 356 is formed in the insulator 350, the insulator 352, and the insulator 354. The conductor 356 has a function of a via hole, a plug, or a wiring connected to the transistor 300, for example. Note that the conductor 356 can be provided using a material similar to those for the conductor 328 and the conductor 330. An insulator 360 is formed over the insulator 354 and the conductor 356.

For example, like the insulator 324, the insulator 350 or the insulator 360 is preferably formed using an insulator having a barrier property against impurities such as water or hydrogen. Like the insulator 326, the insulator 352 and the insulator 354 are preferably formed using an insulator having a relatively low dielectric constant to reduce parasitic capacitance generated between wirings.

Furthermore, the conductor 356 preferably contains a conductor having a barrier property against water or hydrogen. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited. Thus, as described above, the conductor 356 is preferably formed using tantalum nitride as a conductor having a barrier property against hydrogen. In that case, a tantalum nitride layer having a barrier property against hydrogen is preferably in contact with the insulator 350 having a barrier property against hydrogen. The use of a stack including tantalum nitride and tungsten that has high conductivity can inhibit diffusion of hydrogen from the transistor 300 while the conductivity of a wiring is kept.

Figure 18B:
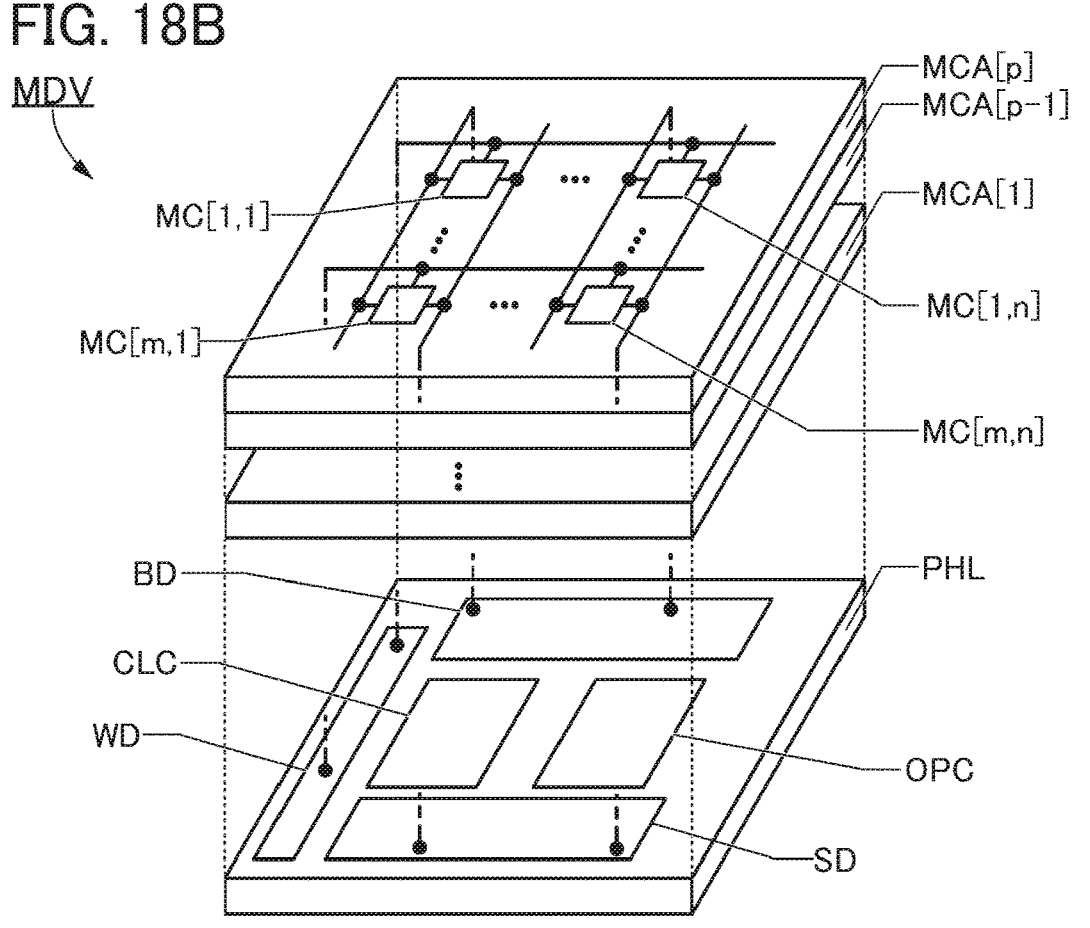

Although FIG. 18A illustrates the structure where one memory cell array MCA is provided above the peripheral circuit PHL, the storage device of one embodiment of the present invention is not limited to the structure. For example, the storage device of one embodiment of the present invention may include a plurality of memory cell arrays MCA which are stacked above the peripheral circuit PHL. FIG. 18B illustrates a structure of a storage device where a memory cell array MCA[1] to a memory cell array MCA[p] (p is an integer greater than or equal to 2) are stacked above the peripheral circuit PHL.

Figure 21:
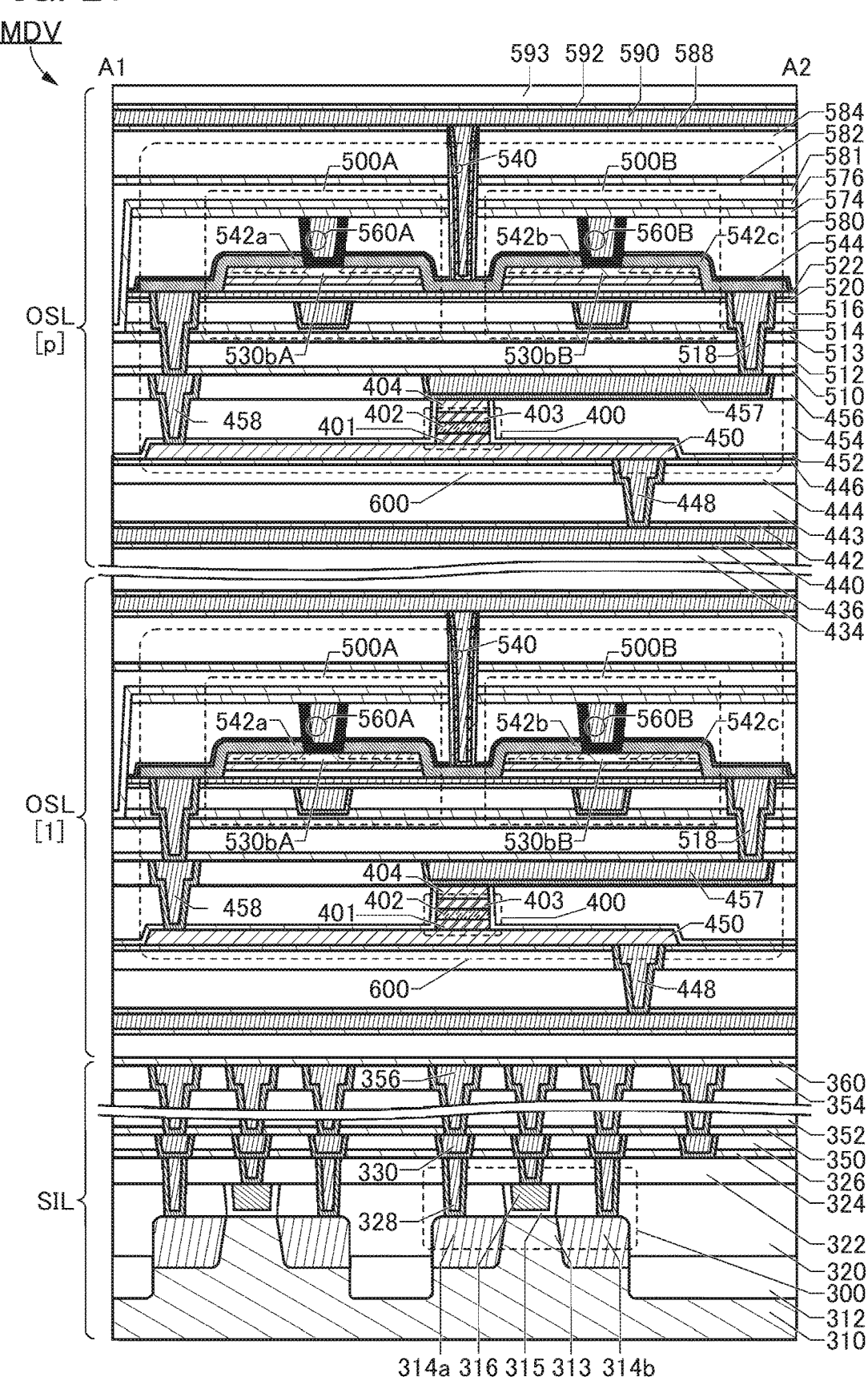
FIG. 21 is a schematic cross-sectional diagram illustrating a structure example of a storage device.

FIG. 21 is a cross-sectional diagram schematically illustrating the storage device MDV in FIG. 18B. The storage device MDV illustrated in FIG. 21 has a structure where a plurality of layers OSL are provided above the layer SIL in the storage device MDV in FIG. 19.

The storage device MDV illustrated in FIG. 21 includes the layer SIL, and a layer OSL[1] to a layer OSL[p] (here, p is an integer greater than or equal to 1) provided above the layer SIL. The memory cell array MCA[1] to the memory cell array MCA[p] illustrated in FIG. 18B are respectively included in the layer OSL[1] to the layer OSL[p] illustrated in FIG. 21. With such a structure, the storage device MDV can be fabricated.

Structure Example of Peripheral Circuit

Figure 22:
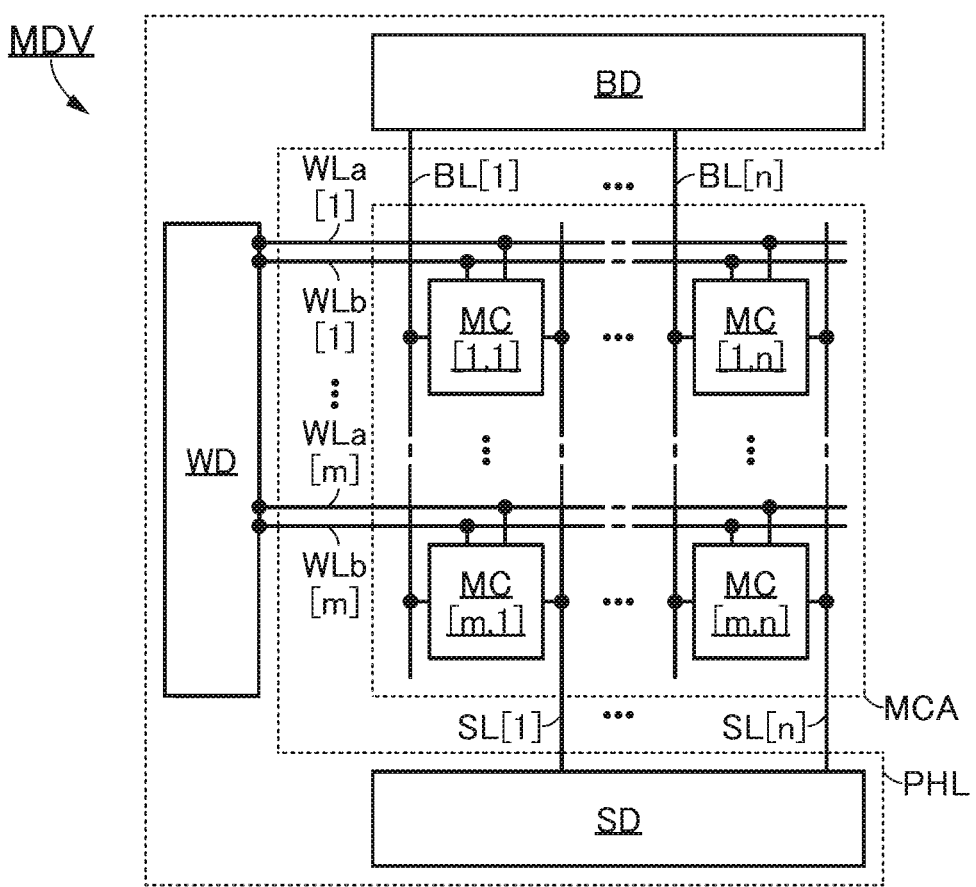
FIG. 22 is a block diagram illustrating a structure example of a storage device.

Next, FIG. 22 illustrates a structure example where the memory cell 600 in FIG. 19 is used for the storage device MDV in FIG. 18A. Although components are shown on a plane in FIG. 22 for viewability, it is assumed that, as in FIG. 22, the memory cell array MCA is provided above the peripheral circuit PHL in the storage device MDV as illustrated in FIG. 18A. Any one of the memory cell MC[1,1] to the memory cell MC[m,n] illustrated in FIG. 22 corresponds to the memory cell 600 in FIG. 19.

Note that description common between the storage device MDV in FIG. 22 and the storage device MDV in FIG. 18A is omitted.

In the storage device MDV in FIG. 22, the peripheral circuit PHL includes the circuit WD, the circuit BD, and the circuit SD. For the circuit WD, the circuit BD, and the circuit SD, description of the storage device MDV in FIG. 18A can be referred to.

In the storage device MDV in FIG. 22, the wiring SL[1] to the wiring SL[n] are provided not in the row direction but in the column direction, which is different from the storage device MDV in FIG. 18A. That is, the direction where the wiring is extended is not particularly limited in the storage device MDV.

The circuit WD is electrically connected to a wiring WLa[1] to a wiring WLa[m] and a wiring WLb[1] to a wiring WLb[m] comparable to the wiring WL[1] to the wiring WL[m] in the storage device MDV in FIG. 18A. In other words, the wiring WLa and the wiring WLb are provided in each row of the memory cell array MCA.

In this case, the circuit WD is preferably configured to input different voltages to the wiring WLa and the wiring WLb in both the case of writing data to the memory cells MC and the case of reading data from the memory cells MC.

The structure example where the memory cell 600 in FIG. 19 is employed for the storage device MDV in FIG. 18A is not limited to the structure of the storage device MDV in FIG. 22. The storage device MDV in FIG. 22 can change its circuit structure depending on circumstances.

Since the memory cell using the MTJ element ME functions as a nonvolatile memory, electric power for retaining data can be reduced. Therefore, with use of the above-described structure for a storage device, the storage device can achieve low power consumption. Furthermore, OS transistors and the like are used as transistors in the memory cells, which enables a memory cell array to be fabricated through a semiconductor process and to be stacked above peripheral circuits. With a stack of a plurality of memory cell arrays, a storage device with high storage capacity can be provided.

Note that this embodiment can be combined with any of the other embodiments in this specification as appropriate.

Embodiment 3

Described in this embodiment is a metal oxide (hereinafter, also referred to as an oxide semiconductor) that can be used in the OS transistor described in the above embodiment.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including completely amorphous), CAAC (c-axis-aligned crystalline), nc (nanocrystalline), CAC (cloud-aligned composite), single crystal, and polycrystalline (poly crystal) can be given as examples of a crystal structure of an oxide semiconductor.

Note that a crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method. Hereinafter, an XRD spectrum obtained from GIXD measurement is simply referred to as an XRD spectrum in some cases.

For example, the XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The asymmetrical peak of the XRD spectrum clearly shows the existence of a crystal in the film or the substrate. In other words, the film or the substrate cannot be regarded as being in an amorphous state unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of a quartz glass substrate, which indicates that the quartz glass substrate is in an amorphous state. Furthermore, not a halo pattern but a spot-like pattern is observed in the diffraction pattern of an In—Ga—Zn oxide film formed at room temperature. This suggests that the In—Ga—Zn oxide film formed at room temperature is in an intermediate state, which is neither a single crystal nor polycrystal nor an amorphous state, and it cannot be concluded that the In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one minute crystal, the maximum diameter of the crystal region is less than 10 nm. In the case where the crystal region is formed of a large number of fine crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga,Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure where a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and/or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state where one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. For example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region is a region containing indium oxide, indium zinc oxide, or the like as its main component. The second region is a region containing gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure where metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas is preferably higher than or equal to 0% and lower than 30%, further preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure where the region containing In as its main component (the first region) and the region containing Ga as its main component (the second region) are unevenly distributed and mixed.

Here, the first region is a region having higher conductivity than the second region. In other words, when carriers flow through the first region, the conductivity of a metal oxide is exhibited. Accordingly, when the first regions are distributed in a metal oxide like a cloud, high field-effect mobility (u) can be achieved.

The second region is a region having a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is most suitable for a variety of semiconductor devices such as a display apparatus.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor with high reliability can be achieved.

It is particularly preferable to use an oxide containing indium (In), gallium (Ga), and zinc (Zn) (also referred to as "IGZO") for a semiconductor layer where a channel is formed. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor having a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that an impurity in an oxide semiconductor refers to, for example, elements other than the main components of the oxide semiconductor. For example, an element with a concentration lower than 0.1 atomic % can be regarded as an impurity.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the semiconductor layer is set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. As a result, a transistor using an oxide semiconductor that contains nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor that contains hydrogen is likely to have normally-on characteristics. For this reason, hydrogen in the oxide semiconductor is preferably reduced as much as possible. Specifically, the concentration of hydrogen in the oxide semiconductor, which is measured by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

The structures described in this embodiment can be used in an appropriate combination with the structures described in the other embodiments.

Embodiment 4

In this embodiment, examples of a semiconductor wafer where the storage device or the like described in the above embodiment is formed and electronic components incorporating the storage device will be described.

<Semiconductor Wafer>

First, an example of a semiconductor wafer where a storage device or the like is formed is described with reference to FIG. 23A.

Figures 23A, 23B, 23C, 23D:
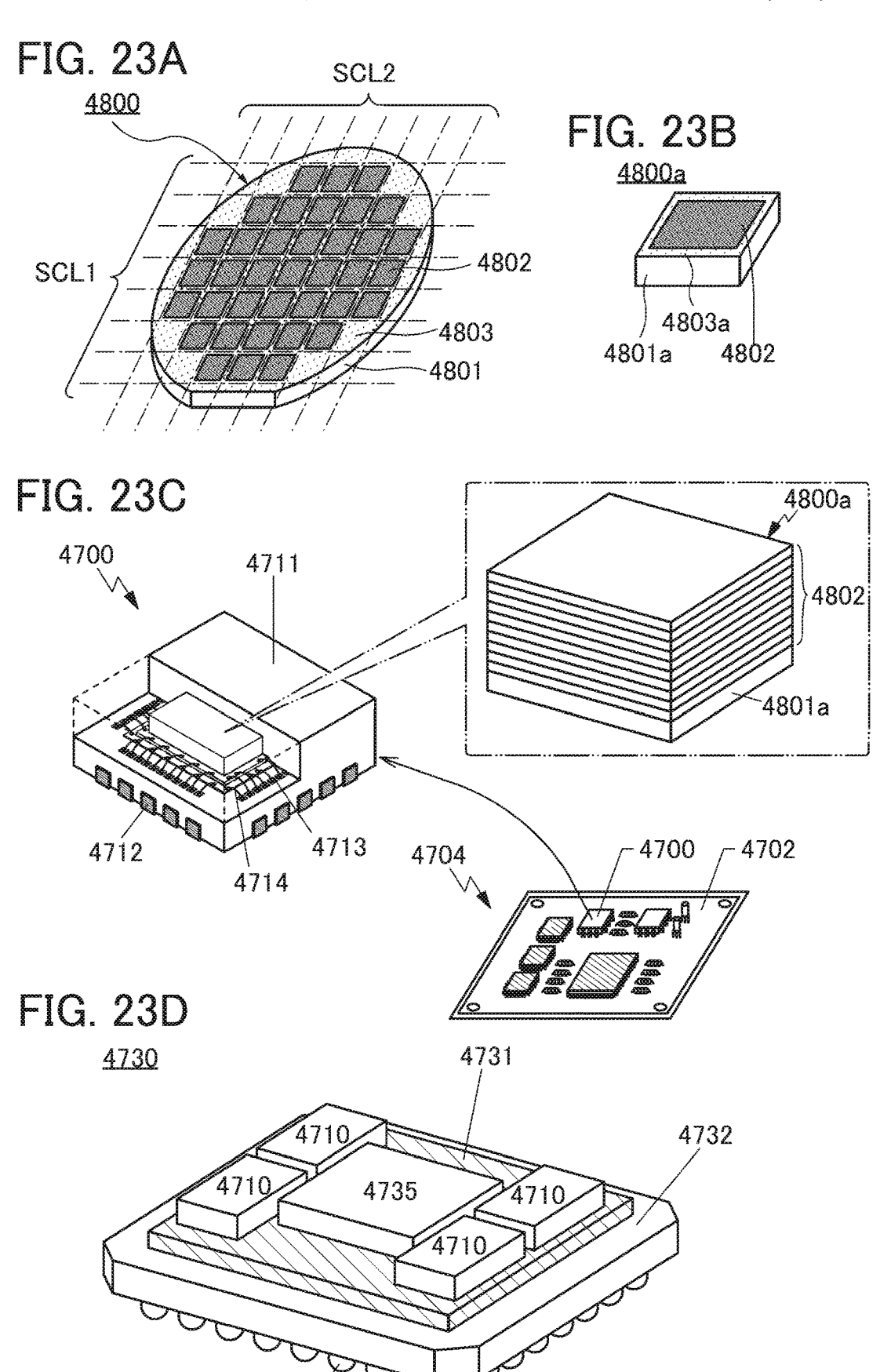
FIG. 23A is a perspective diagram illustrating an example of a semiconductor wafer.
FIG. 23B is a perspective diagram illustrating an example of a chip.
FIG. 23C and FIG. 23D are perspective diagrams illustrating examples of electronic components.

A semiconductor wafer 4800 illustrated in FIG. 23A includes a wafer 4801 and a plurality of circuit portions 4802 provided on the top surface of the wafer 4801. Note that a portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800*a* as illustrated in FIG. 23B can be cut out from the semiconductor wafer 4800. The chip 4800*a* includes a wafer 4801*a*, the circuit portion 4802, and a spacing 4803*a*. Note that it is preferable to make the spacing 4803*a* small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 23A. The element substrate may be a rectangular semiconductor wafer, for example. The shape of the element substrate can be changed as appropriate, depending on a fabrication process of an element and an apparatus for fabricating the element.

<Electronic Component>

FIG. 23C is a perspective diagram of an electronic component 4700 and a substrate (a mounting board 4704) on which the electronic component 4700 is mounted. The electronic component 4700 illustrated in FIG. 23C includes the chip 4800*a* in a mold 4711. Note that the chip 4800*a* illustrated in FIG. 23C is shown to have a structure where the circuit portions 4802 are stacked. That is, the storage device described in the above embodiment can be used for the circuit portion 4802. To illustrate the inside of the electronic component 4700, some portions are omitted in FIG. 23C. The electronic component 4700 includes a land 4712 outside the mold 4711. The land 4712 is electrically connected to an electrode pad 4713, and the electrode pad 4713 is electrically connected to the chip 4800*a* through a wire 4714. The electronic component 4700 is mounted on a printed circuit board 4702, for example. A plurality of such electronic components are combined and electrically connected to each other on the printed circuit board 4702, so that the mounting board 4704 is completed.

FIG. 23D is a perspective diagram of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the storage device described in the above embodiment and a high bandwidth memory (HBM). In addition, an integrated circuit (a semiconductor device) such as a CPU, a GPU, an FPGA, or a storage device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". Furthermore, a through electrode is provided in the interposer 4731 and the through electrode is used to electrically connect an integrated circuit and the package substrate 4732 in some cases. Moreover, for a silicon interposer, a TSV (Through Silicon Via) can also be used as the through electrode.

A silicon interposer is preferably used as the interposer 4731. A silicon interposer can be fabricated at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in the coefficient of expansion between an integrated circuit and the interposer is less likely to occur. Furthermore, a silicon interposer has high surface flatness, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 23D illustrates an example where the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be used.

Note that this embodiment can be combined with any of the other embodiments in this specification as appropriate.

Embodiment 5

In this embodiment, a CPU that can include the storage device of the above embodiment will be described.

Figure 24:
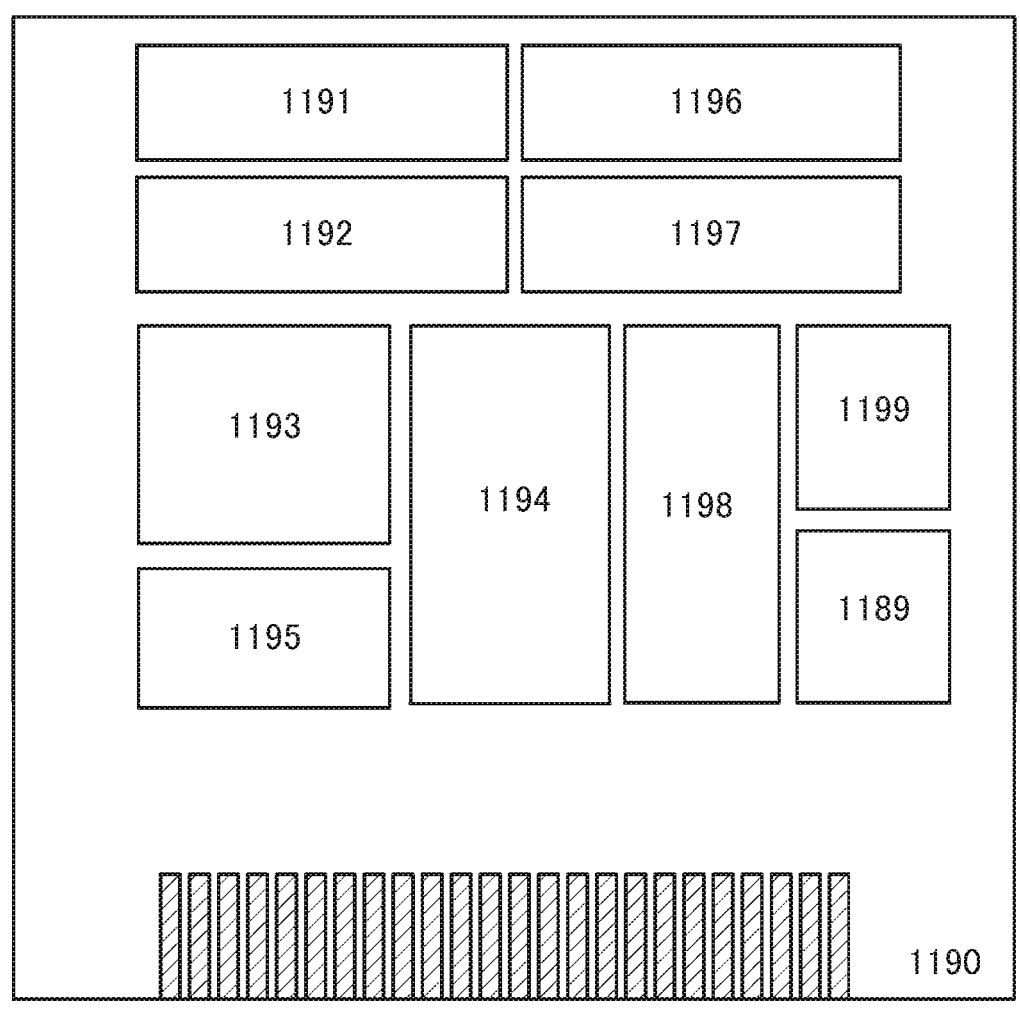
FIG. 24 is a block diagram illustrating a CPU.

FIG. 24 is a block diagram illustrating a structure example of a CPU in part of which the storage device described in the above embodiment is used.

The CPU illustrated in FIG. 24 includes an ALU (Arithmetic logic unit) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, or a glass substrate is used as the substrate 1190. The ROM 1199 and the ROM interface 1189 may be provided over separate chips. Needless to say, the CPU illustrated in FIG. 24 is just an example of a simplified structure, and an actual CPU may have a variety of structures depending on the usage. For example, the CPU may have a structure where a plurality of cores each including the CPU illustrated in FIG. 24 or an arithmetic circuit are included and the cores operate in parallel, i.e., a GPU-like structure. The number of bits that the CPU can process in an internal arithmetic circuit, a data bus, or the like can be 8, 16, 32, or 64 or more, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device, a peripheral circuit, or the like on the basis of its priority or a mask state, and processes the request. The register controller 1197 generates an address of the register 1196, and reads or writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above various circuits.

In the CPU illustrated in FIG. 24, a memory cell is provided in the register 1196. The register 1196 may include the storage device described in the above embodiment, for example.

In the CPU illustrated in FIG. 24, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 6

In this embodiment, examples of electronic devices each including the storage device described in the above embodiment will be described. FIG. 25A to FIG. 25J and FIG. 27A to FIG. 27E illustrate electronic devices each of which includes the electronic component 4700 including the storage device.

[Mobile Phone]

Figures 25A, 25B, 25C, 25D, 25E, 25F, 25G, 25H, 25I, 25J:
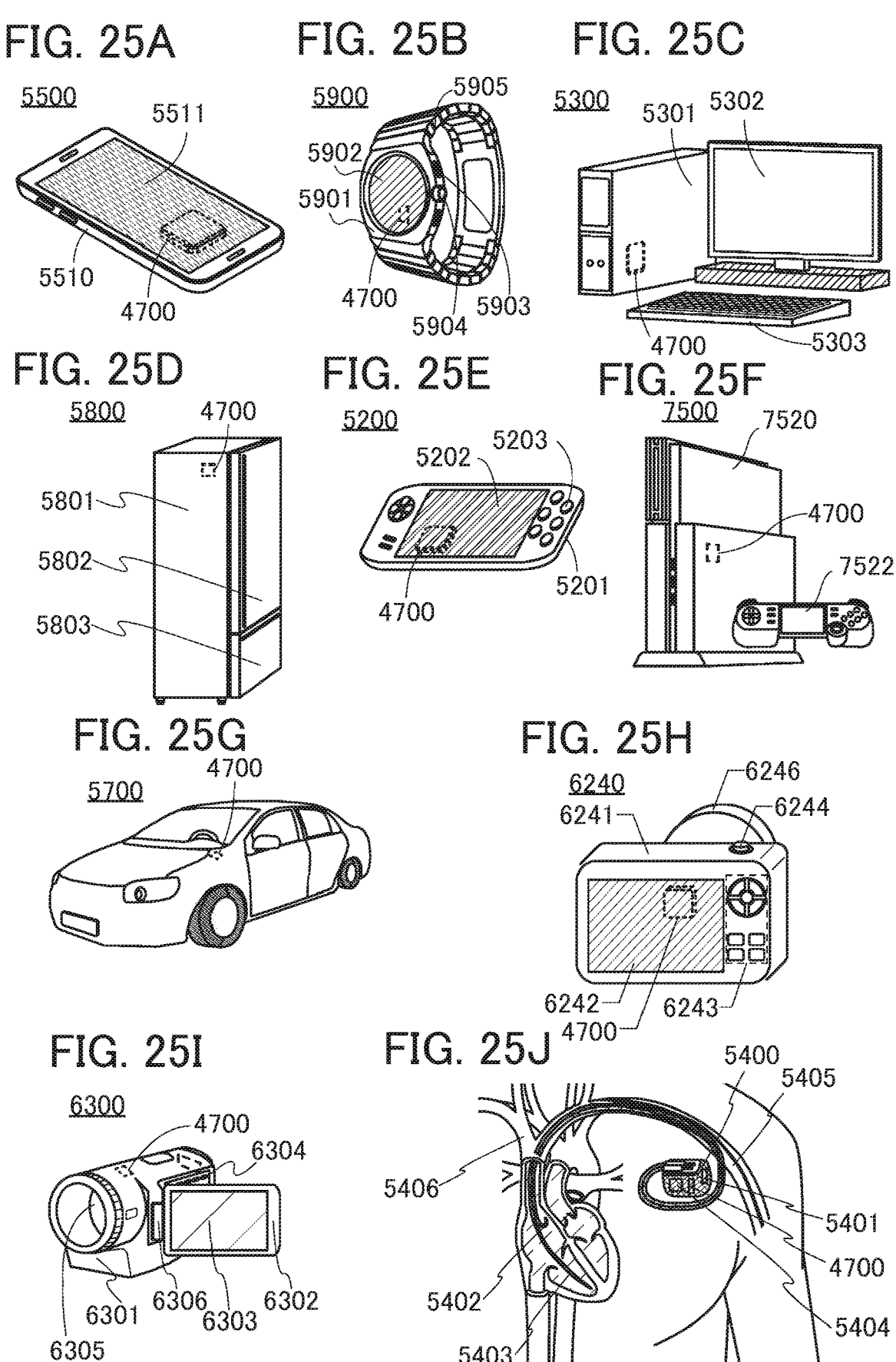
FIG. 25A to FIG. 25J are each a perspective diagram or a schematic diagram illustrating an example of an electronic device.

An information terminal 5500 illustrated in FIG. 25A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the storage device described in the above embodiment, the information terminal 5500 can retain a temporary file generated at the time of executing an application (e.g., a web browser's cache).

[Wearable Terminal]

FIG. 25B illustrates an information terminal 5900 that is an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the storage device described in the above embodiment.

[Information Terminal]

FIG. 25C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the storage device described in the above embodiment.

Note that although the smartphone, the wearable terminal, and the desktop information terminal are respectively illustrated in FIG. 25A to FIG. 25C as examples of the electronic device, one embodiment of the present invention can be applied to an information terminal other than a smartphone, a wearable information terminal, and a desktop information terminal. Examples of information terminals other than a smartphone, a wearable terminal, and a desktop information terminal include a PDA (Personal Digital Assistant), a laptop information terminal, and a workstation.

[Household Appliance]

FIG. 25D illustrates an electric refrigerator-freezer 5800 as an example of a household appliance. The electric refrigerator-freezer 5800 includes a housing 5801, a refrigerator door 5802, a freezer door 5803, and the like.

When the storage device described in the above embodiment is used in the electric refrigerator-freezer 5800, the electric refrigerator-freezer 5800 can be used for IoT (Internet of Things), for example. When used for IoT, the electric refrigerator-freezer 5800 can send and receive information on food stored in the electric refrigerator-freezer 5800 and food expiration dates, for example, to/from the above-described information terminal and the like via the Internet. When sending the information, the electric refrigerator-freezer 5800 can retain the information as a temporary file in the storage device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

FIG. 25E illustrates a portable game machine 5200 that is an example of a game machine. The portable game machine 5200 includes a housing 5201, a display portion 5202, and a button 5203.

FIG. 25F illustrates a stationary game machine 7500 that is another example of a game machine. The stationary game machine 7500 includes a main body 7520 and a controller 7522. Note that the controller 7522 can be connected to the main body 7520 with or without a wire. Furthermore, although not illustrated in FIG. 25F, the controller 7522 can include one or more selected from a display portion that displays a game image, and an input interface besides a button, such as a touch panel, a stick, a rotating knob, and a sliding knob, for example. The shape of the controller 7522 is not limited to that illustrated in FIG. 25F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using one or both of a gesture and a voice instead of a controller.

In addition, videos displayed on the game machine can be output with a display apparatus such as a television device, a personal computer display, a game display, or a head-mounted display.

When the storage device described in the above embodiment is used in the portable game machine 5200 and the stationary game machine 7500, the portable game machine with low power consumption can be achieved. Moreover, heat generation from a circuit can be reduced owing to low power consumption; thus, the influence of heat generation on the circuit itself, a peripheral circuit, and a module can be reduced.

Moreover, with the use of the storage device described in the above embodiment, the portable game machine 5200 and the stationary game machine 7500 can retain a temporary file necessary for arithmetic operation that occurs during game play.

Although FIG. 25E and FIG. 25F illustrate a portable game machine and a stationary game machine, respectively, as examples of game machines, the electronic device of one embodiment of the present invention is not limited thereto. Examples of the electronic device of one embodiment of the present invention include an arcade game machine installed in entertainment facilities (a game center, an amusement park, and the like), and a throwing machine for batting practice installed in sports facilities.

[Moving Vehicle]

The storage device described in the above embodiment can be used for an automobile, which is a moving vehicle, and around the driver's seat in an automobile.

FIG. 25G illustrates an automobile 5700 that is an example of a moving vehicle.

An instrument panel that provides various kinds of information by displaying a speedometer, a tachometer, a mileage, a fuel meter, a gearshift state, and air-conditioning settings, for example, is provided around the driver's seat in the automobile 5700. In addition, a display apparatus showing the above information may be provided around the driver's seat.

In particular, the display apparatus can compensate for the view obstructed by the pillar or the like, the blind areas for the driver's seat, and the like by displaying a video taken by an imaging device (not illustrated) provided for the automobile 5700, thereby providing a high level of safety.

The storage device described in the above embodiment can temporarily retain data; thus, the storage device can be used to retain temporary data necessary in an automatic driving system for the automobile 5700 and a system for navigation and risk prediction, for example. The display apparatus may be configured to display temporary information regarding navigation, risk prediction, or the like. More-over, the storage device may be configured to retain a video of a driving recorder provided in the automobile 5700.

Although an automobile is described above as an example of a moving vehicle, the moving vehicle is not limited to an automobile. Examples of moving vehicles include a train, a monorail train, a ship, and a flying object (e.g., a helicopter, an unmanned aircraft (a drone), an airplane, and a rocket).

[Camera]

The storage device described in the above embodiment can be used for a camera.

FIG. 25H illustrates a digital camera 6240 that is an example of an imaging device. The digital camera 6240 includes a housing 6241, a display portion 6242, operation buttons 6243, a shutter button 6244, and the like, and a detachable lens 6246 is attached to the digital camera 6240. Although the digital camera 6240 is configured here such that the lens 6246 is detachable from the housing 6241 for replacement, the lens 6246 may be integrated with the housing 6241. In addition, the digital camera 6240 can be additionally equipped with a stroboscope, a viewfinder, or the like.

When the storage device described in the above embodiment is used for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The storage device described in the above embodiment can be used for a video camera.

FIG. 25I illustrates a video camera 6300 that is an example of an imaging device. The video camera 6300 includes a first housing 6301, a second housing 6302, a display portion 6303, operation keys 6304, a lens 6305, and a joint 6306. The operation keys 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. By using the above storage device, the video camera 6300 can retain a temporary file generated in encoding.

[ICD]

The storage device described in the above embodiment can be used for an implantable cardioverter-defibrillator (ICD).

FIG. 25J is a schematic cross-sectional diagram illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored in the electronic component 4700.

The antenna 5404 can receive power, and the battery 5401 is charged with the power. Furthermore, when the ICD main unit 5400 includes a plurality of batteries, safety can be increased. Specifically, even when some of the batteries in the ICD main unit 5400 are dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Head-Mounted Display]

The storage device described in the above embodiment can be used for an electronic device for XR (Extended Reality or Cross Reality), such as AR (augmented reality) or VR (virtual reality).

FIG. 26A to FIG. 26C are diagrams illustrating the appearance of an electronic device 8300 that is a head-mounted display. The electronic device 8300 illustrated in FIG. 26A to FIG. 26C includes a housing 8301, a display portion 8302, a band-like fixing member 8304, a fixing member 8304a worn on a head, and a pair of lenses 8305. Note that the electronic device 8300 may include an operation button.

A user can see an image displayed on the display portion 8302 through the lenses 8305. Note that the display portion 8302 is preferably curved and placed because the user can feel a high realistic sensation. Another image displayed in another region of the display portion 8302 is seen through the lenses 8305, so that three-dimensional display using parallax or the like can be performed. Note that the structure is not limited to the structure where one display portion 8302 is provided; two display portions 8302 may be provided and one display portion may be provided per eye of the user.

For the display portion 8302, a display apparatus with an extremely high resolution is preferably used, for example. When a high-resolution display apparatus is used for the display portion 8302, it is possible to display a more realistic video that does not allow the user to perceive pixels even when the displayed image is magnified using the lenses 8305 in the electronic device 8300 in FIG. 26C.

The head-mounted display, which is an electronic device of one embodiment of the present invention, may be an electronic device 8200 illustrated in FIG. 26D, which is a glasses-type head-mounted display.

The electronic device 8200 includes a wearing portion 8201, a lens 8202, a main body 8203, a display portion 8204, and a cable 8205. A battery 8206 is incorporated in the wearing portion 8201.

The cable 8205 supplies electric power from the battery 8206 to the main body 8203. The main body 8203 includes a wireless receiver or the like to receive video data and display it on the display portion 8204. The main body 8203 includes a camera, and data on the movement of eyeballs or eyelids of the user can be used as an input means.

The wearing portion 8201 may be provided with a plurality of electrodes capable of detecting current flowing in response to the movement of the user's eyeball in a position in contact with the user to have a function of recognizing the user's sight line. Furthermore, the wearing portion 8201 may have a function of monitoring the user's pulse with use of current flowing through the electrodes. The wearing portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

[Expansion Device for PC]

The storage device described in the above embodiment can be used for a calculator such as a PC (Personal Computer) and an expansion device for an information terminal.

FIG. 27A illustrates, as an example of the expansion device, a portable expansion device 6100 that includes a chip capable of retaining information and is externally provided on a PC. The expansion device 6100 can store information using the chip when connected to a PC with a USB (Universal Serial Bus) or the like, for example. Note that FIG. 27A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the storage device or the like described in the above embodiment. For example, the substrate 6104 is provided with the electronic component 4700 and a controller chip 6106. The USB connector 6103 functions as an interface for connection to an external device.

[SD Card]

The storage device described in the above embodiment can be used for an SD card that can be attached to an electronic device such as an information terminal or a digital camera.

FIG. 27B is a schematic external diagram of an SD card, and FIG. 27C is a schematic diagram of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a storage device and a circuit for driving the storage device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The storage device described in the above embodiment can be used for an SSD (Solid State Drive) that can be attached to an electronic device such as an information terminal.

FIG. 27D is a schematic external diagram of an SSD, and FIG. 27E is a schematic diagram of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a storage device and a circuit for driving the storage device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5156 are not limited to those described above, and the circuit structures can be changed as appropriate according to circumstances. For example, a memory functioning as a work memory may also be provided in the controller chip 5156.

The storage device described in the above embodiment is used as each of the storage devices included in the above electronic devices, whereby novel electronic devices can be provided.

Note that this embodiment can be combined with any of the other embodiments in this specification as appropriate.

REFERENCE NUMERALS

MDV: storage device, MCA: memory cell array, MCA[1]: memory cell array, MCA[p]: memory cell array, PHL: peripheral circuit, MC: memory cell, MC[1,1]: memory cell, MC[m,1]: memory cell, MC[1,n]: memory cell, MC[m,n]: memory cell, BD: circuit, WD: circuit, SD: circuit, CLC: circuit, OPC: circuit, M3: transistor, M4: transistor, MD: variable resistance device, ME: MTJ element, IT1: terminal, IT2: terminal, OT: terminal, BL: wiring, BL[1]: wiring, BL[n]: wiring, SL: wiring, SL[1]: wiring, SL[n]: wiring, WLa: wiring, WLa[1]: wiring, WLa[m]: wiring, WLb: wiring, WLb[1]: wiring, WLb[m]: wiring, WL[1]: wiring, WL[m]: wiring, WBL: wiring, RBL: wiring, BGE: wiring, RAL: wiring, RL: layer, TIS: layer, FL: layer, CA: layer, SIL: layer, OSL: layer, OSL[1]: layer, OSL[p]: layer, OSLa: layer, OSLb: layer, ARA: region, LY1: layer, LY2: layer, LY3: layer, LY4: layer, LY5: layer, LY6: layer, LY1-2: layer, LY3-4: layer, LY5-6: layer, VA: conductor, 300: transistor, 310: substrate, 312: element isolation layer, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 400: memory element, 401: conductor, 402: insulator, 403: conductor, 404: conductor, 434: insulator, 436: insulator, 440: conductor, 442: insulator, 443: insulator, 444: insulator, 446: insulator, 448: conductor, 450: conductor, 452: insulator, 454: insulator, 456: insulator, 457: conductor, 457*a*: conductor, 457*b*: conductor, 457*c*: conductor, 457*d*: conductor, 457*e*: conductor, 458: conductor, 458A: conductor, 476: insulator, 478: insulator, 496: insulator, 498: insulator, 500A: transistor, 500B: transistor, 503: conductor, 503*a*: conductor, 503*b*: conductor, 510: insulator, 512: insulator, 513: insulator, 514: insulator, 516: insulator, 518: conductor, 518A: conductor, 518B: conductor, 520: insulator, 522: insulator, 524: insulator, 530: oxide, 530*a*: oxide, 530*b*: oxide, 530*b*A: oxide, 530*b*B: oxide, 530*c*: oxide, 540: conductor, 540A: conductor, 540B: conductor, 540C: conductor, 540D: conductor, 542: conductor, 542*a*: conductor, 542*a*A:

conductor, 542$a$B: conductor, 542$b$: conductor, 542$b$A: conductor, 542$b$B: conductor, 542$c$: conductor, 543$a$: region, 543$b$: region, 544: insulator, 550: insulator, 552: insulator, 560: conductor, 560$a$: conductor, 560$b$: conductor, 560A: conductor, 560B: conductor, 574: insulator, 576: insulator, 580: insulator, 581: insulator, 582: insulator, 583: insulator, 584: insulator, 585A: conductor, 585B: conductor, 586: insulator, 588: insulator, 590: conductor, 591: insulator, 592: insulator, 593: insulator, 600A: memory cell, 600B: memory cell, 600C: memory cell, 600D: memory cell, 711: insulator, 712: insulator, 721: conductor, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 2621: row decoder, 2622: word line driver circuit, 2630: bit line driver circuit, 2631: column decoder, 2632: precharge circuit, 2633: sense amplifier, 2634: write circuit, 2640: output circuit, 2660: control logic circuit, 4700: electronic component, 4702: printed circuit board, 4704: circuit board, 4710: semiconductor device, 4714: wire, 4730: electronic component, 4731: interposer, 4732: package substrate, 4733: electrode, 4735: semiconductor device, 4800: semiconductor wafer, 4800$a$: chip, 4801: wafer, 4801$a$: wafer, 4802: circuit portion, 4803: spacing, 4803$a$: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main body, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: extension device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: connection portion, 7520: main body, 7522: controller, 8201: wearing portion, 8202: lens, 8203: main body, 8204: display portion, 8205: cable, 8206: battery, 8301: housing, 8302: display portion, 8305: lens

The invention claimed is:

1. A semiconductor device comprising a first conductor, a second conductor, a third conductor, a first transistor, a second transistor, and a memory element, wherein the second conductor is positioned above the first conductor, wherein the memory element is positioned above the second conductor, wherein the first transistor and the second transistor are positioned above the memory element, wherein the third conductor is positioned above the first transistor and the second transistor, wherein in a plan view, the third conductor is positioned in a region overlapping with the first conductor, wherein the first conductor is electrically connected to the second conductor, wherein the second conductor is electrically connected to a first terminal of the memory element and a first terminal of the first transistor, wherein a second terminal of the memory element is electrically connected to a first terminal of the second transistor, wherein a second terminal of the first transistor is electrically connected to a second terminal of the second transistor and the third conductor, and wherein the first transistor and the second transistor each comprise a metal oxide in a channel formation region.

2. The semiconductor device according to claim 1, wherein the memory element comprises any one of a variable resistance element, a ferroelectric capacitor, an FTJ (Ferroelectric Tunnel Junction) element, and a phase-change memory.

3. A semiconductor device comprising a first conductor, a second conductor, a third conductor, a first transistor, a second transistor, and a memory element, wherein the memory element comprises a first magnetic layer, a second magnetic layer, and an insulator, wherein the second conductor is positioned above the first conductor, wherein the first magnetic layer is positioned above the second conductor, wherein the insulator is positioned above the first magnetic layer, wherein the second magnetic layer is positioned above the insulator, wherein the first transistor and the second transistor are positioned above the second magnetic layer, wherein the third conductor is positioned above the first transistor and the second transistor, wherein in a plan view, the third conductor is positioned in a region overlapping with the first conductor, wherein the first conductor is electrically connected to the second conductor, wherein the second conductor is electrically connected to the first magnetic layer and a first terminal of the first transistor, wherein the second magnetic layer is electrically connected to a first terminal of the second transistor, wherein a second terminal of the first transistor is electrically connected to a second terminal of the second transistor and the third conductor, and wherein the first transistor and the second transistor each comprise a metal oxide in a channel formation region.

4. The semiconductor device according to claim 3, wherein the memory element serves as an MTJ (Magnetic Tunnel Junction) element, wherein the first magnetic layer serves as a free layer, wherein the second magnetic layer serves as a fixed layer, wherein the insulator serves as a tunnel insulator, and wherein the second conductor comprises a metal material causing a spin Hall effect by a current flow.

5. A storage device comprising the semiconductor device according to claim 1 and a layer comprising a peripheral circuit, wherein the layer is positioned below the semiconductor device, and wherein the peripheral circuit is configured to write data to the semiconductor device and read data from the semiconductor device.

6. An electronic device comprising the storage device according to claim 5 and a housing.

\* \* \* \* \*